(12) United States Patent
Sato

(10) Patent No.: US 10,082,738 B2
(45) Date of Patent: Sep. 25, 2018

(54) LIQUID IMMERSION MEMBER, EXPOSURE APPARATUS, EXPOSURE METHOD, AND METHOD OF MANUFACTURING DEVICE

(71) Applicant: NIKON CORPORATION, Tokyo (JP)

(72) Inventor: Shinji Sato, Fukaya (JP)

(73) Assignee: NIKON CORPORATION, Tokyo (JP)

( * ) Notice: Subject to any disclaimer, the term of this patent is extended or adjusted under 35 U.S.C. 154(b) by 40 days.

(21) Appl. No.: 14/953,232

(22) Filed: Nov. 27, 2015

(65) Prior Publication Data

US 2016/0077448 A1    Mar. 17, 2016

Related U.S. Application Data

(63) Continuation of application No. PCT/JP2013/077392, filed on Oct. 8, 2013.

(51) Int. Cl.
*G03B 27/52* (2006.01)
*G03F 7/20* (2006.01)

(52) U.S. Cl.
CPC .................. *G03F 7/70341* (2013.01)

(58) Field of Classification Search
CPC ............ G03F 7/70341; G03F 7/2041; G03F 7/70716; G03F 7/707; G03F 7/70858; G03F 7/70925; G03F 7/70325; G03F 7/70958; G03F 7/20; G03F 7/70416; G03F 7/70433; B29C 67/0055; B32B 2307/73; G03D 3/00; H01L 21/6715
See application file for complete search history.

(56) References Cited

U.S. PATENT DOCUMENTS

| | | | |
|---|---|---|---|
| 7,804,577 B2 | 9/2010 | Leenders et al. |
| 7,864,292 B2 | 1/2011 | Leenders et al. |
| 8,004,651 B2 | 8/2011 | Nagasaka |
| 8,068,209 B2 | 11/2011 | Poon et al. |
| 8,134,685 B2 | 3/2012 | Nishii et al. |
| 8,237,911 B2 | 8/2012 | Poon et al. |

(Continued)

FOREIGN PATENT DOCUMENTS

| | | |
|---|---|---|
| CN | 102156391 A | 8/2011 |
| JP | 2007-142428 A | 6/2007 |
| WO | 2007/057673 A1 | 5/2007 |

OTHER PUBLICATIONS

Dec. 17, 2013 Search Report issued in International Patent Application No. PCT/JP2013/077392.

(Continued)

*Primary Examiner* — Mesfin Asfaw
(74) *Attorney, Agent, or Firm* — Oliff PLC

(57) ABSTRACT

A liquid immersion member forms, in an exposure apparatus, liquid immersion space through which exposure light emitted from an optical member passes, the liquid immersion member includes: a first member that is disposed at at least part of a space around the optical member and that includes a first lower surface facing an object which is movable below the optical member; and a movable second member that includes a second lower surface which is disposed at outer side than the first lower surface viewed from optical axis of the optical member and which faces the object and a third lower surface which is disposed at inner side than the second lower surface viewed from the optical axis and whose at least part is disposed above at least part of the first lower surface.

46 Claims, 17 Drawing Sheets

(56) References Cited

U.S. PATENT DOCUMENTS

| | | |
|---|---|---|
| 8,289,497 B2 | 10/2012 | Poon et al. |
| 8,400,610 B2 | 3/2013 | Poon et al. |
| 8,421,996 B2 | 4/2013 | Leenders et al. |
| 8,610,873 B2 | 12/2013 | Poon et al. |
| 8,743,343 B2 | 6/2014 | Poon et al. |
| 8,891,059 B2 | 11/2014 | Nagasaka |
| 8,934,080 B2 | 1/2015 | Poon et al. |
| 9,013,675 B2 | 4/2015 | Nishii et al. |
| 2007/0103661 A1* | 5/2007 | Nishii .................. G02B 13/143 355/53 |
| 2007/0109512 A1 | 5/2007 | Kate et al. |
| 2008/0174748 A1* | 7/2008 | Nagasaka ........... G03F 7/70341 355/30 |
| 2010/0304310 A1* | 12/2010 | Sato .................... G03F 7/70916 430/325 |
| 2013/0265555 A1 | 10/2013 | Shibazaki |
| 2013/0265556 A1 | 10/2013 | Sato |
| 2014/0022522 A1 | 1/2014 | Sato |
| 2014/0253886 A1 | 9/2014 | Sato |
| 2014/0285781 A1 | 9/2014 | Sato |
| 2014/0300875 A1 | 10/2014 | Sato et al. |
| 2014/0307235 A1 | 10/2014 | Sato |

OTHER PUBLICATIONS

Jun. 1, 2017 Search Report issued in European Patent Application No. 13895305.4.

Mar. 16, 2017 Office Action issued in Chinese Patent Application No. 201380076727.1.

* cited by examiner

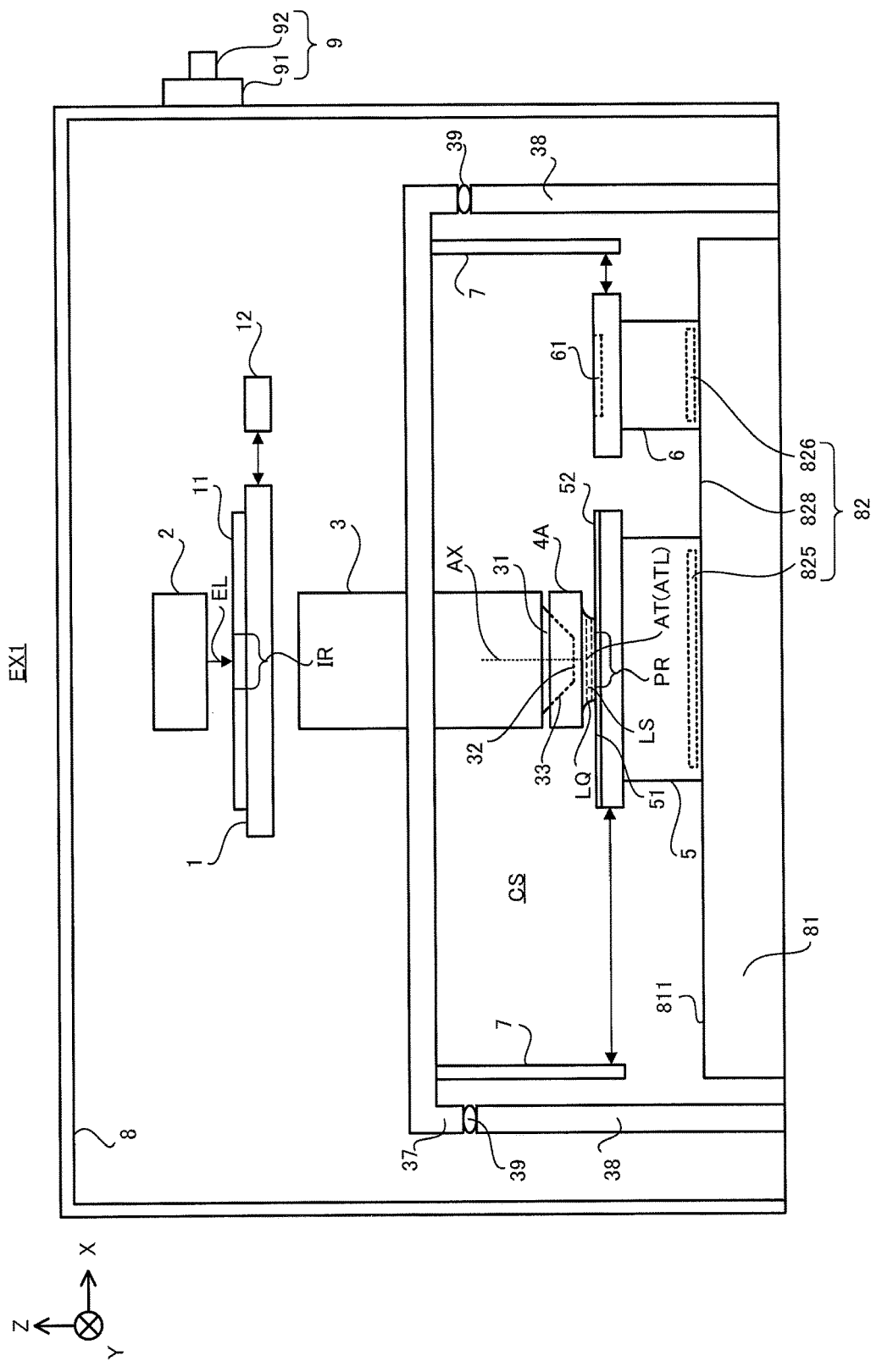
[FIG. 1]

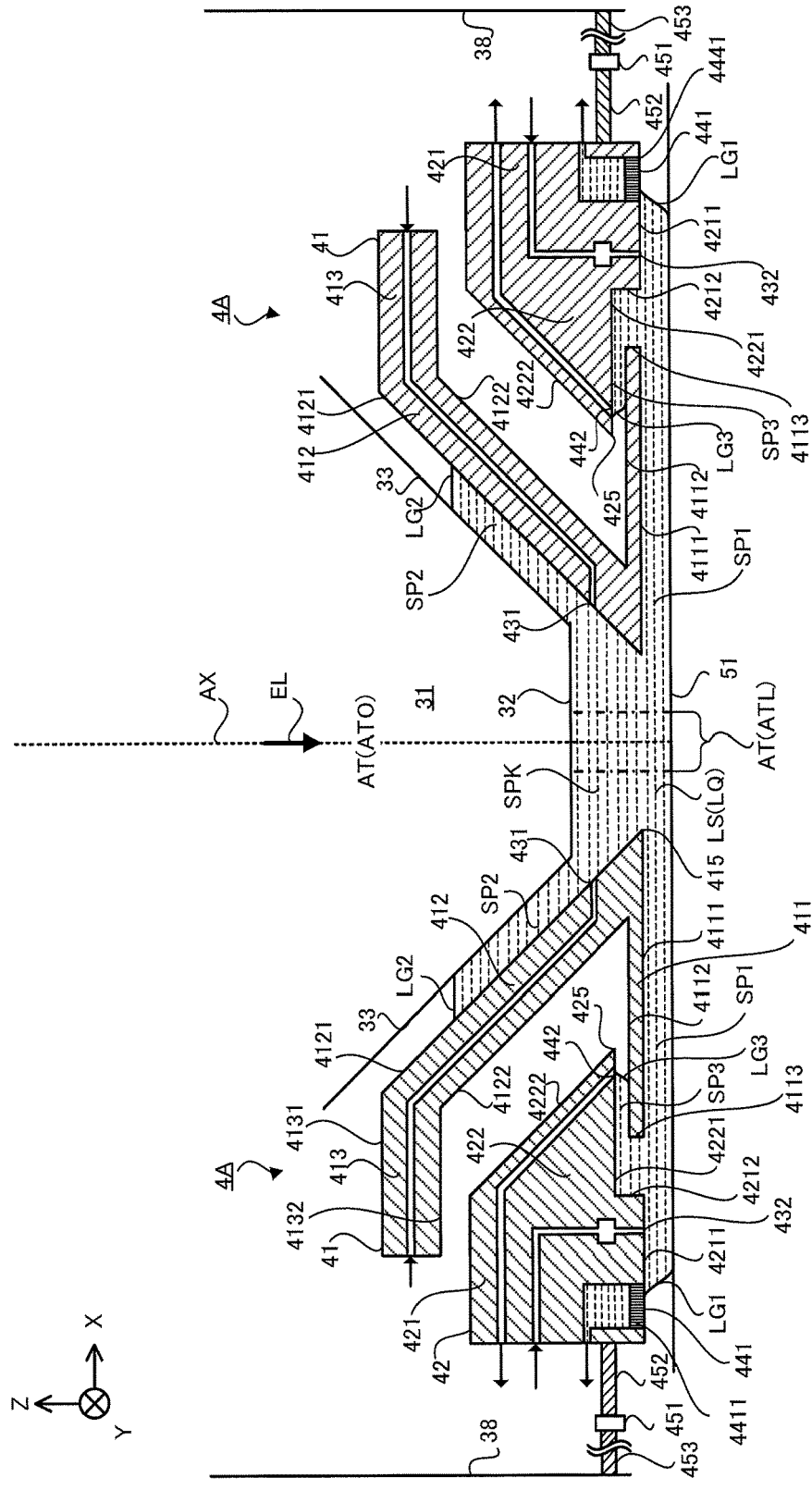

[FIG. 3]
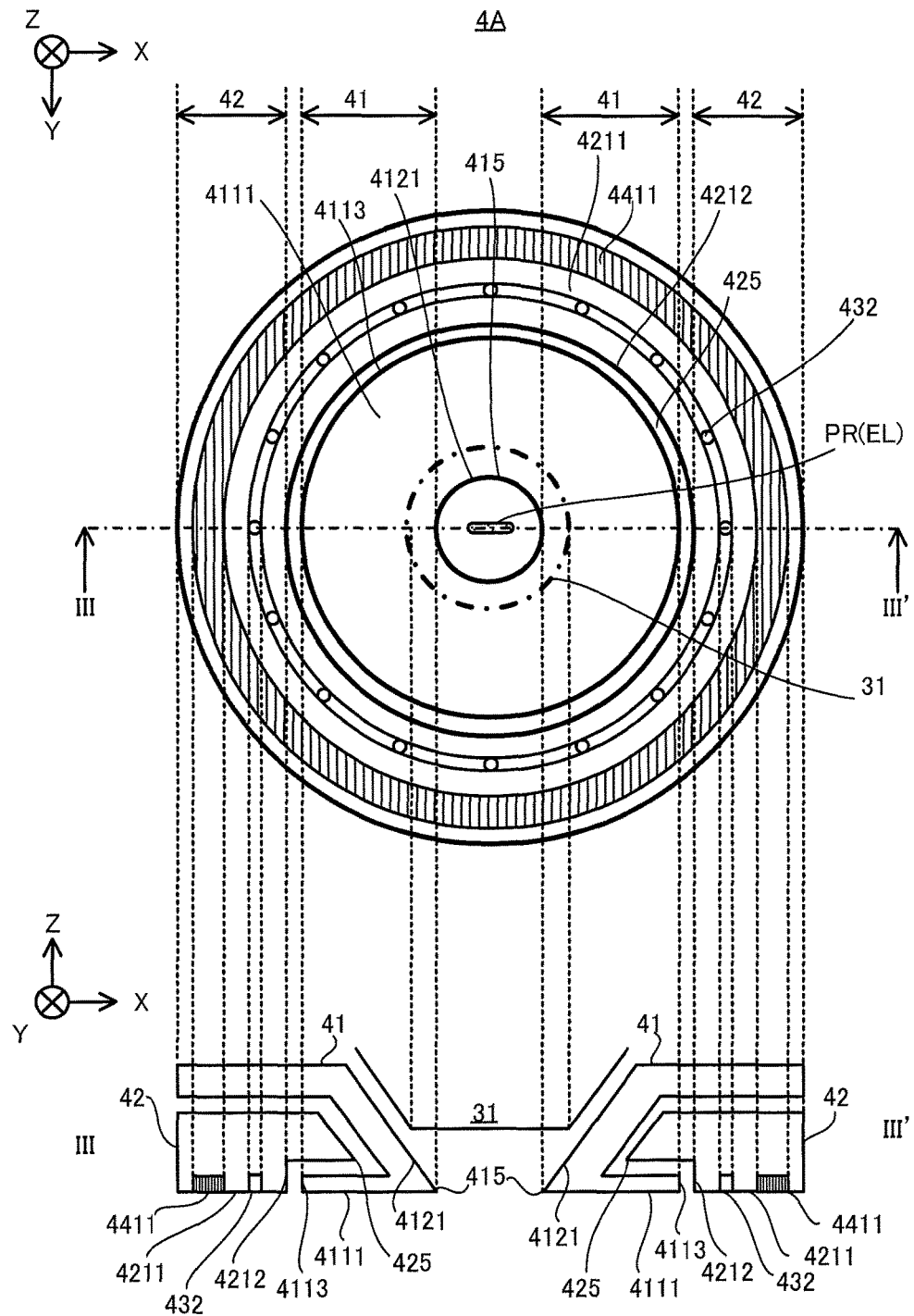

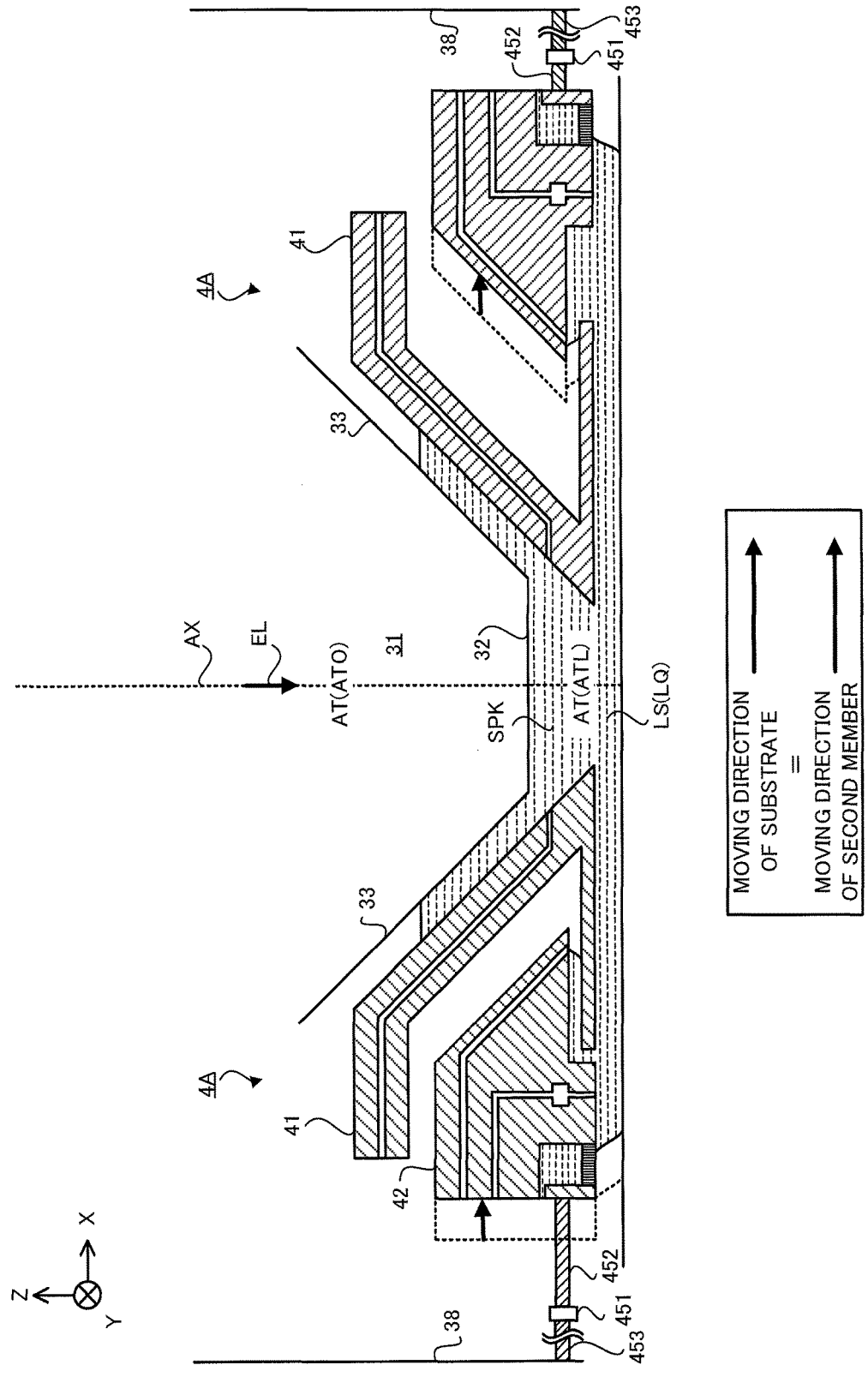

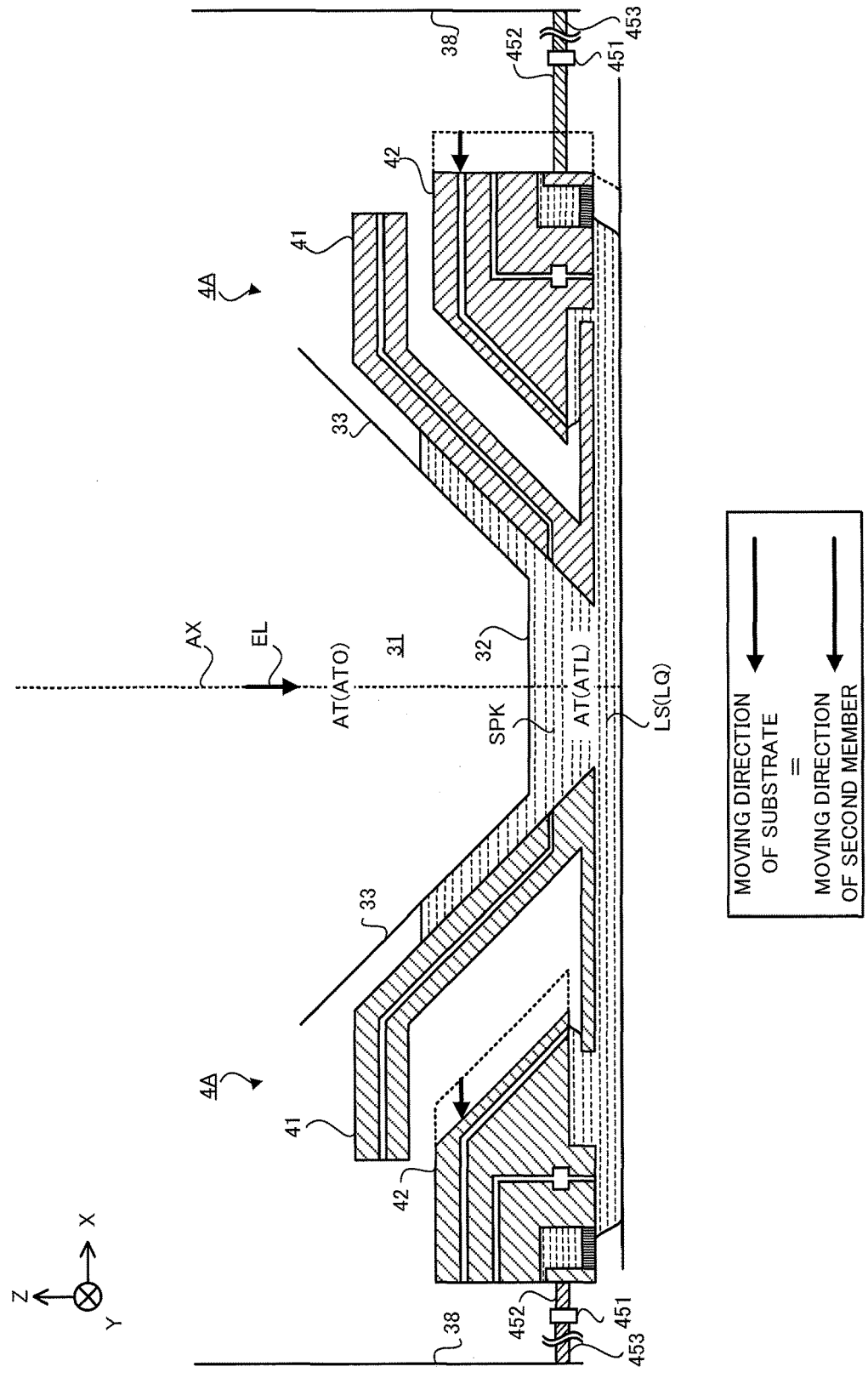

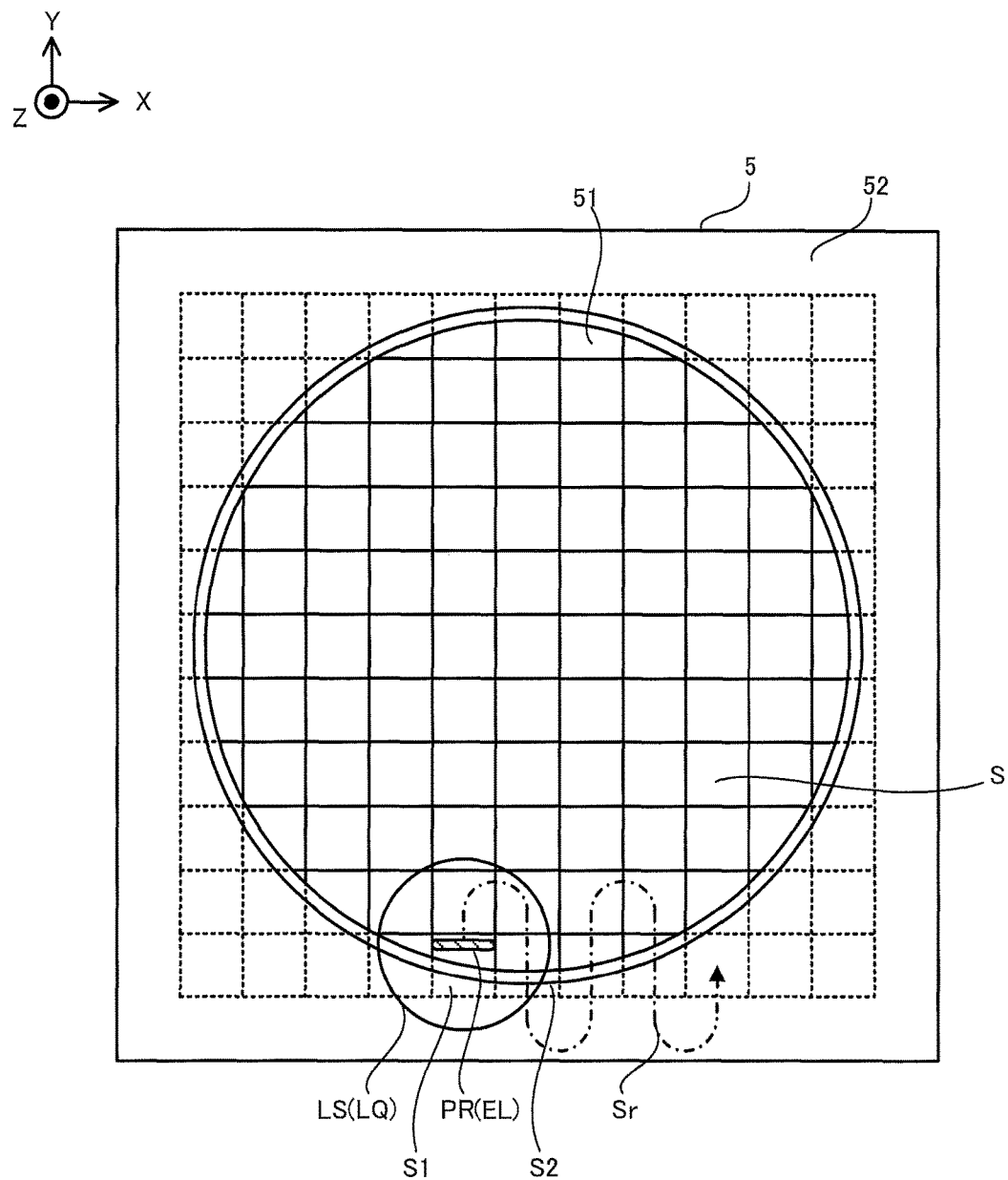
[FIG. 6]

[FIG. 7]
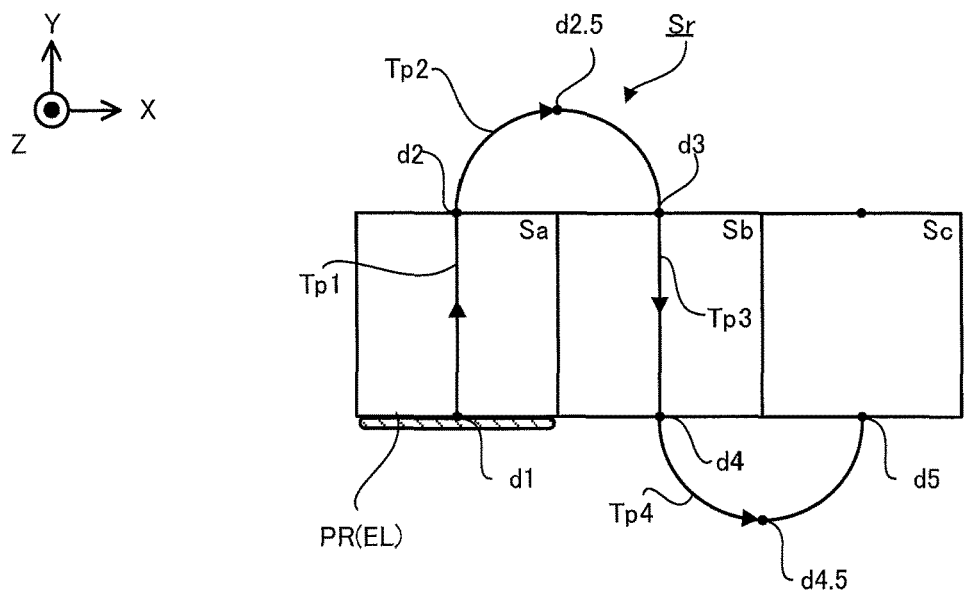
(a)
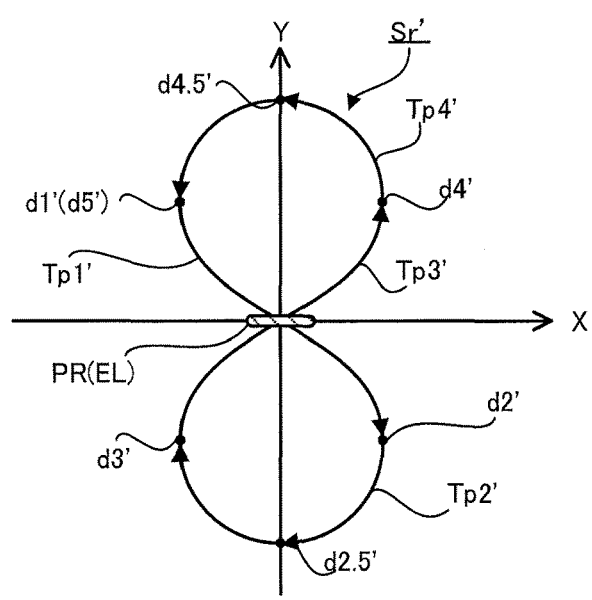
(b)

[FIG. 8]
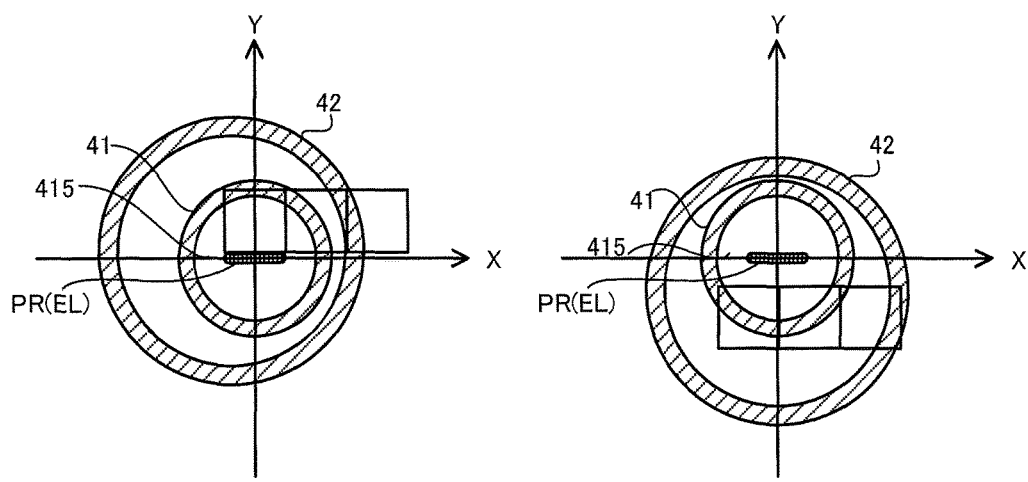
POSITION OF PROJECTION REGION = d1
POSITION OF SECOND MEMBER = d1'
(a)
POSITION OF PROJECTION REGION = d2.5
POSITION OF SECOND MEMBER = d2.5'
(c)
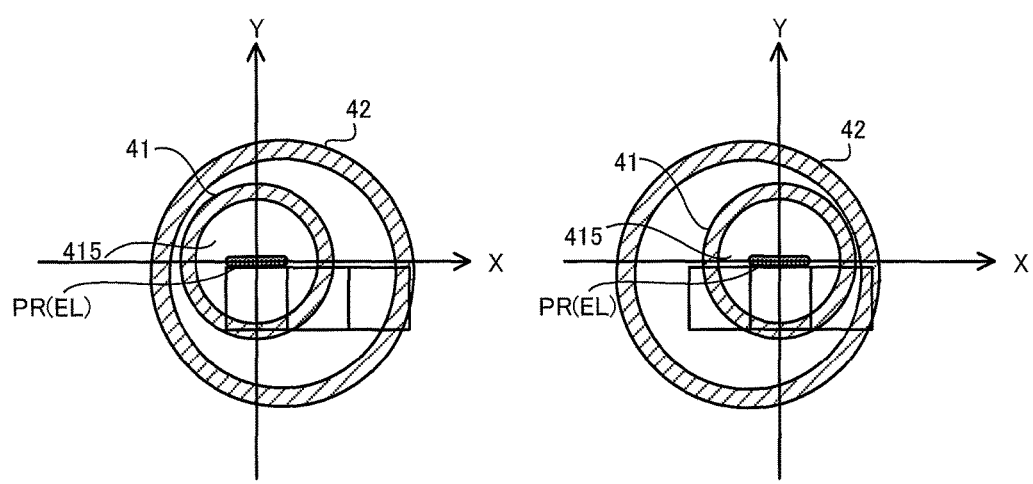
POSITION OF PROJECTION REGION = d2
POSITION OF SECOND MEMBER = d2'
(b)
POSITION OF PROJECTION REGION = d3
POSITION OF SECOND MEMBER = d3'
(d)

[FIG. 9]
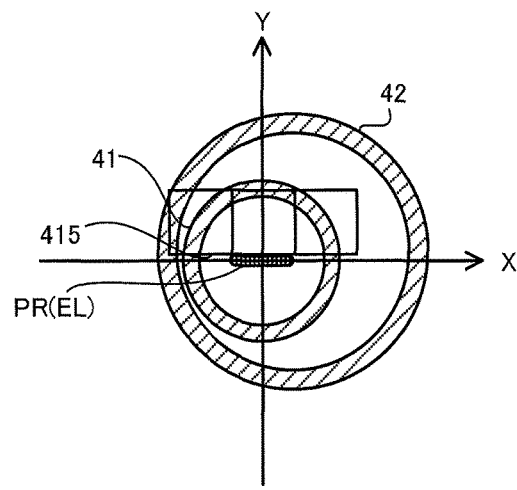
POSITION OF PROJECTION REGION = d4
POSITION OF SECOND MEMBER = d4'
(a)
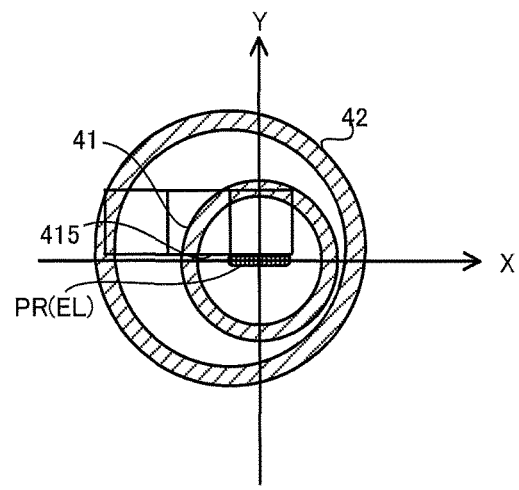
POSITION OF PROJECTION REGION = d5
POSITION OF SECOND MEMBER = d5'
(c)
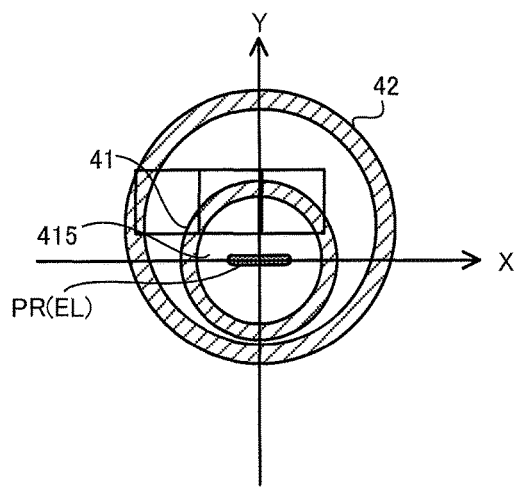
POSITION OF PROJECTION REGION = d4.5
POSITION OF SECOND MEMBER = d4.5'
(b)

[FIG. 10]
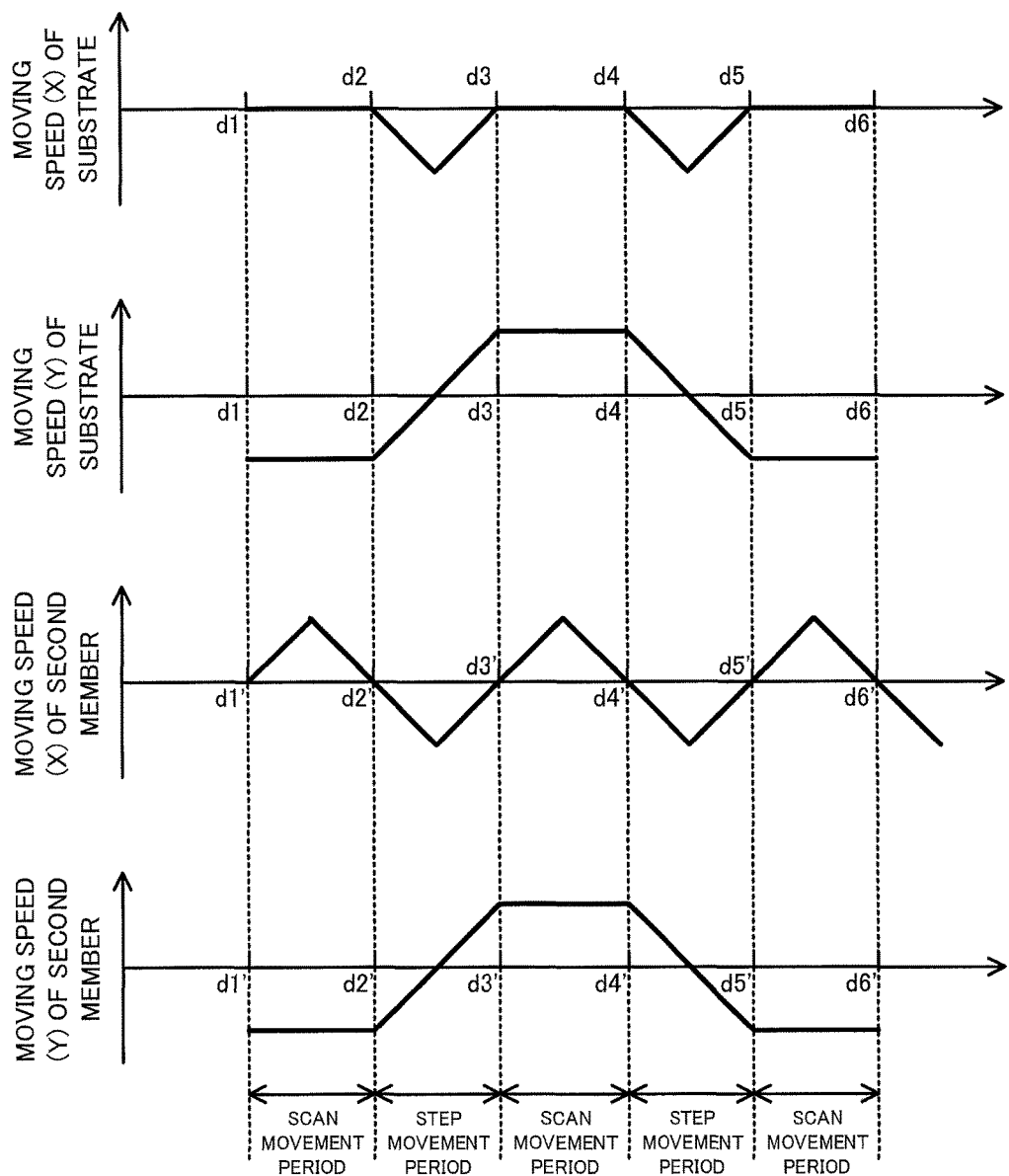

[FIG. 11]
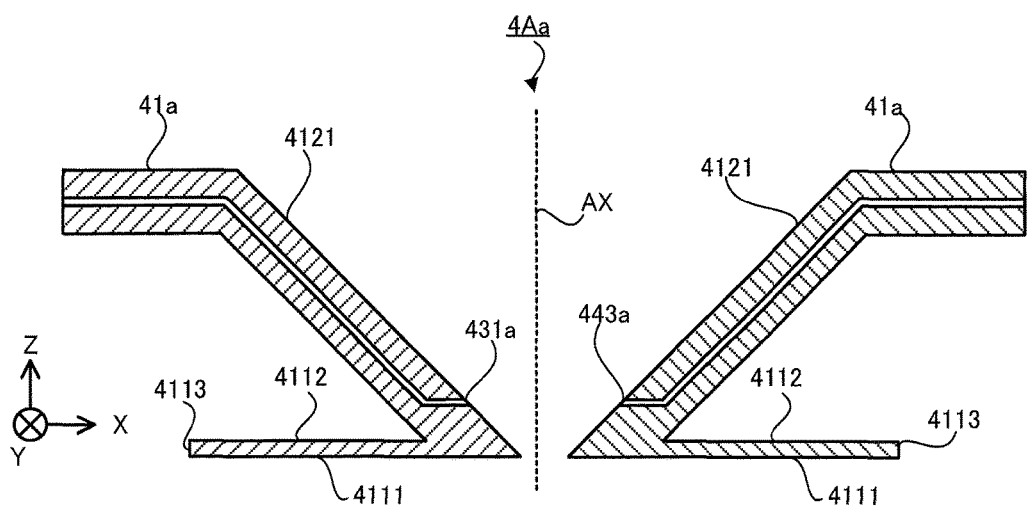
[FIG. 12]
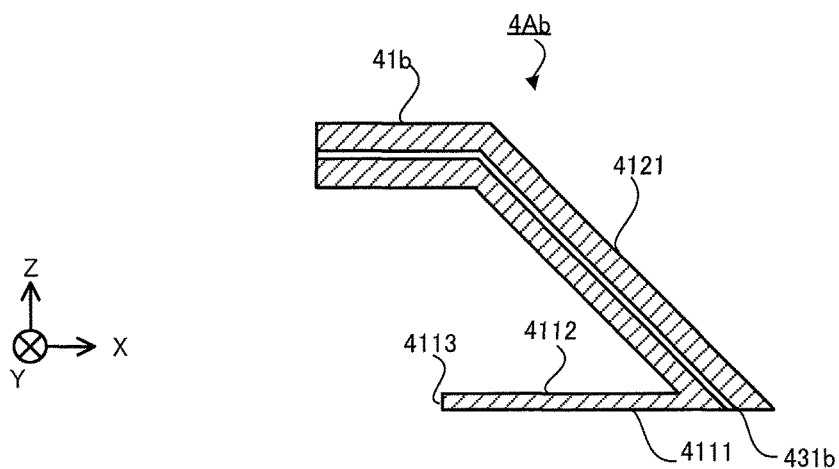

[FIG. 13]
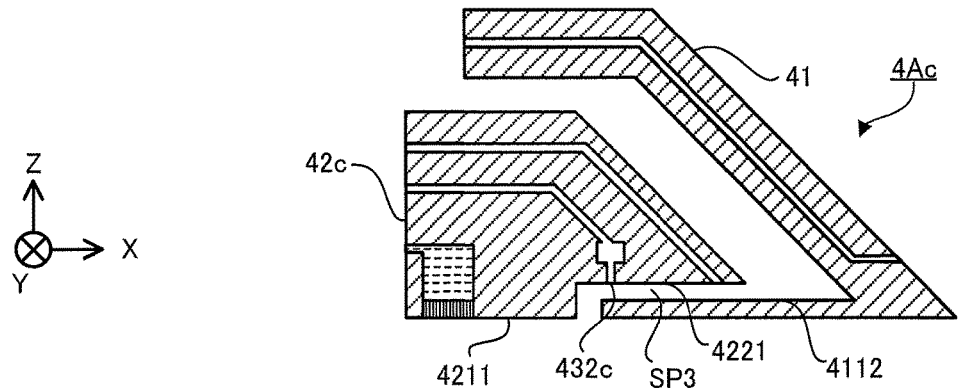
[FIG. 14]
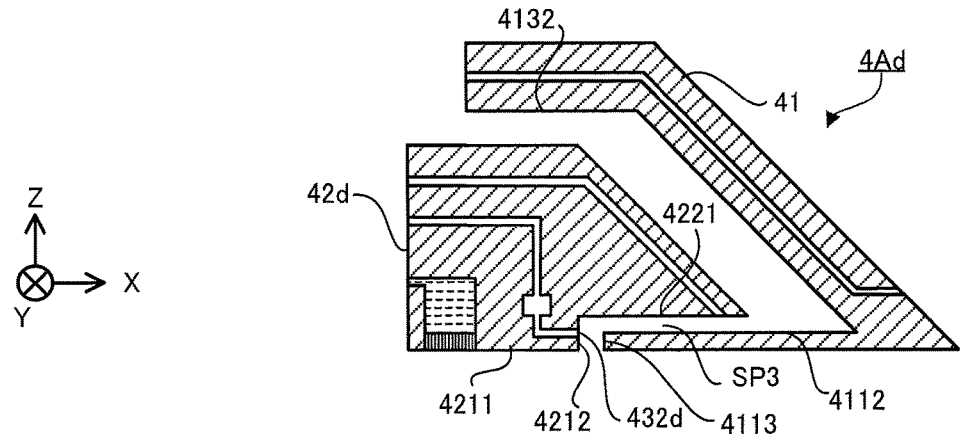
[FIG. 15]
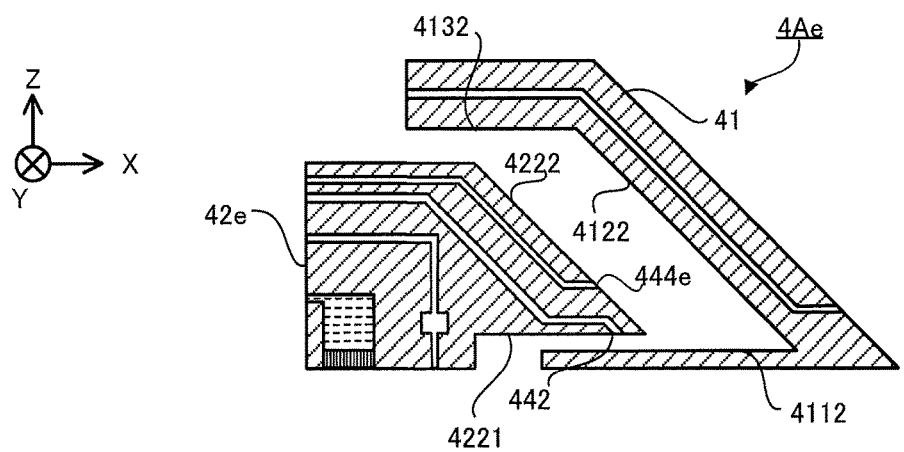

[FIG. 16]
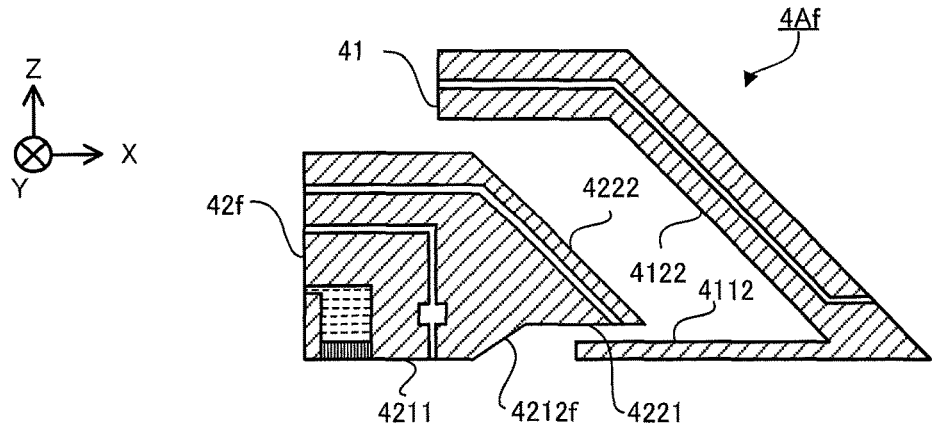
[FIG. 17]
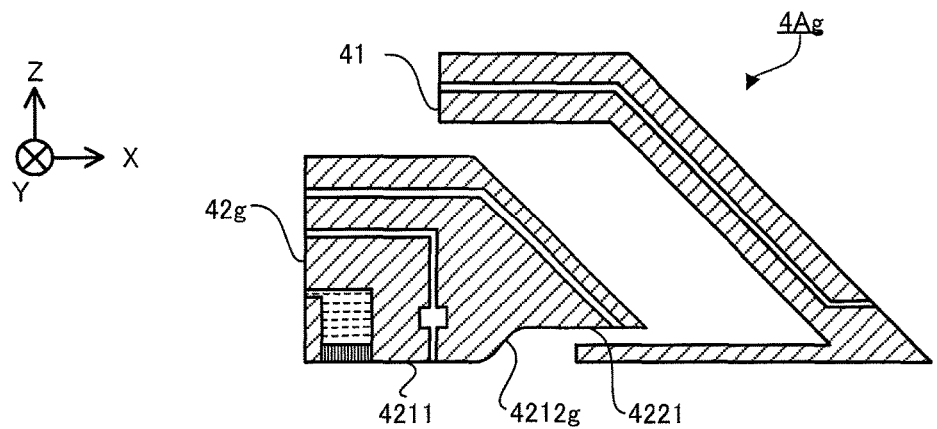
[FIG. 18]
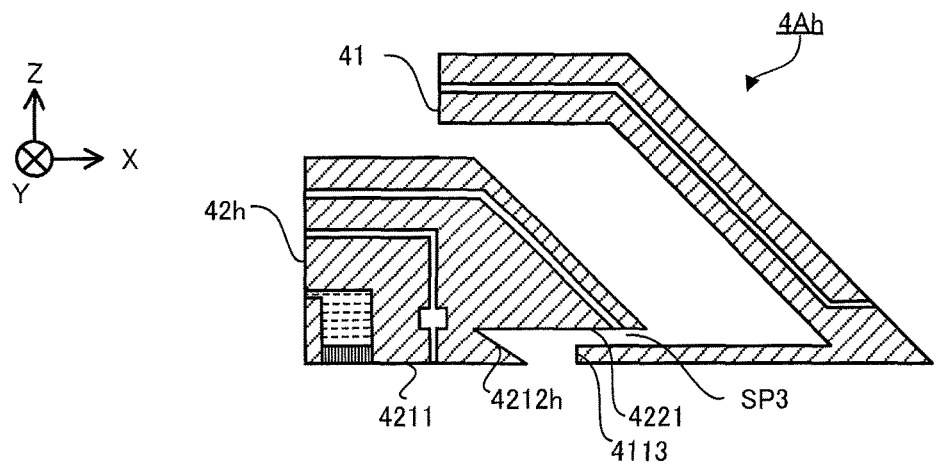

[FIG. 19]
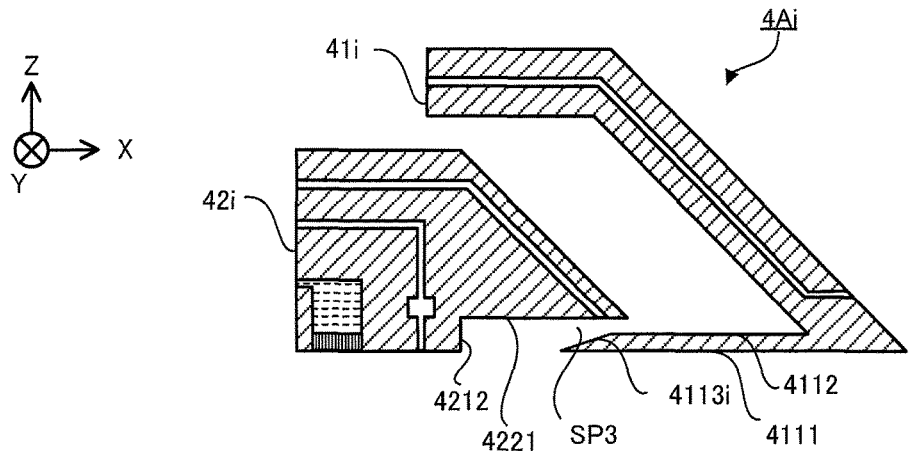
[FIG. 20]
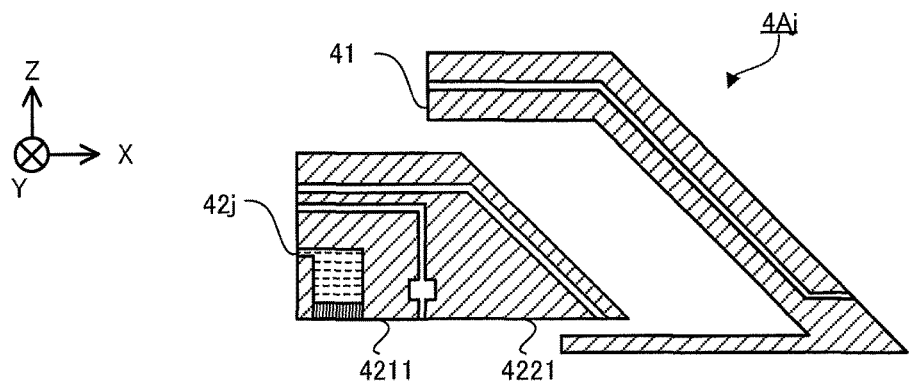
[FIG. 21]
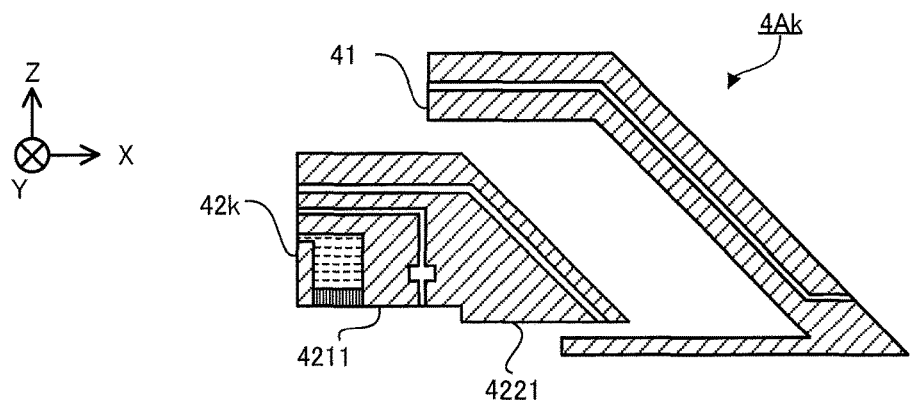

[FIG. 22]
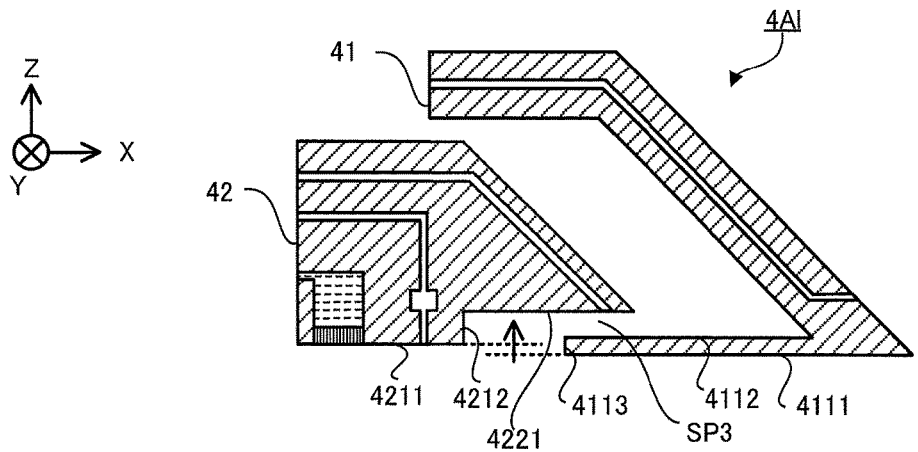
[FIG. 23]
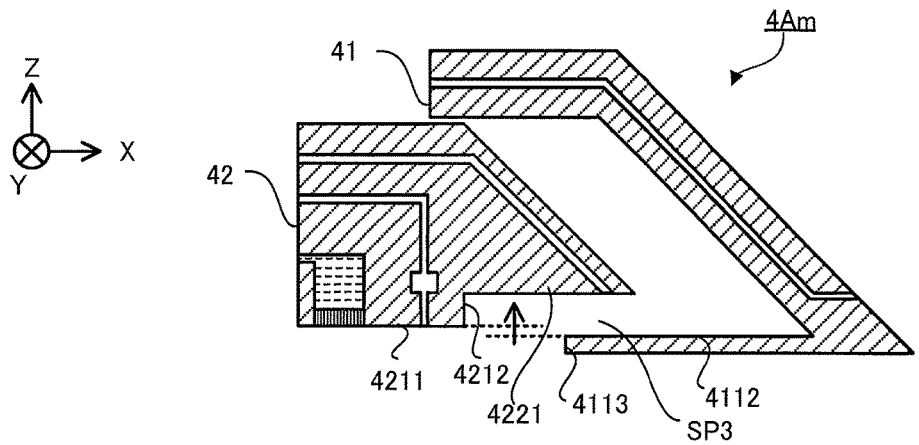

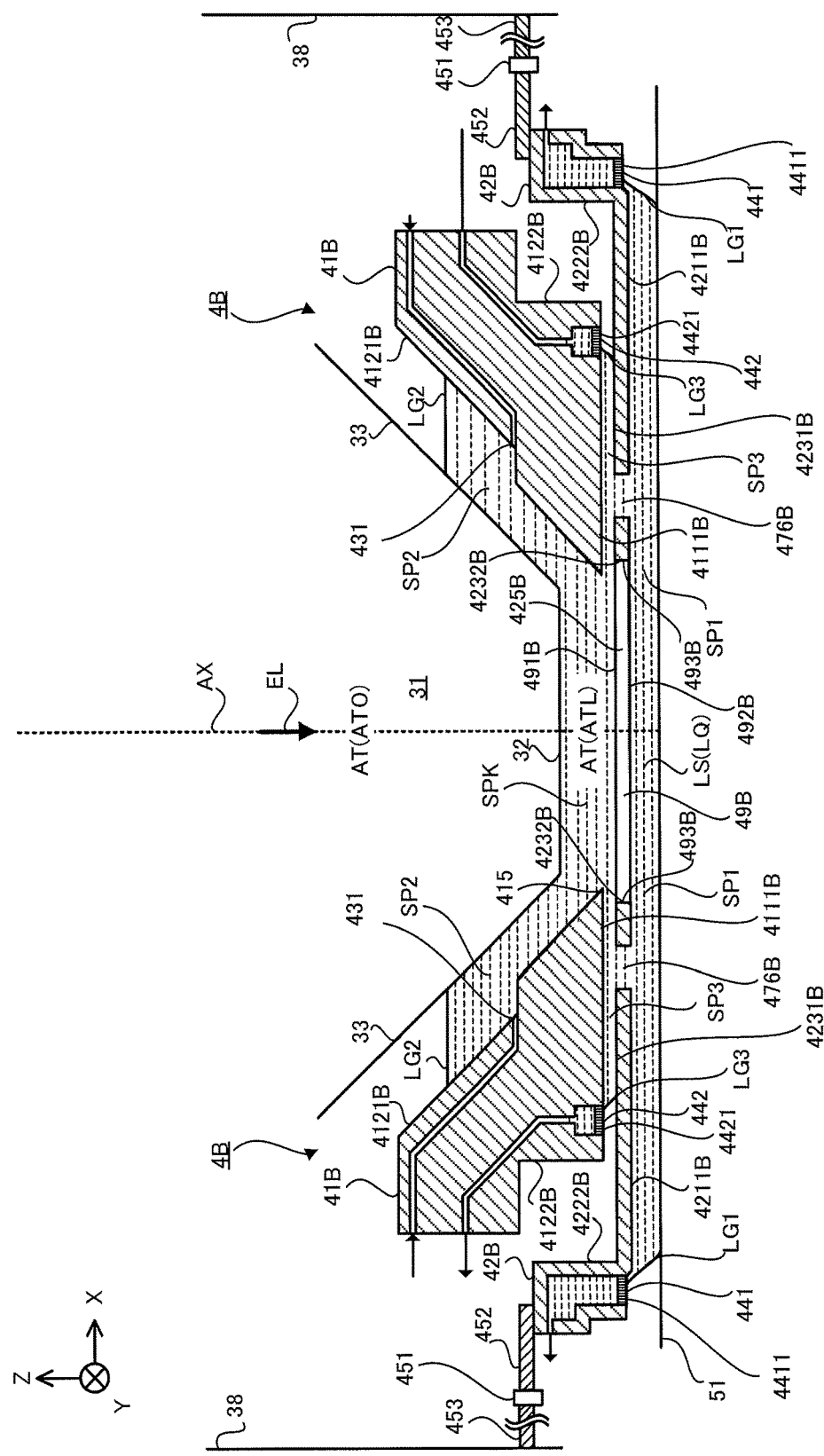
[FIG. 24]

[FIG. 25]
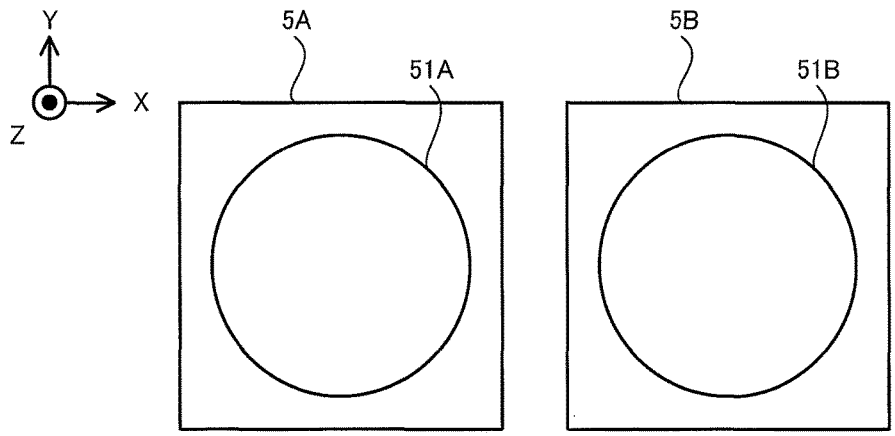
[FIG. 26]
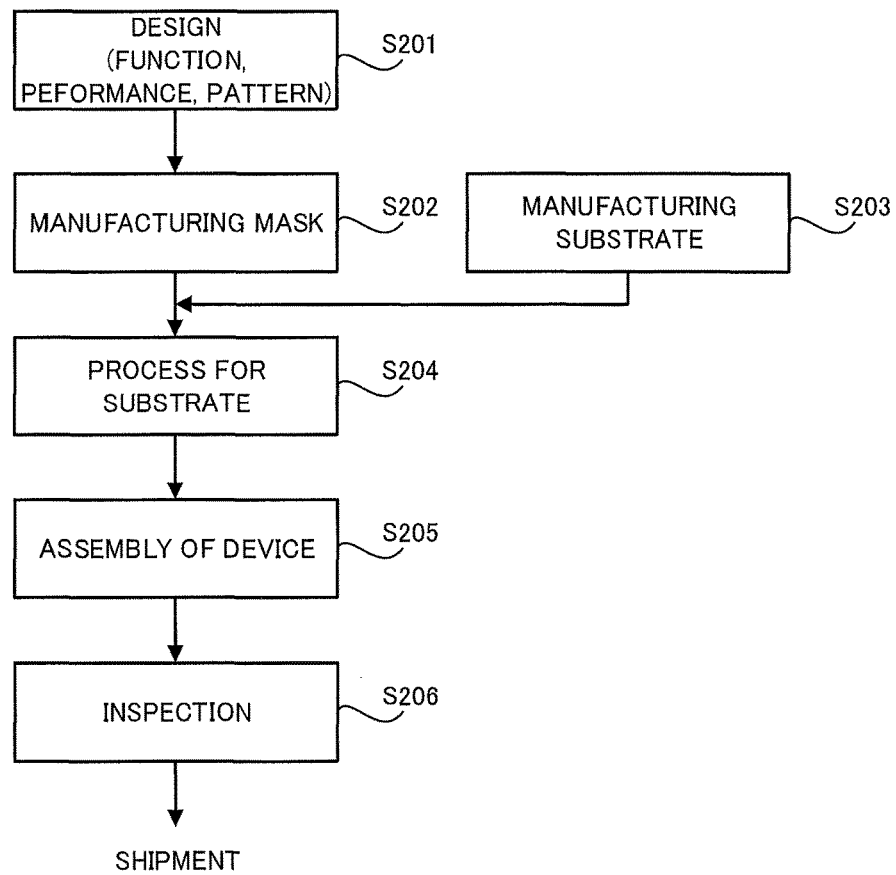

US 10,082,738 B2

LIQUID IMMERSION MEMBER, EXPOSURE APPARATUS, EXPOSURE METHOD, AND METHOD OF MANUFACTURING DEVICE

TECHNICAL FIELD

The present invention relates to a liquid immersion member, an exposure apparatus, an exposure method and a method of manufacturing device.

BACKGROUND ART

A liquid immersion exposure apparatus which exposes a substrate by using exposure light projected via a liquid between an emitting surface of an optical member and the substrate is known as an exposure apparatus which is used in a photolithography process (for example, refer to a Patent Literature 1).

CITATION LIST

Patent Literature

Patent Literature 1: U.S. Pat. No. 7,864,292

SUMMARY OF INVENTION

Technical Problem

For example, in the liquid immersion exposure apparatus, if a liquid flows out from a predetermined space or remains on an object such as the substrate, exposure failure may occur. As a result, a defective device may be manufactured.

It is an object of the present invention to provide a liquid immersion member, an exposure apparatus, an exposure method and a method of manufacturing device which are capable of suppressing the occurrence of the exposure failure.

Solution to Problem

A first aspect of a liquid immersion member is a liquid immersion member that forms, in an exposure apparatus, a liquid immersion space through which exposure light emitted from an optical member passes, the liquid immersion member includes: a first member that is disposed at at least one portion of a space around the optical member and that includes a first lower surface, the first lower surface faces an object which is movable below the optical member; and a second member that is movable and that includes a second lower surface and a third lower surface, the second lower surface is disposed at an outer side than the first lower surface viewed from an optical axis of the optical member, the second lower surface faces the object, the third lower surface us disposed at an inner side than the second lower surface viewed from the optical axis, and at least one portion of the third lower surface is disposed above at least one portion of the first lower surface.

A second aspect of a liquid immersion member is a liquid immersion member that forms, in an exposure apparatus, a liquid immersion space through which exposure light emitted from an optical member passes, the liquid immersion member includes: a first member that is disposed at at least one portion of a space around the optical member; a second member that is movable and that includes a first opening through which the exposure light is allowed to pass, at least one portion of the second member is disposed below the first member; and a third member that is disposed in the first opening and through which the exposure light passing.

A third aspect of a liquid immersion member is a liquid immersion member that forms, in an exposure apparatus, a liquid immersion space through which exposure light emitted from an optical member passes, the liquid immersion member includes: a first member that is disposed at at least one portion of a space around the optical member; and a second member that is movable, at least one portion of the second member is disposed below the first member, at least one portion of the second member which is disposed on an optical path of the exposure light emitted from the optical member is a third member through which the exposure light is allowed to pass.

A first aspect of an exposure apparatus is an exposure apparatus that exposes a substrate by using exposure light which is projected via a liquid immersion space, the exposure apparatus forms the liquid immersion space by using the above described first, second or third aspect of the liquid immersion member.

A first aspect of an exposure method is an exposure method of exposing a substrate by using exposure light which is projected via a liquid immersion space, the exposure method forms the liquid immersion space by using the above described first, second or third aspect of the liquid immersion member.

A first aspect of a method of manufacturing device is a method of manufacturing device includes: exposing a substrate by using the above described first aspect of the exposure apparatus; and developing the exposed substrate.

A second aspect of a method of manufacturing device is a method of manufacturing device includes: exposing a substrate by using the above described first aspect of the exposure method; and developing the exposed substrate.

BRIEF DESCRIPTION OF DRAWINGS

FIG. 1 is a structural view illustrating one example of the structure of the exposure apparatus in the first embodiment.

FIG. 2 is a cross-sectional view (a cross-sectional view which is parallel with the XZ plane) of the liquid immersion member in the first embodiment.

FIG. 3 is an explanatory diagram illustrating a planer view when the liquid immersion member in the first embodiment is viewed from a lower side (−Z axis side) and the cross-sectional view (the cross-sectional view which is parallel with the XZ plane) of the liquid immersion member in the first embodiment while associating one view with the other view.

FIG. 4 is a cross-sectional view illustrating a first specific example of the moving aspect of the second member.

FIG. 5 is a cross-sectional view illustrating a second specific example of the moving aspect of the second member.

FIG. 6 is a planar view illustrating one example of the substrate which is hold by the substrate stage.

FIG. 7 is a planar view illustrating a moving track of the projection region and a moving track of the second member.

FIG. 8 is a cross-sectional view illustrating the moving aspect of the second member when the substrate and the second member move by an aspect illustrated in FIG. 7.

FIG. 9 is a cross-sectional view illustrating the moving aspect of the second member when the substrate and the second member move by an aspect illustrated in FIG. 7.

FIG. 10 is a graph illustrating a moving speed of each of the substrate and the second member when the substrate and the second member move by an aspect illustrated in FIG. 7.

FIG. 11 is a cross-sectional view illustrating a structure of a first member of the liquid immersion member in the first modified example.

FIG. 12 is a cross-sectional view illustrating a structure of a first member of the liquid immersion member in the second modified example.

FIG. 13 is a cross-sectional view illustrating a structure of the liquid immersion member in the third modified example.

FIG. 14 is a cross-sectional view illustrating a structure of the liquid immersion member in the fourth modified example.

FIG. 15 is a cross-sectional view illustrating a structure of the liquid immersion member in the fifth modified example.

FIG. 16 is a cross-sectional view illustrating a structure of the liquid immersion member in the sixth modified example.

FIG. 17 is a cross-sectional view illustrating a structure of the liquid immersion member in the seventh modified example.

FIG. 18 is a cross-sectional view illustrating a structure of the liquid immersion member in the eighth modified example.

FIG. 19 is a cross-sectional view illustrating a structure of the liquid immersion member in the ninth modified example.

FIG. 20 is a cross-sectional view illustrating a structure of the liquid immersion member in the tenth modified example.

FIG. 21 is a cross-sectional view illustrating a structure of the liquid immersion member in the eleventh modified example.

FIG. 22 is a cross-sectional view illustrating a structure of the liquid immersion member in the twelfth modified example.

FIG. 23 is a cross-sectional view illustrating a structure of the liquid immersion member in the thirteenth modified example.

FIG. 24 is a cross-sectional view (a cross-sectional view which is parallel with the XZ plane) of the liquid immersion member of the exposure apparatus in the second embodiment.

FIG. 25 is a planar view illustrating one example of the substrate stages.

FIG. 26 is a flowchart for describing one example of a method for manufacturing device.

DESCRIPTION OF EMBODIMENTS

Hereinafter, with reference to drawings, embodiments of the present invention will be described. However, the present invention is not limited the below described embodiments.

In the description below, a positional relationship of various components which constitute an exposure apparatus will be described by using an XYZ rectangular coordinate system which is defined by a X axis, a Y axis and a Z axis which are perpendicular to one another. In the description below, each of a X axis direction and a Y axis direction is a horizontal direction (namely, a predetermined direction in a horizontal plane) and a Z axis direction is a vertical direction (namely, a direction which is perpendicular to the horizontal plane, and substantially an up-down direction). Moreover, rotational directions (in other words, inclination directions) around the X axis, the Y axis and the Z axis are referred to as a θX direction, a θY direction and a θZ direction, respectively.

(1) First Embodiment

Firstly, with reference to FIG. 1 to FIG. 23, an exposure apparatus EX1 in a first embodiment will be described.

(1-1) Structure of Exposure Apparatus EX1 in First Embodiment

Firstly, with reference to FIG. 1, one example of a structure of the exposure apparatus EX1 in the first embodiment will be described. FIG. 1 is a structural view illustrating one example of the structure of the exposure apparatus EX1 in the first embodiment.

As illustrated in FIG. 1, the exposure apparatus EX1 includes: a mask stage 1; an illumination system 2; a projection optical system 3; a liquid immersion member 4A; a substrate stage 5; a measurement stage 6; a measurement system 7; a chamber apparatus 8; and a control apparatus 9.

The mask stage 1 is configured to hold a mask 11. The mask stage 1 is configured to release the held mask 11.

The mask 11 includes a reticle on which a device pattern, which is projected on a substrate 51 hold by the substrate stage 5, is formed. The mask 11 may be a transmission type mask which includes: a transparent plate such as a glass plate; and the device pattern which is formed on the transparent plate by using a light-shielding material such as chromium. However, the mask 11 may be what we call a reflection type mask.

The mask stage 1 is movable along a plane (for example, a XY plane) including a region (namely, an illumination region IR described below) which is irradiated with exposure light EL emitted from the illumination system 2, in a state where the mask stage 1 holds the mask 11

For example, the mask stage 1 may be moved by an operation of a driving system 12 including a planar motor. One example of the driving system 12 including the planar motor is disclosed in U.S. Pat. No. 6,452,292, for example. However, the driving system 12 may include another motor (for example, a linear motor), in addition to or instead of the planer motor. In the first embodiment, the mask stage 1 is movable along at least one of the X axis direction, the Y axis direction, the Z axis direction, the θX direction, the θY direction and the θZ direction, by the operation of the driving system 12. Moreover, "the movement of the mask stage 1 along a predetermined direction" includes both or one of "the movement of the mask stage 1 along only the predetermined direction" and "the movement of the mask stage 1 along any direction including a directional component along the predetermined direction".

The illumination system 2 emits the exposure light EL. The illumination region IR is irradiated with the exposure light EL from the illumination system 2. One portion of the mask 11 which is located at the illumination region IR is irradiated with the exposure light EL from the illumination system 2.

The exposure light EL may be deep-ultraviolet light (DUV light) such as a bright line (for example, g-line, h-line, i-line or the like) emitted from mercury lamp and KrF excimer laser light (248 nm in wavelength) and the like, for example. The exposure light EL may be ArF excimer laser light (193 nm in wavelength) and vacuum-ultraviolet light (VUV light) such as F2 laser light (157 nm in wavelength) and the like, for example.

The projection optical system 3 projects the exposure light EL from the mask 11 (namely, an image of the device pattern which is formed on the mask 11) on the substrate 51. Specifically, the projection optical system 3 projects the exposure light EL on a projection region PR. The projection optical system 3 projects the image of the device pattern on one portion of the substrate 51 which is located at the projection region PR (for example, at least one portion of a shot region S described below).

In the first embodiment, the projection optical system 3 is a reduction system. For example, a projection magnification of the projection optical system 3 may be ¼, ⅕, ⅛, or another value. However, the projection optical system 3 may be an equal magnification system or an enlargement system.

The projection optical system 3 may be a refractive system which does not include a reflective optical element. The projection optical system 3 may be a reflection system which does not include a refractive optical element. The projection optical system 3 may be a refractive reflection system which includes both of the reflective optical element and the refractive optical element. The projection optical system 3 may project the image of the device pattern as an inverted image. The projection optical system 3 may project the image of the device pattern as an erected image.

The projection optical system 3 includes a terminal optical element 31 which includes an emitting surface 32 from which the exposure light EL is emitted. The emitting surface 32 emits the exposure light EL to an image plane of the projection optical system 3. The terminal optical element 31 is an optical element which is closest to the image plane of the projection optical system 3 among a plurality of optical elements of the projection optical system 3.

An optical axis AX of the terminal optical element 31 is parallel to the Z axis. In this case, with respect to the direction which is parallel to the optical axis AX of the terminal optical element 31, a direction from an incident surface of the projection optical element 31 to the emitting surface 32 is −Z axis direction and a direction from to the emitting surface 32 to the incident surface of the terminal optical element 31 is +Z axis direction. However, the optical axis AX of the terminal optical element 31 may not be parallel to the Z axis.

Moreover, at least one portion of the optical axis of the projection optical system 3 may coincide with the optical axis AX of the terminal optical element 31 and may be parallel to the Z axis. In this case, with respect to the Z axis direction, a direction from the projection optical system 3 to the image plane of the projection optical system 3 is −Z axis direction and a direction from the projection optical system 3 to object plane of the projection optical system 3 is +Z axis direction.

Moreover, a center of the above described projection region PR may or may not coincide with the optical axis AX. Moreover, the projection region PR may not be disposed on the optical axis AX.

The emitting surface 32 faces the −Z axis direction. Therefore, the exposure light EX emitted from the emitting surface 32 propagates in the −Z axis direction. The emitting surface 32 is a plane which is parallel to the XY plane (namely, the horizontal plane). However, the emitting surface 32 may be inclined with respect to the XY plane. At least one portion of the emitting surface 32 may be a curved surface (for example, a convex surface or a concave surface).

The terminal optical element 31 includes an outer surface 33 which is disposed around the emitting surface 32, in addition to the emitting surface 32 which faces −Z axis direction. The exposure light EL may not be emitted from the outer surface 33, although the exposure light EL is emitted from the emitting surface 32. The outer surface 33 has a shape to be distant from the optical axis AX more as it is located at the +Z axis side more (namely, a shape to be inclined with respect to the optical axis AX). However, at least one portion of the outer surface 33 may has another shape.

The projection optical system 3 is supported by a reference frame 37. The reference frame 37 is supported by an apparatus frame 38 which is disposed at a lower side (namely, −Z axis direction side) than the reference frame 37. A vibration isolator 39 is disposed between the reference frame 37 and the apparatus frame 38. The vibration isolator 39 suppresses transmission of vibration from the apparatus frame 38 to the reference frame 37. The vibration isolator 39 may include a spring apparatus, for example. One example of the spring apparatus is a spring including an elastic member such as a metal, a gum or the like, or a spring including gas such as air (what we call, an air amount).

The liquid immersion member 4A forms a liquid immersion space LS. The liquid immersion space LS means a space (in other words, a portion or a region) which is filled with liquid LQ which is purified water for example. The detailed structure of the liquid immersion member 4A will be described later with reference to FIG. 2 to FIG. 3 and so on.

The substrate stage 5 includes: a holding portion which releasably holds the substrate 51; and an upper surface 52 which is disposed around the holding portion. The upper surface 52 is a plane which is parallel to an upper surface of the substrate 51. The upper surface 52 and the upper surface of the substrate 51 may be disposed in a same plane However, at least one portion of the upper surface 52 may be inclined with respect to the upper surface of the substrate 51, and may include a curved surface. At least one portion of the upper surface 52 and the upper surface of the substrate 51 may not be disposed in the same plane. One example of the substrate stage 5 is disclosed in United States Patent Application Publication No. 2007/0177125 and United States Patent Application Publication No. 2008/0049209.

The substrate stage 5 is movable along a plane (for example, the XY plane) including the projection region PR in a state where the substrate stage 5 holds the substrate 51. The substrate stage 5 is movable on a guide surface 811 of a base member 81. Moreover, the guide surface 811 is substantially parallel to the plane (for example, the XY plane) including the projection region PR.

For example, the substrate stage 5 may be moved by an operation of a driving system 82 including a planar motor. One example of the driving system 82 including the planar motor is disclosed in U.S. Pat. No. 6,452,292, for example. The planar motor of the driving system 82 may include a mover 825 which is disposed at the substrate stage 5 and a stator 828 which is disposed at the base member 81. However, the driving system 82 may include another motor (for example, a linear motor), in addition to or instead of the planer motor. In the first embodiment, the substrate stage 5 is movable along at least one of the X axis direction, the Y axis direction, the Z axis direction, the θX direction, the θY direction and the θZ direction, by the operation of the driving system 82. Moreover, "the movement of the substrate stage 5 along a predetermined direction" includes both or one of "the movement of the substrate stage 5 along only the predetermined direction" and "the movement of the substrate stage 5 along any direction including a directional component along the predetermined direction".

The substrate 51 is a substrate for manufacturing a device. For example, the substrate 51 includes: a base material such as a semiconductor wafer; and a photosensitive film which is formed on the base material. The photosensitive film is a film of a photosensitive material (for example, photoresist), for example. Moreover, the substrate 51 may include another film (for example, both of or one of an antireflection film which suppresses undesired reflection of the exposure light EL on the surface of the substrate 51 and a protective film which protects the surface of the substrate 51), in addition to the photosensitive film.

The measurement stage 6 does not hold the substrate 51 and is configured to hold a measurement element (measurement instrument) 61 which measures the exposure light EL. Namely, the exposure apparatus EX1 in the first embodiment is an exposure apparatus which includes the substrate stage 5 and the measurement stage 6. One example of this exposure apparatus is disclosed in U.S. Pat. No. 6,897,963 and European Patent Application Publication No. 1713113.

The measurement stage 6 is movable along a plane (for example, the XY plane) including the projection region PR. The measurement stage 6 is movable on the guide surface 811 of the base member 81, as with the substrate stage 5.

For example, the measurement stage 6 may be moved by an operation of the driving system 82 including the planar motor, as with the substrate stage 5. The planar motor of the driving system 82 may include a mover 826 which is disposed at the measurement stage 6 and the stator 828 which is disposed at the base member 81. However, the driving system 82 may include another motor (for example, a linear motor), in addition to or instead of the planer motor. In the first embodiment, the measurement stage 6 is movable along at least one of the X axis direction, the Y axis direction, the Z axis direction, the θX direction, the θY direction and the θZ direction, by the operation of the driving system 82. Moreover, "the movement of the measurement stage 6 in a predetermined direction" includes both or one of "the movement of the measurement stage 6 along only the predetermined direction" and "the movement of the measurement stage 6 along any direction including a directional component along the predetermined direction".

The measurement system 7 measures positions of the substrate stage 5 and the measurement stage 6. The measurement system 7 may include an interferometer system to measure the positions of the substrate stage 5 and the measurement stage 6. The interferometer system may measure the positions of the substrate stage 5 and the measurement stage 6 by radiating measurement light to each of a measurement mirror which is disposed at the substrate stage 5 and a measurement mirror which is disposed at the measurement stage 6 and by detecting a reflected light of the measurement light. However, the measurement system 7 may include an encoder system which measures the positions of the substrate stage 5 and the measurement stage 6, in addition to or instead of the interferometer system. One example of the encoder system is disclosed in United State Patent Application Publication No. 2007/0288121, for example.

The chamber apparatus 8 adjusts an environment (for example, at least one of temperature, humidity, pressure and a degree of cleanness) of a space CS. At least the terminal optical element 31, the liquid immersion member 4, the substrate stage 5 and the measurement stage 6 are disposed in the space CS. However, at least one portion of the mask stage 1 and the illumination system 2 may be disposed in the space CS.

The control apparatus 9 controls an operation of the entire exposure apparatus EX1. The controlling apparatus 9 includes: a controller 91 which controls the operation of the entire exposure apparatus EX1; and a memory 92 which stores various information used for the operation of the exposure apparatus EX1.

The controller 91 controls the position of the substrate stage 5 on the basis of the measurement result of the measurement system 7, when the exposure apparatus EX1 exposes the substrate 51 by using the exposure light EL. Namely, the controller 91 controls the driving system 82 to move the substrate stage 5. The controller 91 controls the position of the mask stage 1, when the exposure apparatus EX1 exposes the substrate 51 by using the exposure light EL. Namely, the controller 91 controls the driving system 12 to move the mask stage 1. The controller 91 controls the position of the measurement stage 6 on the basis of the measurement result of the measurement system 7, when the exposure apparatus EX1 measures the exposure light EL by using the measurement stage 6. Namely, the controller 91 controls the driving system 82 to move the measurement stage 6.

The controller 91 controls the position of at least one portion of the member (for example, a second member 42 which will be described in detail later with reference to FIG. 2) of the liquid immersion member 4A, as described later in detail. A moving aspect of at least one portion of the members of the liquid immersion member 4A will be described in detail later with reference to FIG. 4 to FIG. 5.

(1-2) Liquid Immersion Member 4A in First Embodiment

Next, with reference to FIG. 2 to FIG. 3, the liquid immersion member 4A in the first embodiment will be described.

(1-2-1) Structure of Liquid Immersion Member 4A in First Embodiment

Firstly, with reference to FIG. 2 and FIG. 3, the structure of the liquid immersion member 4A in the first embodiment will be described. FIG. 2 is a cross-sectional view (a cross-sectional view which is parallel with the XZ plane) of the liquid immersion member 4A in the first embodiment. FIG. 3 is an explanatory diagram illustrating a planer view when the liquid immersion member 4A in the first embodiment is viewed from a lower side (−Z axis side) and the cross-sectional view (the cross-sectional view which is parallel with the XZ plane) of the liquid immersion member 4A in the first embodiment while associating one view with the other view.

In the description below, the "upper side" means the +Z axis direction, if there is no notation. The "lower side" means the −Z axis direction. The "inner side" means an inner side along a radial direction of the optical axis AX and a side to get close to the optical axis AX. The "outer side" means an outer side along the radial direction of the optical axis AX and a side to get distant from the optical axis AX.

As illustrated in FIG. 2, the liquid immersion member 4A forms the liquid immersion space LS on at least one portion of an object which is movable below the emitting surface 32 and the liquid immersion member 4A. Therefore, the object is allowed to face both of the emitting surface 32 and the liquid immersion member 4A while facing the liquid immersion space LS.

The object may be the substrate stage 5. In this case, the liquid immersion member 4A forms the liquid immersion space LS on at least one portion of the substrate stage 5. The object may be the substrate 51 which is hold by the substrate stage 5. In this case, the liquid immersion member 4A forms the liquid immersion space LS on at least one portion of the substrate 51. The object may be the measurement stage 6 or the measurement element 61 which is hold by the measurement stage 6. In this case, the liquid immersion member 4A forms the liquid immersion space LS on at least one portion of the measurement stage 6 or on at least one portion of the measurement element 61.

The liquid immersion member 4A may form the liquid immersion space LS which is positioned over two different objects. For example, the liquid immersion member 4A may form the liquid immersion space LS which is positioned over the upper surface 52 and the substrate 51. For example, the liquid immersion member 4A may form the liquid immersion space LS which is positioned over the substrate stage 5 and the measurement stage 6.

In the description below, the object is the substrate 51 for the purpose of simple description.

The liquid immersion member 4A forms the liquid immersion space LS so that an optical path AT of the exposure light EL is filled with the liquid LQ. For example, the liquid immersion member 4A may form the liquid immersion space LS so that an optical path ATL of the optical path AT which is between the emitting surface 32 and the substrate 51 is filled with the liquid LQ. The liquid immersion member 4A may form the liquid immersion space LS so that at least one region of an upper surface of the substrate 51 which includes the projection region PR is filled with the liquid LQ. The exposure light EL from the emitting surface 32 is projected on the substrate 51 via the liquid LQ. Namely, the exposure apparatus EX1 in the first embodiment is a liquid immersion exposure apparatus which exposes the substrate 51 by using the exposure light which is projected via the liquid LQ.

The liquid immersion member 4A forms at least one portion of the liquid immersion space LS between the terminal optical element 31 and the substrate 51. The liquid immersion member 4A forms at least one portion of the liquid immersion space LS between the liquid immersion member 4A and the substrate 51.

This liquid immersion member 4A includes a first member 41 and a second member 42 as illustrated in FIG. 2 and FIG. 3, to form the above described liquid immersion space LS. Hereinafter, the first member 41 and the second member 42 will be described in order.

Firstly, the first member 41 will be described.

The first member 41 is disposed around the optical path AT. The first member 41 has a shape to surround the optical path AT. The "optical path AT" herein includes both of or one of the above described optical path ATL and an optical path ATO of the exposure light EL within the terminal optical element 31. In an example illustrated in FIG. 3, the first member 41 has an annular shape or a closed loop shape which is one example of the shape to surround the optical path AT. Another example of the shape to surround the optical path AT is a frame shape (for example, a shape which forms a frame of a non-circular shape, a polygonal shape, an oval shape or the like), for example.

The first member 41 is disposed so that a gap (in other words, a space SP2) is formed between the first member 41 and the terminal optical element 31. The first member 41 is disposed so as not to contact the terminal optical element 31.

The first member 41 is disposed around the terminal optical element 31. The first member 41 has a shape to surround the terminal optical element 31. In this case, the first member 41 may function as a protective member which protects the terminal optical path 31. For example, the first member 41 may function as the protective member which prevents the second member 42 from contacting the terminal optical element 31.

One portion of the first member 41 (for example, a lower surface 4111 and an inner side surface 4121 which are described later) is disposed below the emitting surface 32. However, the first member 41 may not be disposed below the emitting surface 32.

One portion of the first member 41 (for example, one portion of a first part 411 which is described later) is disposed below one portion of the second member 42 (for example, a second part 422 which is described later). Therefore, one portion of the first member 41 (for example, the lower surface 4111 which is described later) faces the substrate 51. One portion of the first member 41 (for example, a third part 413 which is described later) is disposed above one portion of the second member 42 (for example, one portion of the second part 422 which is described later). One portion of the first member 41 (for example, the first part 411 which is described later) is disposed at the inner side than one portion of the second member 42 (for example, a first part 421 which is described later).

The first member 41 does not substantially move. Namely, the first member 41 is substantially fixed. For example, the first member 41 may be fixed to the apparatus frame 38 via a non-illustrated support member. Moreover, both of or one of the projection optical system 3 and the terminal optical element 31 does not substantially move (namely, are substantially fixed).

This first member includes the first part 411, a second part 412 and the third part 413.

The first part 411 faces one portion of the substrate 51 via a space SP1 which can be one portion of the liquid immersion space LS. The first part 411 has a plate-like (in other words, board-like) shape to range along the XY plane (alternatively, a plane which is parallel to the surface of the substrate 51).

The first part 411 includes the lower surface 4111, an upper surface 4112 and an outer side surface 4113.

The lower surface 4111 is a plane which faces the lower side. The lower surface 4111 faces one portion of the substrate 51 via the space SP1. The lower surface 4111 is disposed below both of or one of the upper surface 4112 and the outer side surface 4113. The lower surface 4111 is parallel to the XY plane (namely, perpendicular to the optical axis AX). The lower surface 4111 is disposed below the emitting surface 32.

The upper surface 4112 is a plane which faces the upper side. The upper surface 4112 is disposed above the outer side surface 4113. The upper surface 4112 is parallel to the XY plane. Therefore, the upper surface 4112 and the lower surface 4111 forms one part of the first part 411 whose shape is plate-like.

At least one portion of the upper surface 4112 has liquid repellent property against the liquid LQ. For example, at least one portion of the upper surface 4112 which possibly faces the liquid immersion space LS has the liquid repellent property against the liquid LQ. At least one portion of the upper surface 4112 may have a surface of a resin film which includes fluorine, for the repellent property of the upper surface 4112. One example of this resin is PFA (tetra fluoro ethylene-perfluoro alkylvinyl ether copolymer) or PTFE (Poly Tetra Fluoro Ethylene).

The outer side surface 4113 is a plane which faces the outer side. The outer side surface 4113 is parallel to the optical axis AX. The outer side surface 4113 connects (in other words, couples or links) an outer edge of the lower surface 4111 and an outer edge of the upper surface 4112. Therefore, the lower edge of the outer side surface 4113 corresponds to the outer edge of the lower surface 4111. The upper edge of the outer side surface 4113 corresponds to the outer edge of the upper surface 4112.

One portion of the second part 412 faces the outer surface 33 via the space SP2 which can be one portion of the liquid immersion space LS.

The second part 412 includes the inner side surface 4121 and an outer side surface 4122

The inner side surface 4121 is a plane which faces the inner side. The inner side surface 4121 extends upwardly from an inner edge of the lower surface 4111. Therefore, a lower edge of the inner side surface 4121 corresponds to the inner edge of the lower surface 4111.

One portion of the inner side surface 4121 faces the outer surface 33 via the space SP2. The inner side surface 4121 is parallel to the outer surface 33. The inner side surface 4121 is inclined with respect to the XY plane. The inner side surface 4121 extends upwardly and outwardly from its lower edge, as with the outer surface 33.

The outer side surface 4122 is a plane which faces the outer side. The outer side surface 4122 extends upwardly from an inner edge of the upper surface 4112. Therefore, the lower edge of the outer side surface 4122 corresponds to the inner edge of the upper surface 4112.

The outer side surface 4122 does not face the outer surface 33. The outer side surface 4122 is parallel to the inner side surface 4121. The outer side surface 4122 is inclined with respect to the XY plane. The outer side surface 4122 extends upwardly and outwardly from its lower edge, as with the inner side surface 4121.

The third part 413 does not face the substrate 51. The third part 413 may has a plate-like (in other words, board-like) shape to range along the XY plane (alternatively, the plane which is parallel to the surface of the substrate 51).

The third part 413 includes an upper surface 4131 and a lower surface 4132.

The upper surface 4131 is a plane which faces the upper side. The upper surface 4131 is parallel to the XY plane. The upper surface 4131 extends outwardly from an upper edge of the inner side surface 4121. Therefore, an inner edge of the upper surface 4131 corresponds to the upper edge of the inner side surface 4121.

At least one portion of the upper surface 4131 has liquid repellent property against the liquid LQ, as with the upper surface 4112. As a result, outflow of the liquid LQ from the space SP2 to the upper surface 4131 is suppressed.

The lower surface 4132 is a plane which faces the lower side. The lower surface 4132 extends outwardly from an upper edge of the outer side surface 4122. Therefore, an inner edge of the lower surface 4132 corresponds to the upper edge of outer side surface 4122. The lower surface 4132 is disposed below the upper surface 4131. The lower surface 4132 is parallel to the XY plane. The upper surface 4131 and the lower surface 4132 forms the plate-like part of the third part 413.

The first member 41 further includes an opening 415 through which the exposure light EL from the emitting surface 32 is allowed to pass. The opening 415 is defined by the lower edge of the inner side surface 4121. The lower surface 4111 is disposed around the opening 415. A center of the opening 415 coincides with the optical axis AX. The center of the opening 415 coincides with a center of the emitting surface 32. A radius and an area of the opening 415 along the XY plane are smaller than a radius and an area of the emitting surface 32. A shape of the opening 415 on the XY plane may be a circular shape (refer to FIG. 3), for example.

In the description above, the first member 41 includes the first part 411, the second part 412 and the third part 413, for the purpose of simple description. However, the first member 41 may not define at least one of the first part 411, the second part 412 and the third part 413.

Next, the second member 42 will be described.

The second member 42 is disposed around the optical path AT. Therefore, the second member 42 has a shape to surround the optical path AT. In an example illustrated in FIG. 3, the second member 42 has an annular shape or a closed loop shape which is one example of the shape to surround the optical path AT.

The second member 42 is disposed so that one portion of the first member 41 is disposed between the second member 42 and the terminal optical element 31. The second member 42 is disposed so as not to contact the terminal optical element 31.

The second member 42 is disposed so that one portion of the second member 42 (for example, at least one portion of both of or one of a lower surface 4211 and a lower surface 4221 which are described later) faces the substrate 51. The second member 42 is disposed so as not to contact the first member 41. The second member 42 is disposed so that a gap is formed between the first member 41 and the second member 42. One portion of the second member 42 (for example, one portion of the second part 422 which is described later) is disposed above one portion of the first member 41 (for example, one portion of the first part 411). One portion of the second member 42 (for example, one portion of a first part 421 which is described later) is disposed at the outer side than one portion of the first member 41 (for example, the first part 411).

The second member 42 is a movable member. For example, the second member 42 may be movable by an operation of a driving apparatus 451 which is controlled by the controller 91. The driving apparatus 451 may be fixed to the apparatus frame 38 via a support member 453. However, the support member 453 may not be equipped. The driving apparatus 451 may include a motor and the like, for example. For example, a mover (not illustrated) of the driving apparatus 451 may be connected to a support member 452 and a stator of the driving apparatus 451 may be connected to the apparatus frame 38. At least one portion of reaction force which is generated by a movement of the second member 42 by the driving apparatus 451 may be transmitted to the apparatus frame 38. If the apparatus frame 38 vibrates due to the reaction force which is generated by the movement of the second member 42, the vibration isolator 39 allows the projection optical system 3 not to be affected thereby. Moreover, the driving apparatus 451 may include a mechanism which cancels at least one portion of the reaction force which is generated by the movement of the second member 42. For example, a mechanism which is same as a counter-mass type of reaction force cancelling mechanism which is included in the driving system 82 of the substrate stage 5 may be applied to the driving apparatus 451.

The driving apparatus 451 may moves the support member 452 whose one edge is connected to the second member 42 and whose other edge is connected to the driving apparatus 451. The second member 42 which is connected to the support member 452 may move by the movement of the support member 452.

The second member 42 moves along each of the X axis direction and the Y axis direction. Namely, the second member 42 moves along a direction which is perpendicular to the optical axis AX (namely, in any direction in the XY plane). Moreover, "the movement of the second member 42 along a predetermined direction" includes both or one of "the movement of the second member 42 only along the predetermined direction" and "the movement of the second member 42 along any direction including a directional component along the predetermined direction".

The second member 42 may be movable relative to the terminal optical element 31 which is substantially fixed. A relative position between the terminal optical element 31 and the second member 42 is changed by the movement of the second member 42.

The second member is movable at the outer side than the optical path AT.

The second member 42 may be movable relative to the first member 41. A relative position between the first member 41 and the second member 42 is changed by the movement of the second member 42.

At least one portion of the second member 42 is movable above the first member 41. At least one portion of the second member 42 is movable at the outside than the first member 41. At least one portion of the second member 42 is movable above the substrate 51.

The second member 42 may move in a state where the liquid immersion space LS is formed. For example, the second member 42 may move in a state where the gap between the emitting surface 32 and the substrate 51 is filled with the liquid LQ. However, the second member 42 may move in a state where the liquid immersion space LS is not formed.

The second member 42 includes the first part 421 and the second part 422.

One portion of the first part 421 faces one portion of the substrate 52 via the space SP1 which can be one portion of the liquid immersion space LS. The first part 421 is disposed at the outer side than one portion of the first member 41 (for example, the first part 411). The first part 421 is disposed at the outer side than the second part 422.

A thickness (for example, a size along the Z axis direction) of the first part 421 is larger than a thickness of the first part 411. The first part 421 has a shape to serve as a rigid body when the second member 42 moves. For example, the first part 421 has a size (for example, both of or one of a length and the thickness) to serve as the rigid body when the second member 42 moves.

The first part 421 includes the lower surface 4211 and an inner side surface 4212.

The lower surface 4211 is a plane which faces the lower side. The lower surface 4211 faces one portion of the substrate 51 via the space SP1. The lower surface 4211 is disposed at the lower side and the outer side than the inner side surface 4212. The lower surface 4211 is a surface which is disposed at the outer side than one portion of the first member 41 (for example, the first part 411 including the lower surface 4111). The lower surface 4211 is parallel to the XY plane. The lower surface 4211 is disposed below the emitting surface 32. The lower surface 4211 has hydrophilic property with respect to the liquid LQ.

A distance along the Z axis direction between the lower surface 4211 and the substrate 51 is same as a distance along the Z axis direction between the lower surface 4111 and the substrate 51. The distance along the Z axis direction between the lower surface 4211 and the substrate 51 is smaller than a distance in the Z axis direction between the upper surface 4112 and the substrate 51. Namely, the lower surface 4211 is disposed below the upper surface 4112.

The inner side surface 4212 is a plane which faces the inner side. The inner side surface 4212 is parallel to the optical axis AX. The inner side surface 4212 is parallel to the outer side surface 4113. The inner side surface 4212 connects an inner edge of the lower surface 4211 and an outer edge of the lower surface 4221 which is described later. Therefore, a lower edge of the inner side surface 4212 corresponds to the inner edge of the lower surface 4211. An upper edge of the inner side surface 4212 corresponds to the outer edge of the lower surface 4221.

One portion of the inner side surface 4212 faces the outer side surface 4113 along the direction which is parallel to the XY plane. One portion of the inner side surface 4212 faces a gap (specifically, a space SP3) between the upper surface 4112 and the lower surface 4221 along the direction which is parallel to the XY plane.

The second member 42 moves so that the inner side surface 4212 does not contact the outer side surface 4113. Namely, the second member 42 moves so that a gap between the inner side surface 4212 and the outer side surface 4113 keeps being formed.

The second part 422 is disposed at the inner side than the first part 421.

One portion of the second part 422 is disposed in a gap which is surrounded by the first part 411, the second part 412 and the third part 413. As a result, undesired contact of the second member 42 with the terminal optical element 32 is prevented even if the second member 422 moves.

One portion of the second part 422 (for example, one portion of the lower surface 4221 which is described later) is disposed above one portion of the first member 41 (for example, one portion of the upper surface 4112). One portion of the second part 422 faces one portion of the first member 41 via the space SP3. Moreover, the second part 422 may include a part which is disposed or is not disposed above the first member 41 depending on the movement of the second member 42.

The second part 422 includes the lower surface 4221 and an inner side surface 4222.

The lower surface 4221 is a plane which faces the lower side. The lower surface 4221 is disposed below the inner side surface 4222. The lower surface 4221 is parallel to the upper surface 4112. The lower surface 4221 is parallel to the XY plane.

One portion of the lower surface 4221 faces one portion of the upper surface 4112 via the space SP3. The second member 42 moves so that one portion of the lower surface 4221 keeps being disposed above the upper surface 4112. The second member 42 moves so that the space SP3 between one portion of the lower surface 4221 and one portion of the upper surface 4112 keeps being formed. Moreover, the lower surface 4221 may include a part which is disposed or is not disposed above one portion of the upper surface 4112 depending on the movement of the second member 42

A distance along the Z axis direction between the lower surface 4221 and the substrate 51 is larger than the distance in the Z axis direction between the lower surface 4211 and the substrate 51. Namely, the lower surface 4221 is disposed above the lower surface 4211.

A size of the space SP3 along the Z axis direction between the lower surface 4221 and the upper surface 4112 is a size which allows the liquid LQ to infiltrate from the space SP1 to the space SP3 due to capillary action. For example, the size of the space SP3 along the Z axis direction may be any size within a range of 0.2 mm to 1.0 mm.

The lower surface 4221 has hydrophilic property with respect to the liquid LQ. However, the lower surface 4221 may have liquid repellent property against the liquid LQ.

The inner side surface 4222 is a plane which faces the inner side. The inner side surface 4222 faces one portion of the outer side surface 4122. The inner side surface 4222 is parallel to the outer side surface 4122. The inner side surface 4222 extends upwardly and outwardly from its lower edge. A lower edge of the inner side surface 4222 corresponds to an inner edge of the lower surface 4221. The inner side surface 4222 extends upwardly from the inner edge of the lower surface 4221.

The second member 42 moves so that the inner side surface 4222 does not contact the outer side surface 4122. The second member 42 moves so that a gap between the inner side surface 4222 and the outer side surface 4122 keeps being formed.

The second member 42 further includes a circular opening 425 through which the exposure light EL from the emitting surface 32 is allowed to pass. The opening 425 is defined by the lower edge of the inner side surface 4222. The lower surface 4221 is disposed around the opening 425. One portion of the first member 41 is disposed in the opening 425. When the second member 42 is located so that a center of the opening 425 coincides with the optical axis AX, an inner rim of the lower surface 4221 faces an outer rim of the upper surface 4112 and thus the annular (loop-like) space SP3 is formed, as illustrated in FIG. 2.

A radius and an area of the opening 425 along the XY plane are larger than the radius and the area of the opening 415.

In the description above, the second member 42 includes the first part 421 and the second part 422, for the purpose of simple description, However, the second member 42 may not define at least one of the first part 421 and the second part 422.

The liquid immersion member 4A further includes a liquid supply port 431, a liquid supply port 432, a fluid recovery port 441 and a fluid recovery port 442. Hereinafter, the liquid supply port 431, the liquid supply port 432, the fluid recovery port 441 and the fluid recovery port 442 will be described in order.

Firstly, the liquid supply port 431 will be described.

The liquid supply ports 431 supplies the liquid LQ to form the liquid immersion space LS. The liquid supply port 431 is formed at the inner side surface 4121. The liquid supply port 431 is formed to face the space SP2. The liquid supply port 431 is formed to face an optical path space SPK and may not face the outer surface 33.

The liquid supply port 431 is formed to discretely distribute around the terminal optical element 31 (in other words, around the optical path AT). For example, a plurality of liquid supply ports 431 may be formed at equal spaces or randomly along a virtual circle which is defined on the inner side surface 4121 (for example, a virtual circle around the center of the opening 415).

The liquid LQ which is clean and whose temperature is adjusted is supplied to the liquid supply port 431 via a liquid supply path, under the control of the controller 91. The liquid supply port 431 supplies the liquid LQ to the space SP2. At least one portion of the liquid LQ which is supplied to the space SP2 from the liquid supply port 431 is supplied to the optical path space SPK including the optical path ATL, and the optical path ATL is filled with the liquid LQ.

At least one portion of the liquid LQ which is supplied to the space SP2 from the liquid supply port 431 may be supplied to the space SP1 via the opening 415. At least one portion of the liquid LQ which is supplied to the space SP2 from the liquid supply port 431 may be supplied to the space SP3 via the opening 415.

Next, the liquid supply port 432 will be described.

The liquid supply ports 432 supplies the liquid LQ to form the liquid immersion space LS. The liquid supply port 432 is formed at the lower surface 4211. The liquid supply port 432 is formed to face the space SP1. The liquid supply port 432 is formed to face the substrate 51.

The liquid supply port 432 is formed to discretely distribute around the terminal optical element 31 (in other words, around the optical path AT of the exposure light EL). For example, a plurality of liquid supply ports 432 may be formed at equal spaces or randomly along a virtual circle which is defined on the lower surface 4211 (for example, a virtual circle around the center of the opening 425), as illustrated in FIG. 3.

The liquid LQ which is clean and whose temperature is adjusted is supplied to the liquid supply port 432 via a liquid supply path which is same as or different from the liquid supply path which supplies the liquid LQ to the liquid supply port 431, under the control of the controller 91. The liquid supply port 432 supplies the liquid LQ to the space SP1. At least one portion of the liquid LQ which is supplied to the space SP1 from the liquid supply port 432 is supplied to the space SP3.

Next, the fluid recovery port 441 will be described.

The fluid recovery port 441 recovers the liquid LQ from the liquid immersion space LS (especially, the space SP1). The fluid recovery port 441 is formed at the outer side of the lower surface 4211. The fluid recovery port 441 is formed at the rim of the lower surface 4211. The fluid recovery port 441 is formed to face the space SP1. The fluid recovery port 441 is formed to face the substrate 51 via the space SP1. Moreover, the lower surface of the first part 421 which is at the outer side than the fluid recovery port 441 (the lower surface around the fluid recovery port 441) has liquid repellent property against the liquid LQ.

The fluid recovery port 441 is disposed at the outer side than the liquid supply port 432.

The fluid recovery port 441 is formed to continuously distribute around the terminal optical element 31 (in other words, around the optical path AT). For example, the fluid recovery port 441 may be formed to continuously distribute along a virtual circle which is defined on the lower surface 4211 (for example, a virtual circle around the center of the opening 425).

A porous member 4411 such as a mesh plate or the like is disposed at the fluid recovery port 441. The porous member 4411 includes a lower surface which faces the upper surface of the substrate 51, an upper surface which faces a fluid recovery path, and a plurality of holes which connect the lower surface and the upper surface. The fluid recovery port 441 recoveries the liquid LQ from the liquid immersion space LS (especially, the space SP1) via the porous member 4411. However, the porous member 4411 may not be disposed at the fluid recovery port 441. Moreover, one of the plurality of holes of the porous member 4411 may be referred to as the fluid recovery port 441.

The liquid LQ is recovered from the fluid recovery port 441 via the porous member 4411 disposed at the fluid recovery port 441, under the control of the controller 91. For example, a difference between a pressure at the upper surface side of the porous member 4411 and a pressure at the lower surface side of the porous member 4411 may be adjusted under the control of the controller 91 and thus the liquid LQ is recovered from the fluid recovery port 441.

Next, the fluid recovery port 442 will be described.

The fluid recovery port 442 recovers the liquid LQ from the liquid immersion space LS (especially, the space SP3). The fluid recovery port 442 is formed at the lower surface 4221. The fluid recovery port 442 is formed to face the space SP3. The fluid recovery port 442 is formed to face the upper surface 4112 via the space SP3.

The second member 42 moves so that the fluid recovery port 442 keeps facing the space SP3. The second member moves so that the fluid recovery port 442 keeps facing the upper surface 4112.

The fluid recovery port 442 is formed at the inner side than the fluid recovery port 441 which is formed at the second member 42. The fluid recovery port 442 is formed at a position which is at the relatively inner side of the lower surface 4221.

The fluid recovery port 442 is formed to continuously distribute around the terminal optical element 31 (in other words, around the optical path AT of the exposure light EL). For example, the fluid recovery port 442 may be formed to continuously distribute along a virtual circle which is defined on the lower surface 4221 (for example, a virtual circle around the center of the opening 425). The fluid recovery port 442 may be formed at the lower surface 4221 along the opening 425.

The liquid LQ is recovered from the fluid recovery port 442, under the control of the controller 91.

According to the above described liquid immersion member 4A in the first embodiment, at least one portion of the second member 42 faces the liquid immersion space LS, and thus the movement of the second member 42 possibly causes a variation of a pressure of the liquid LQ in the liquid immersion space LS. However, in the first embodiment, the second member 42 moves at the outer side than the first member 41, and thus the variation of the pressure of the liquid LQ in the liquid immersion space LS which is caused by the movement of the second member 42 is not transmitted to the terminal optical element 31 easily.

According to the liquid immersion member 4A in the first embodiment, the inner side surface 4212 faces the inner side, and thus a part of the inner side surface 4212 which moves to be close to the optical path AT moves to push away the liquid LQ in the liquid immersion space LS. However, in the liquid immersion member 4A in the first embodiment, the inner side surface 4212 is disposed at the outer side than the first part 411, and thus the variation of the pressure of the liquid LQ in the liquid immersion space LS which is caused by the movement of the inner side surface 4212 is not transmitted to the terminal optical element 31 easily.

Moreover, the size of the inner side surface 4212 along the optical axis AX is several millimeters, for example and the area of the inner side surface 4212 is relatively small, and thus the pressure of the liquid LQ in the liquid immersion space LS does not vary easily due to the movement of the inner side surface 4212.

Moreover, at least one portion of the liquid LQ between the first member 41 (for example, the outer side surface 4113) and the second member 42 (for example, the inner side surface 4212) possibly infiltrates into the space SP3. Thus, the variation of the pressure of the liquid LQ in the liquid immersion space LS which is caused by the movement of the inner side surface 4212 is likely canceled by the infiltration of the liquid LQ into the space SP3. Therefore, the variation of the pressure of the liquid LQ in the liquid immersion space LS which is caused by the movement of the second member 42 is not transmitted to the terminal optical element 31 easily.

As described above, in the liquid immersion member 4A in the first embodiment, the variation of the pressure of the liquid LQ in the liquid immersion space LS which is caused by the movement of the second member 42 is not transmitted to the terminal optical element 31 easily. Therefore, the variation of the pressure of the liquid LQ in the liquid immersion space LS which affects the terminal optical element 31 can be appropriately suppressed. As a result, a shift of the terminal optical element 31 can be appropriately suppressed.

According to the liquid immersion member 4A in the first embodiment, one portion of interfaces LG of the liquid LQ in the liquid immersion space LS is formed between the second member 42 and the substrate 51. Hereinafter, the interface LG formed between the second member 42 and the substrate 51 is referred to as an "interface LG1". In the liquid immersion member 4A in the first embodiment, the fluid recovery port 441 recovers the liquid LQ in parallel with the supply of the liquid LQ from the liquid supply port 432, and the interface LG1 is formed between the upper surface of the substrate 51 and at least one of the lower surface 4211 and the lower surface of the porous member 4411.

One portion of interfaces LG of the liquid LQ in the liquid immersion space LS is formed between the terminal optical element 31 and the first member 41. Hereinafter, the interface LG formed between the terminal optical element 31 and the first member 41 is referred to as an "interface LG2".

One portion of interfaces LG of the liquid LQ in the liquid immersion space LS is formed between the first member 41 and the second member 42. Hereinafter, the interface LG formed between the first member 41 and the second member 42 is referred to as an "interface LG3". For example, the interface LG3 is formed between the lower surface 4221 and the upper surface 4112. In the liquid immersion member 4A in the first embodiment, the liquid LQ is recovered (removed) from the space SP3 via the fluid recovery port 442, and thus there is little or no liquid LQ in a space between the outer side surface 4122 and the inner side surface 4222. As a result, the space between the outer side surface 4122 and the inner side surface 4222 is a gas space. Thus, the second member 42 is movable relatively smoothly. Moreover, the liquid LQ in the space SP3 between the lower surface 4221 and the upper surface 4112 may be used as a squeeze film damper bearing. In this case, the second member 42 is movable more smoothly.

The liquid immersion member 4A which is described with reference to FIG. 2 and FIG. 3 is one example. Therefore, the structure of one portion of the liquid immersion member 4A may be appropriately modified. Hereinafter, examples of the modification of the structure of one portion of the liquid immersion member 4A will be described.

The first member 41 may not have the shape to surround both of or one of the optical path AT and the terminal optical element 31. For example, the first member 41 may have a shape (for example, an opened loop shape one portion of which is opened) by which the first member 41 is disposed at one portion of a space around both of or one of the optical path AT and the terminal optical element 31 and is not disposed at another one portion of the space around both of or one of the optical path AT and the terminal optical element 31.

The first member 41 may be supported by the apparatus frame 38 via a vibration isolator which is disposed between the support member and the apparatus frame 38, in addition to the above described support member. In this case, the vibration isolator may include a spring apparatus, as with the above described vibration isolator 39.

At least one portion of the first member 41 may be a movable member which is movable by an operation of a driving apparatus (for example, an actuator) which is controlled by the controller 91. The driving apparatus moves the support member which supports the first member 41 and thus moves at least one portion of the first member 41. The driving apparatus may be disposed between the apparatus frame 38 and the support member which supports the first member 41. Moreover, the vibration isolator may be disposed between the apparatus frame and the support member which supports the first member 41 and the vibration isolator may be equipped with a driving mechanism.

The first part 411 may have any shape which is different from the plate-like (in other words, board-like) shape.

One portion of the lower surface 4111 may not be disposed below both of or one of the upper surface 4112 and the outer side surface 4113. For example, one portion of the lower surface 4111 may be disposed above both of or one of the upper surface 4112 and the outer side surface 4113. At least one portion of the lower surface 4111 may not be disposed below the emitting surface 32. For example, at least one portion of the lower surface 4111 may be disposed above the emitting surface 32. At least one portion of the lower surface 4111 may be inclined with respect to the XY plane. At least one portion of the lower surface 4111 may be a curved surface.

One portion of the upper surface 4112 may not be disposed above the outer side surface 4113. For example, one portion of the upper surface 4112 may be disposed below the outer side surface 4113. At least one portion of the upper surface 4112 may be inclined with respect to the XY plane. At least one portion of the upper surface 4112 may be a curved surface. At least one portion of the upper surface 4112 may have hydrophilic property with respect to the liquid LQ.

At least one portion of the outer side surface 4113 may be inclined with respect to the optical axis AX. At least one portion of the outer side surface 4113 may be a curved surface. Moreover, another example of the shape of the outer side surface 4113 (namely, an example of the shape which is different from the shape illustrated in FIG. 2 and FIG. 3) will be described later in detail (refer to FIG. 19 and the like).

At least one portion of the inner side surface 4121 may be inclined with respect to the outer surface 33. The inner side surface 4121 may include a surface which is inclined with respect to the optical axis AX by a first degree and a surface which is inclined with respect to the optical axis AX by a second degree. At least one portion of the inner side surface 4121 may be parallel to the XY plane. At least one portion of the inner side surface 4121 may be parallel to the optical axis AX. At least one portion of the inner side surface 4121 may be a curved surface.

At least one portion of the outer side surface 4122 may be inclined with respect to the inner side surface 4121. The outer side surface 4122 may include a surface which is inclined with respect to the optical axis AX by a first degree and a surface which is inclined with respect to the optical axis AX by a second degree. At least one portion of the outer side surface 4122 may be parallel to the XY plane. At least one portion of the outer side surface 4122 may be parallel to the optical axis AX. At least one portion of the outer side surface 4122 may be a curved surface.

The third part 413 may have any shape which is different from the plate-like (in other words, board-like) shape. The third part 413 may not be related to the formation of the liquid immersion space LS.

At least one portion of both of or one of the upper surface 4131 and the lower surface 4132 may be inclined with respect to the XY plane. At least one portion of both of or one of the upper surface 4131 and the lower surface 4132 may be a curved surface. At least one portion of the upper surface 4131 may have hydrophilic property with respect to the liquid LQ.

The first member 41 may not include the third part 413 (the upper surface 4131 and the lower surface 4132).

The center of the opening 415 may not coincide with the optical axis AX. The center of the opening 415 may not coincide with the center of the emitting surface 32. The radius and the area of the opening 415 along the XY plane may be larger than or same as the radius and the area of the emitting surface 32.

The shape of the opening 415 on the XY plane may be any shape (for example, a polygonal shape, an oval shape, or any shape which hardly or never prevent the exposure light EL from passing through smoothly) which is different from the circular shape. The shape of each surface (for example, the lower surface 4111, the upper surface 4112, the inner side surface 4113, the inner side surface 4121, the outer side surface 4122, the upper surface 4131 and the lower surface 4132) or each edge (for example, the outer edge, the inner edge, the upper edge and the lower edge) of the first member 41 on the XY plane may be the circular shape or any shape which is different from the circular shape.

The second member 42 may not have the shape to surround the optical path AT. For example, the second member 42 may have a shape (for example, an opened loop shape one portion of which is opened) by which the second member 42 is disposed at one portion of a space around the optical path AT and is not disposed at another one portion of the space around the optical path AT.

The second member 42 may move along at least one of the X axis direction, the Y axis direction, the Z axis direction, the θX direction, the θY direction and the θZ direction, in addition to moving in each of the X axis direction and the Y axis direction.

One portion of the lower surface 4211 may not be disposed at the lower side and the outer side than the inner side surface 4212. For example, one portion of the lower surface 4211 may be disposed at the inner side than one portion of the inner side surface 4212. One portion of the lower surface 4211 may be disposed above one portion of the inner side surface 4212. At least one portion of the lower surface 4211 may not be disposed below the emitting surface 32. For example, at least one portion of the lower surface 4211 may be disposed above the emitting surface 32. At least one portion of the lower surface 4211 may be inclined with respect to the XY plane. For example, the lower surface 4211 may be inclined to extend upwardly and outwardly from its inner edge. Moreover, a position of the lower surface 4211 (for example, the fluid recovery port 441) along the Z axis may not same around the opening 425. For example, one portion of the lower surface 4211 (the fluid recovery port 441) disposed at the Y axis direction side viewed from the opening 425 may be disposed below another one portion of the lower surface 4211 (the fluid recovery port 441) disposed at the X axis direction side viewed from the opening 425. Moreover, at least one portion of the lower surface 4211 may be a curved surface. At least one portion of the lower surface 4211 may have liquid repellent property against the liquid LQ.

The distance along the Z axis direction between the lower surface 4211 and the substrate 51 may not be same as the distance along the Z axis direction between the lower surface 4111 and the substrate 51. Moreover, another example of a relation between the distance along the Z axis direction between the lower surface 4211 and the substrate 51 and the distance along the Z axis direction between the lower surface 4111 and the substrate 51 (namely, an example of the relation which is different from the relation illustrated in FIG. 2) will be described later in detail (refer to FIG. 22 and the like).

The distance along the Z axis direction between the lower surface 4211 and the substrate 51 may not be smaller than the distance along the Z axis direction between the upper surface 4112 and the substrate 51. In other words, the lower surface 4211 may not be disposed below the upper surface 4112. Moreover, another example of a relation between the distance along the Z axis direction between the lower surface 4211 and the substrate 51 and the distance along the Z axis direction between the upper surface 4112 and the substrate 51 (namely, an example of the relation which is different from the relation illustrated in FIG. 2) will be described later in detail (refer to FIG. 23 and the like).

The inner side surface 4212 may not face the outer side surface 4113 along the direction which is parallel to the XY plane. The inner side surface 4212 may not face the space SP3 along the direction which is parallel to the XY plane. At least one portion of the inner side surface 4212 may be inclined with respect to the optical axis AX. At least one portion of the inner side surface 4212 may be a curved surface. At least one portion of the inner side surface 4212 may be inclined with respect to one portion of the outer side surface 4113. Moreover, another example of the shape of the inner side surface 4212 (namely, an example of the shape which is different from the shape illustrated in FIG. 2 and FIG. 3) will be described later in detail (refer to FIG. 16 to FIG. 18 and the like).

One portion of the lower surface 4221 may not be disposed below the inner side surface 4222. For example, one portion of the lower surface 4221 may be disposed above one portion of the inner side surface 4222. At least one portion of the lower surface 4221 may be inclined with respect to the XY plane. At least one portion of the lower surface 4221 may be inclined with respect to (namely, may not be parallel to) the upper surface 4112. At least one portion of the lower surface 4221 may be a curved surface.

The distance along the Z axis direction between the lower surface 4221 and the substrate 51 may not be larger than the distance along the Z axis direction between the lower surface 4211 and the substrate 51. Namely, the lower surface 4221 may not be disposed above the lower surface 4211. The size of the space SP3 along the Z axis direction may be smaller or larger than the size which allows the liquid LQ to infiltrate from the space SP1 to the space SP3 due to the capillary action. Moreover, another example of a relation between the distance along the Z axis direction between the lower surface 4221 and the substrate 51 and the distance along the Z axis direction between the lower surface 4211 and the substrate 51 (namely, an example of the relation which is different from the relation illustrated in FIG. 2) will be described later in detail (refer to FIG. 20 to FIG. 21 and the like).

At least one portion of the inner side surface 4222 may be inclined with respect to the outer side surface 4122. The inner side surface 4222 may include a surface which is inclined with respect to the Z axis by a first degree and a surface which is inclined with respect to the Z axis by a second degree. At least one portion of the inner side surface 4222 may be a curved surface.

The shape of the opening 425 on the XY plane may be any shape (for example, a polygonal shape, an oval shape, or any shape which hardly or never prevent the exposure light EL from passing through smoothly) which is different from the circular shape. The shape of each surface (for example, the lower surface 4211, the inner side surface 4212, the lower surface 4221 and the inner side surface 4222) or each edge (for example, the outer edge, the inner edge, the upper edge and the lower edge) of the second member 42 on the XY plane may be the circular shape or any shape which is different from the circular shape.

The liquid supply port 431 may be formed to continuously distribute around the terminal optical element 31. Single liquid supply port 431 may be formed instead of the plurality of liquid supply ports 431. The liquid supply port 431 may be formed at any surface of the first member 41 which possibly faces the liquid immersion space LS, in addition to or instead of the inner side surface 4121. Moreover, another example of a position at which the liquid supply port 431 is formed (namely, an example of the forming position which is different from the forming position illustrated in FIG. 2) is formed will be described later in detail (refer to FIG. 12 and the like).

The liquid supply port 432 may be formed to continuously distribute around the terminal optical element 31. Single liquid supply port 432 may be formed instead of the plurality of liquid supply ports 432. The liquid supply port 432 may be formed at any surface of the second member 42 which possibly faces the liquid immersion space LS, in addition to or instead of the lower surface 4211. Moreover, another example of a position at which the liquid supply port 432 is formed (namely, an example of the forming position which is different from the forming position illustrated in FIG. 2) is formed will be described later in detail (refer to FIG. 13 to FIG. 14 and the like).

A characteristic (for example, both of or one of a temperature and type) of the liquid LQ which is supplied from the liquid supply port 432 may be same as a characteristic of the liquid LQ which is supplied from the liquid supply port 431. The characteristic of the liquid LQ which is supplied from the liquid supply port 432 may be different from the characteristic of the liquid LQ which is supplied from the liquid supply port 431.

The liquid immersion member 4A may not include the liquid supply port 432 which is formed at the second member 42. Namely, the liquid supply port 432 may not be formed at the second member 42.

At least one portion of the lower surface of the porous member 4411 may be disposed above the lower surface 4211. At least one portion of the lower surface of the porous member 4411 may be disposed below the lower surface 4211. At least one portion of the lower surface of the porous member 4411 may be disposed at a same height as the lower surface 4211.

The lower surface of the porous member 4411 may be parallel to the lower surface 4211. However, at least one portion of the lower surface of the porous member 4411 may be inclined with respect to the lower surface 4211. The lower surface of the porous member 4411 may be a planar surface. At least one portion of the lower surface of the porous member 4411 may be a curved surface.

The fluid recovery port 442 may be formed at any position of the lower surface 4221 of the second member 42. Moreover, a fluid recovery port which recovers the liquid LQ from the space SP3 may be formed at the upper surface 4112 of the first member 41, in addition to or instead of the fluid recovery port 442.

A porous member 4421 such as the mesh plate or the like may be disposed at the fluid recovery port 442, as with the fluid recovery port 441.

The second member 42 may move so that there is a period during which one portion of the fluid recovery port 442 does not face the space SP3. The second member 42 may move so that there is a period during which one portion of the fluid recovery port 442 does not face the upper surface 4112.

Both of or one of the fluid recovery ports 441 and 442 may be formed to discretely distribute around the terminal optical element 31. For example, a plurality of fluid recovery ports 441 may be formed at equal spaces or randomly along a virtual circle which is defined on the lower surface 4211 (for example, a virtual circle around the center of the opening 425). For example, a plurality of fluid recovery ports 442 may be formed at equal spaces or randomly along a virtual circle which is defined on the lower surface 4221 (for example, a virtual circle around the center of the opening 425). Single fluid recovery port 441 may be formed instead of the plurality of fluid recovery ports 441. Single fluid recovery port 442 may be formed instead of the plurality of fluid recovery ports 442.

Both of or one of the fluid recovery ports 441 and 442 may recover the liquid LQ and may not recover gas. One example of the technology by which the fluid recovery port at which the porous member is disposed recovers the liquid LQ and does not recover the gas is disclosed in U.S. Pat. No. 7,292,313, for example. However, both of or one of the fluid recovery ports 441 and 442 may recover both of the liquid LQ and the gas.

The supply of the liquid LQ from both of or one of the liquid supply ports 431 and 432 may be performed in parallel with the recovery of the liquid LQ from both of or one of the fluid recovery ports 441 and 442. However, all of the supply of the liquid LQ from both of or one of the liquid supply ports 431 and 432 and the recovery of the liquid LQ from both of or one of the fluid recovery ports 441 and 442 may not be performed in parallel with one another.

The second member 42 may move in at least one portion of a period during which the liquid supply port 431 supplies the liquid LQ. The second member 42 may move in at least one portion of a period during which the liquid supply port 431 does not supply the liquid LQ. The second member 42 may move in at least one portion of a period during which the liquid supply port 432 supplies the liquid LQ. The second member 42 may move in at least one portion of a period during which the liquid supply port 432 does not supply the liquid LQ. The second member 42 may move in at least one portion of a period during which the fluid recovery port 441 recovers the liquid LQ. However, the second member 42 may move in at least one portion of a period during which the fluid recovery port 441 does not recover the liquid LQ. The second member 42 may move in at least one portion of a period during which the fluid recovery port 442 recovers the liquid LQ. However, the second member 42 may move in at least one portion of a period during which the fluid recovery port 442 does not recover the liquid LQ.

The lower surface 4111 of the first member 41 does not recover the liquid LQ. Therefore, the lower surface 4111 is configured to maintain the liquid LQ in a space between the lower surface 4111 and the substrate 51. The inner side surface 4121, the upper surface 4112 and the outer side surface 4113 of the first member 41 also do not recover the liquid LQ.

The lower surface 4211 of the second member 42 does not recover the liquid LQ. Therefore, the lower surface 4211 is configured to maintain the liquid LQ in a space between the lower surface 4211 and the substrate 51. The lower surface 4221 of the second member 42 also does not recover the liquid LQ. Therefore, the lower surface 4221 is configured to maintain the liquid LQ in a space between the lower surface 4221 and both of or one of the substrate 51 and the upper surface 4112. The inner side surface 4212 of the second member 42 also do not recover the liquid LQ.

(1-2-2) Specific Example of Moving Aspect of Second Member of Liquid Immersion Member Next, with reference to FIG. 4 and FIG. 5, a specific example of moving aspect of the second member 42 will be described. FIG. 4 is a cross-sectional view illustrating a first specific example of the moving aspect of the second member 42. FIG. 5 is a cross-sectional view illustrating a second specific example of the moving aspect of the second member 42. Moreover, in FIG. 4 and FIG. 5, one portion of the components of the liquid immersion member 4A illustrated in FIG. 2 will be omitted for the purpose of simple description.

In the first embodiment, the second member 42 moves on the basis of a moving aspect of the substrate 51. In other words, the second member 42 moves in accordance with the moving aspect which is determined on the basis of the moving aspect (for example, at least one of a moving direction, a moving speed, an acceleration rate and a moving distance) of the substrate 51. However, the second member 42 may move independently from the movement of the substrate 51.

For example, the second member 42 may move so that an absolute value of a relative speed of the substrate 51 with respect to the second member 42 decreases. The second member 42 may move so that the absolute value of the relative speed of the substrate 51 with respect to the second member 42 decreases compared to the case where the second member 42 does not move.

For example, the second member 42 may move so that an absolute value of a relative acceleration rate of the substrate 51 with respect to the second member 42 decreases. The second member 42 may move so that the absolute value of the relative acceleration rate of the substrate 51 with respect to the second member 42 decreases compared to the case where the second member 42 does not move.

As described above, the second member 42 moves by the operation of the driving apparatus 451 which is controlled by the controller 91. Therefore, the below described movement of the second member 42 is realized by the control of the controller 91.

The relative speed of the substrate 51 with respect to the second member 42 in the case where the second member 42 does not move is substantially same as the relative speed of the substrate 51 with respect to the first member 41. Therefore, the second member 42 may move so that the absolute value of the relative speed of the substrate 51 with respect to the second member 42 is smaller than the absolute value of the relative speed of the substrate 51 with respect to the first member 41. The same is true of the relative acceleration rate, and the second member 42 may move so that the absolute value of the relative acceleration rate of the substrate 51 with respect to the second member 42 is smaller than the absolute value of the relative acceleration rate of the substrate 51 with respect to the first member 41.

The second member 42 may move in (toward) a direction which is same as a direction in which the substrate 51 moves, in order to decrease both of or one of the relative speed and relative acceleration rate of the substrate 51 with respect to the second member 42.

For example, as illustrated in FIG. 4, when the substrate 51 moves in +X axis direction, the second member 42 may move in +X axis direction. Here, it is assumed that the moving speed of the substrate 51 along the X axis direction is +V51 and the moving speed of the second member 42 along the X axis direction is +V42. The absolute value of the relative speed of the substrate 51 with respect to the second member 42 in the case where the second member 42 does not move is |V51|. On the other hand, the absolute value of the relative speed of the substrate 51 with respect to the second member 42 in the case where the second member 42 moves is |V51−V42| (<|V51|). Therefore, the relative speed of the substrate 51 with respect to the second member 42 in the case where the second member 42 moves decreases, compared to the case where the second member 42 does not move. Moreover, the same is true of the relative acceleration rate of the substrate 51 with respect to the second member 42, as with the relative speed of the substrate 51 with respect to the second member 42.

For example, as illustrated in FIG. 5, when the substrate 51 moves in −X axis direction, the second member 42 may move in −X axis direction. Here, it is assumed that the moving speed of the substrate 51 along the X axis direction is −V51 and the moving speed of the second member 42 along the X axis direction is −V42. The absolute value of the relative speed of the substrate 51 with respect to the second member 42 in the case where the second member 42 does not move is |−V51|. On the other hand, the absolute value of the relative speed of the substrate 51 with respect to the second member 42 in the case where the second member 42 moves is |−V51+V42| (<|−V51|). Therefore, the relative speed of the substrate 51 with respect to the second member 42 in the case where the second member 42 moves decreases, compared to the case where the second member 42 does not move. Moreover, the same is true of the relative acceleration rate of the substrate 51 with respect to the second member 42, as with the relative speed of the substrate 51 with respect to the second member 42.

When the substrate 51 moves in +Y axis direction, the second member 42 may move in +Y axis direction. When the substrate 51 moves in −Y axis direction, the second member 42 may move in −Y axis direction. When the substrate 51 moves in a predetermined direction in the XY plane, the second member 42 may move in the predetermined direction.

The second member 42 may move so that an absolute value of a speed component, which is along the moving direction of the substrate 51, of the relative speed of the substrate 51 with respect to the second member 42 decreases. The second member 42 may move so that the absolute value of the speed component, which is along the moving direction of the substrate 51, of the relative speed of the substrate 51 with respect to the second member 42 decreases compared to the case where the second member 42 does not move.

The second member 42 may move so that an absolute value of an acceleration component, which is along the moving direction of the substrate 51, of the relative acceleration rate of the substrate 51 with respect to the second member 42 decreases. The second member 42 may move so that the absolute value of the acceleration component, which is along the moving direction of the substrate 51, of the relative acceleration rate of the substrate 51 with respect to the second member 42 decreases compared to the case where the second member 42 does not move.

The second member 42 may further move in a direction which intersects with or is perpendicular to the moving direction of the substrate 51, while moving in a direction which is same as the moving direction of the substrate 51. Namely, the second member 42 may move in any direction in the XY plane which includes a component along the moving direction of the substrate 51, when the absolute value of both of or one of the relative speed and the relative acceleration rate of the substrate 51 with respect to the second member 42 is decreased. For example, when the substrate 51 moves in +X axis direction, the second member may move in +Y axis direction or −Y axis direction while moving in +X axis direction.

As described above, in the first embodiment, the second member 42 is movable to decrease the absolute value of both of or one of the relative speed and the relative acceleration rate of the substrate 51 with respect to the second member 42. Therefore, if the substrate 51 moves at a relatively high speed in a state where the liquid immersion space LS is formed, the liquid LQ which forms the liquid immersion space LS is suppressed from being divided on the substrate 51 and the divided liquid LQ is suppressed from remaining on the substrate 51 as residual water. Moreover, if the substrate 51 moves at the relatively high speed in the state where the liquid immersion space LS is formed, bubbles are suppressed from being generated in the liquid immersion space LS. Therefore, it is possible to suppress the occurrence of the exposure failure and the occurrence of the defective device.

(1-3) Method of Exposing Substrate 51 by Exposure Apparatus EX1

Next, with reference to FIG. 6 to FIG. 10, a method of exposing the substrate 51 by the exposure apparatus EX1 will be described.

The controller 91 firstly controls the driving system 82 so that the substrate stage 5 moves to a substrate exchange position which is away from the liquid immersion member 4A, prior to an exposure process in which the exposure apparatus EX1 exposes the substrate 51. Then, the controller 91 loads the unexposed substrate 51 on the substrate stage 5 which is located at the substrate exchange position (namely, controls a non-illustrated substrate loading apparatus to load the substrate 51).

While the substrate stage 5 is located at the substrate exchange position which is away from the liquid immersion member 4A, the controller 91 controls the driving system 82 so that the measurement stage 6 is disposed at a position which faces the terminal optical element 31 and the liquid immersion member 4A along the Z axis direction. Moreover, in a period during which the measurement stage 6 is disposed at the position which faces the terminal optical element 31 and the liquid immersion member 4A along the Z axis direction, the measurement element 61 which is hold by the measurement stage 6 may perform a measurement which receives the exposure light EL via the liquid LQ.

After the substrate stage 5 holds the unexposed substrate 51, the controller 91 moves the substrate state 5 on which the unexposed substrate 51 is loaded to the position which faces the terminal optical element 31 and the liquid immersion member 4A along the Z axis direction.

The liquid immersion space LS keeps being formed between the substrate stage 5 or the measurement stage 6 and the terminal optical element 31 while the above described process is performed.

Then, the controller 91 starts the exposure process of the substrate 51. Specifically, the illumination system 2 irradiates the mask 11 with the exposure light EL, under the control of the controller 91. The exposure light EL1 from the mask 11 is projected on the substrate 51 via the projection optical system 3 and the liquid immersion space LS. As a result, the image of the device pattern which is formed on the mask 11 is projected on the substrate 51 and the substrate 51 is exposed.

In the first embodiment, the exposure apparatus EX1 is a scanning type exposure apparatus (what we call a scanning stepper) which moves both of the mask 1 and the substrate 51 along a predetermined scanning direction (scan direction) in performing the exposure process. In the first embodiment, both of the scanning direction of the mask 11 and the scanning direction of the substrate 51 are the Y axis direction. Therefore, the controller 91 moves the substrate 51 along the Y axis direction with respect to the projection region PR on which the exposure light EL is projected. The controller 91 moves the mask 11 along the Y axis direction with respect to the illumination region IR which is irradiated with the exposure light EL.

Here, with reference to FIG. 6, the moving aspect of the substrate 51 will be described. FIG. 6 is a planar view illustrating one example of the substrate 51 which is hold by the substrate stage 51.

As illustrated in FIG. 6, a plurality of shot regions S are arranged in a matrix manner on the upper surface of the substrate 51. The shot region S is a region which is exposed by a single exposure process using the exposure light EL.

For example, when the exposure process of the single shot region S1 is performed, the controller 91 moves the substrate 51 along the Y axis direction with respect to the projection region PR on which the exposure light EL is projected, in a state where the liquid immersion space LS is formed on the shot region S1. Furthermore, the controller 91 moves the mask 11 along the Y axis direction with respect to the illumination region IR which is irradiated with the exposure light EL. In parallel with the movements of the substrate 51 and the mask 11, the illumination system 2 irradiates the mask 11 with the exposure light EL. As a result, the shot region S1 is exposed by the exposure light EL which is projected via the projection optical system 3 and the liquid immersion space LS.

When the shot region S1 reaches an exposure end position, the exposure process of the shot region S1 ends. After the exposure process of the shot region S1 ends, the operation which moves next shot region S2 to an exposure start position in order to start the exposure process of the next shot region S2 (for example, the shot region S2 which is adjacent to the shot region S1 at +X axis direction side). Specifically, the controller 91 moves the substrate 51 along the direction (for example, the X axis direction, or a direction which is inclined with respect to both of the X axis direction and the Y axis direction) which intersects with the Y axis direction, in a state where the liquid immersion space LS is formed. While the operation which moves the next shot region S2 to the exposure start position is performed, the illumination system 2 does not irradiate the mask 11 with the exposure light EL. When the next shot region S2 reaches the exposure start position, the exposure process of the shot region S2 starts in a same manner as the exposure process of the shot region S1. Then, same process is performed to the plurality of shot regions on the substrate 51.

In the description below, the operation which moves the substrate 51 along the Y axis direction so that the shot region S moves along the Y axis direction with respect to the projection region PR in order to perform the exposure process of the shot region S is referred to as a "scan movement operation". The scan movement operation may include an operation which moves the substrate 51 along the Y axis direction from a state where the shot region S is located at the exposure start position until a state where the shot region S is located at the exposure end position. The scan movement operation mainly includes an operation which moves the substrate 51 along the Y axis direction at a constant speed. However, the scan movement operation may include an operation which accelerates and/or decelerates the substrate 51 along the Y axis direction. Moreover, as described above, while the scan movement operation is performed, the illumination system 2 irradiates the mask 11 with the exposure light EL. While the scan movement operation is performed, the liquid immersion space LS may be formed or keep being formed.

On the other hand, the operation which moves the substrate 51 along the direction which intersects with the Y axis direction so that the next shot region S reaches the exposure start position in order to start the exposure process of the next shot region S after the exposure process of the previous shot region S ends is referred to as a "step movement operation". The step movement operation may include an operation which moves the substrate 51 along the direction which intersects with the Y axis direction from a state where the shot region S is located at the exposure end position until a state where the next shot region S is located at the exposure start position. The step movement operation mainly includes the operation which accelerates and/or decelerates the substrate 51 along the direction which intersects with the Y axis direction. For example, the step movement operation includes both of or one of an operation which accelerates and/or decelerates the substrate 51 along the X direction and an operation which accelerates and/or decelerates the substrate 51 along the Y direction. However, the step movement operation may include the operation which moves the substrate 51 along the direction which intersects with the Y axis direction at the constant speed. Moreover, as described above, while the step movement operation is performed, the illumination system 2 does not irradiate the mask 11 with the exposure light EL. While the step movement operation is performed, the liquid immersion space LS may be formed or keep being formed.

Moreover, the exposure start position may include a position of the shot region S (in other words, a position of the substrate 51) at a timing when a frond edge of the projection region PR passes one edge (for example, a rear edge along the moving direction of the short region S) of the shot region S along the Y axis. The exposure end position may include a position of the shot region S (in other words, a position of the substrate 51) at a timing when a rear edge of the projection region PR passes the other edge (for example, a front edge along the moving direction of the short region S) of the shot region S along the Y axis.

Moreover, in the description below, a period when the scan movement operation is performed to perform the exposure process of the shot region S is referred to as a "scan movement period". A period when the step movement operation is performed to start the exposure process of the next shot region S after the exposure process of the previous shot region S ends is referred to as a "step movement period".

The controller 91 repeats the scan movement operation and the step movement operation alternately. As a result, the exposure processes of the plurality of shot regions S on the substrate 51 are performed sequentially.

The controller 91 may move the substrate 51 on the basis of exposure conditions of the plurality of shot regions S in performing the exposure processes of the plurality of shot regions S. For example, the controller 91 may adjust moving condition (for example, at least one of the moving seed, the acceleration rate, moving distance, the moving direction and a moving track on the XY plane) on the basis of the exposure conditions of the plurality of shot regions S. For example, as illustrated in FIG. 6, the controller 91 may move the substrate 51 on the basis of the exposure condition so that the projection region PR moves relative to the substrate 51 along a moving track Sr.

The exposure conditions of the plurality of shot regions S are defined by exposure control information which is referred to as an exposure recipe, for example. The exposure control information is stored in the memory 92, for example. The exposure conditions which are defined by the exposure control information may include information of the arrangement of the plurality of shot regions S (for example, the position of each of the plurality of shot regions S). The exposure conditions which are defined by the exposure control information may include sizes of the plurality of shot regions S (for example, a length along the Y axis direction of each of the plurality of shot regions S).

As illustrated in FIG. 6, at least one portion of the liquid immersion space LS may be formed on the upper surface 52 in at least one portion of the scan movement period and the step movement period. At least one portion of the liquid immersion space LS may be formed over the substrate 51 and the upper surface 52 in at least one portion of the scan movement period and the step movement period. At least one portion of the liquid immersion space LS may be formed over the substrate stage 5 and the measurement stage 6 in at least one portion of the scan movement period and the step movement period, when the exposure process of the substrate 51 is performed in a state where the measurement stage 6 is adjacent to or contacts the substrate stage 5.

The second member 42 may move in at least one portion of the step movement period. The second member 42 may move in at least one portion of a period during which the illumination system 2 does not emit the exposure light EL (namely, the exposure light EL is not emitted from the terminal optical element 31). The second member 42 may move in at least one portion of a period during which the substrate 51 moves along the X axis direction. However, the second member 42 may not move in the step movement period. The second member 42 may not move in the period during which the illumination system 2 does not emit the exposure light EL. The second member 42 may not move in the period during which the substrate 51 moves along the X axis direction.

The second member 42 may move in at least one portion of the scan movement period. The second member 42 may move in at least one portion of a period during which the illumination system 2 emits the exposure light EL (namely, the exposure light EL is emitted from the terminal optical element 31). The second member 42 may move in at least one portion of a period during which the substrate 51 moves along the Y axis direction. However, the second member 42 may not move in the scan movement period. The second member 42 may not move in the period during which the illumination system 2 emits the exposure light EL. The second member 42 may not move in the period during which the substrate 51 moves along the Y axis direction.

Based on the above described moving aspect of the second member 42, one example of a relation between a specific moving aspect of the substrate 51 and a specific moving aspect of the second member 42 will be described with reference to FIG. 7 to FIG. 10. FIG. 7 is a planar view illustrating a moving track Sr of the projection region PR and a moving track Sr' of the second member 42. Each of FIG. 8 and FIG. 9 is a cross-sectional view illustrating the moving aspect of the second member 42 when the substrate 51 and the second member 42 move by the aspect illustrated in FIG. 7. FIG. 10 is a graph illustrating a moving speed of each of the substrate 51 and the second member 42 when the substrate 51 and the second member 42 move by an aspect illustrated in FIG. 7.

As illustrated in FIG. 7(*a*), an example in which the exposure process of two shot region S (namely, a shot regions Sa and Sb) which is adjacent to each other along the X axis direction will be described. In this case, the controller 91 moves the substrate 51 so that the projection region PR moves relative to the substrate 51 along the moving track Sr which is illustrated by a solid line.

Specifically, the controller 91 moves the substrate 51 so that the projection region PR moves relative to the substrate 51 along a track Tp1 from an edge position d1 at −Y axis direction side on the shot region Sa to an edge position d2 at +Y axis direction side on the shot region Sa. Namely, when the projection region PR moves relative to the substrate 51 along the track Tp1, the controller 91 performs the scan movement operation which moves the substrate 51 along the Y axis direction (for example, in −Y axis direction). Therefore, the shot region Sa is exposed while the projection region PR moves relative to the substrate 51 along the track Tp1.

Then, the controller 91 moves the substrate 51 so that the projection region PR moves relative to the substrate 51 along a track Tp2 from the edge position d2 on the shot region Sa to an edge position d3 at +Y axis direction side on the shot region Sb. Namely, when the projection region PR moves relative to the substrate 51 along the track Tp2, the controller 91 performs the step movement operation which moves the substrate 51 along the direction which intersects with the Y axis direction. The substrate 51 is not exposed while the projection region PR moves relative to the substrate 51 along the track Tp2. For example, in a period during which the projection region PR moves from the edge position d2 to an intermediate position d2.5 in FIG. 7(*a*), the controller 91 moves the substrate 51 in −X axis direction and −Y axis direction. Moreover, in a period during which the projection region PR moves from the intermediate position d2.5 to an edge position d3 in FIG. 7(*a*), the controller 91 moves the substrate 51 in −X axis direction and +Y axis direction.

Then, the controller 91 moves the substrate 51 so that the projection region PR moves relative to the substrate 51 along a track Tp3 from the edge position d3 on the shot region Sb to an edge position d4 at −Y axis direction side on the shot region Sb. Namely, when the projection region PR moves relative to the substrate 51 along the track Tp3, the controller 91 performs the scan movement operation which moves the substrate 51 along the Y axis direction (for example, in +Y axis direction). Therefore, the shot region Sb is exposed while the projection region PR moves relative to the substrate 51 along the track Tp3.

Then, the controller 91 moves the substrate 51 so that the projection region PR moves relative to the substrate 51 along a track Tp4 from the edge position d4 on the shot region Sb to an edge position d5 at −Y axis direction side on a shot region Sc. Namely, when the projection region PR moves relative to the substrate 51 along the track Tp4, the controller 91 performs the step movement operation which moves the substrate 51 along the direction which intersects with the Y axis direction. The substrate 51 is not exposed while the projection region PR moves relative to the substrate 51 along the track Tp4. For example, in a period during which the projection region PR moves from the edge position d4 to an intermediate position d4.5 in FIG. 7(*a*), the controller 91 moves the substrate 51 in −X axis direction and +Y axis direction. Moreover, in a period during which the projection region PR moves from the intermediate position d4.5 to an edge position d5 in FIG. 7(*a*), the controller 91 moves the substrate 51 in −X axis direction and −Y axis direction.

After the projection region PR reaches the edge position d5 on the shot region Sc, an operation which is same as the operation performed until the projection region PR reaches from the edge position d1 to the edge position d5.

When the substrate 51 moves by the aspect illustrated in FIG. 7(*a*), the second member 42 performs the movement including a directional component which is same as the moving direction of the substrate 51. For example, when the substrate 51 moves so that the projection region PR moves along the tracks Tp1, Tp2, Tp3 and Tp4 in order, the second member 42 moves along tracks Tp1', Tp2', Tp3' and Tp4' in order as illustrated in FIG. 7(*b*).

Specifically, the second member 42 moves along the track Tp1' from a position d1' to a position d2' while the scan movement operation which moves the projection region PR along the track Tp1 is performed.

The position d1' represents a relative position of a center of the second member 42 (for example, the center of the opening 425) with respect to the projection region PR when the projection region PR is located at the edge position d1. For example, the position d1' is a position which is away from the projection region PR in −X axis direction and +Y axis direction, as illustrated in FIG. 8(*a*).

The position d2' represents a relative position of the center of the second member 42 with respect to the projection region PR when the projection region PR is located at the edge position d2. For example, the position d2' is a position which is away from the projection region PR in +X axis direction and −Y axis direction, as illustrated in FIG. 8(*b*).

As illustrated in FIG. 7(*b*), the track Tp1' is a track including a component in −Y axis direction and a component in +X axis direction. The track Tp1' is a track along which the second member 42 moves in −Y axis direction while moving in +X axis direction. The track Tp1' is a track including a component in the moving direction of the substrate 51 in the scan movement operation and a component in opposition to the moving direction of the substrate 51 in the step movement operation.

Then, the second member 42 moves along the track Tp2' from the position d2' to a position d3' via a position d2.5' while the step movement operation which moves the projection region PR along the track Tp2 is performed.

The position d2.5' represents a relative position of the center of the second member 42 with respect to the projection region PR when the projection region PR is located at the edge position d2.5. For example, the position d2.5' is a position which is away from the projection region PR in −Y axis direction, as illustrated in FIG. 8(*c*).

The position d3' represents a relative position of the center of the second member 42 with respect to the projection region PR when the projection region PR is located at the edge position d3. For example, the position d3' is a position which is away from the projection region PR in −X axis direction and −Y axis direction, as illustrated in FIG. 8(*d*).

As illustrated in FIG. 7(*b*), the track Tp2' is a track including both of a track which includes a component in −Y axis direction and a component in −X axis direction and a track which includes a component in +Y axis direction and a component in −X axis direction. The track Tp2' is a track along which the second member 42 moves in −X axis direction while moving in −Y axis direction and then moves in −X axis direction while moving in +Y axis direction. The track Tp2' is a track along which the second member 42 moves in −X axis direction while reversing the moving direction along the Y axis direction. The track Tp2' is a track including a component in the moving direction of the substrate 51 in the step movement operation and a component along the moving direction of the substrate 51 in the scan movement operation.

However, the track Tp2' may be a track which does not include the component along the Y axis direction (namely, the component along the moving direction of the substrate 51 in the scan movement operation). Namely, the track Tp2' may be a track along which the second member 42 moves only in −X axis direction.

Then, the second member 42 moves along the track Tp3' from the position d3' to a position d4' while the scan movement operation which moves the projection region PR along the track Tp3 is performed.

The position d4' represents a relative position of the center of the second member 42 with respect to the projection region PR when the projection region PR is located at the edge position d4. For example, the position d4' is a position which is away from the projection region PR in +X axis direction and +Y axis direction, as illustrated in FIG. 9(*a*).

As illustrated in FIG. 7(*b*), the track Tp3' is a track including a component in +Y axis direction and a component in +X axis direction. The track Tp3' is a track along which the second member 42 moves in +Y axis direction while moving in +X axis direction. The track Tp3' is a track including a component in the moving direction of the substrate 51 in the scan movement operation and a component in opposition to the moving direction of the substrate 51 in the step movement operation.

Then, the second member 42 moves along the track Tp4' from the position d4' to a position d5' via a position d4.5' while the step movement operation which moves the projection region PR along the track Tp4 is performed.

The position d4.5' represents a relative position of the center of the second member 42 when the projection region PR is located at the edge position d4.5. For example, the position d4.5' is a position which is away from the projection region PR in +X axis direction, as illustrated in FIG. 9(*b*).

The position d5' represents a relative position of the center of the second member 42 when the projection region PR is located at the edge position d5. For example, the position d5' is a position which is away from the projection region PR in −X axis direction and +Y axis direction, as illustrated in FIG. 9(*c*). Moreover, a positional relationship between the projection region PR and the position d5' may be substantially same as a positional relationship between the projection region PR and the position d1'.

As illustrated in FIG. 7(*b*), the track Tp4' is a track including both of a track which includes a component in +Y axis direction and a component in −X axis direction and a track which includes a component in −Y axis direction and a component in −X axis direction. The track Tp4' is a track along which the second member 42 moves in −X axis direction while moving in +Y axis direction and then moves in −X axis direction while moving in −Y axis direction. The track Tp4' is a track along which the second member 42 moves in −X axis direction while reversing the moving direction along the Y axis direction. The track Tp4' is a track including a component in the moving direction of the substrate 51 in the step movement operation and a component along the moving direction of the substrate 51 in the scan movement operation.

However, the track Tp4' may be a track which does not include the component along the Y axis direction (namely, the component along the moving direction of the substrate 51 in the scan movement operation). Namely, the track Tp4' may be a track along which the second member 42 moves only in −X axis direction.

The second member 42, which moves along the tracks Tp1', Tp2', Tp3' and Tp4', substantially moves to draw an Arabic number "8", as illustrated in FIG. 7(b).

When the substrate 51 moves so that the projection region PR moves along the moving track Sr illustrated in FIG. 7(a) and the second member 42 moves along the moving track Sr' illustrated in FIG. 7(b), the moving speeds of the substrate 51 and the second member 42 vary in an aspect illustrated in FIG. 10. A first graph in FIG. 10 illustrates the moving speed of the substrate 51 along X axis direction. A second graph in FIG. 10 illustrates the moving speed of the substrate 51 along Y axis direction. A third graph in FIG. 10 illustrates the moving speed of the second member 42 along X axis direction. A fourth graph in FIG. 10 illustrates the moving speed of the second member 42 along Y axis direction.

Moreover, the graphs in FIG. 10 are examples, and the moving aspect of the substrate 51 illustrated in the first and second graphs in FIG. 10 may be changed appropriately. The moving aspect of the second member 42 illustrated in the third and fourth graphs in FIG. 10 may be also changed appropriately. Therefore, the second member 42 may moves along a track which is different from the track illustrated in FIG. 7(b).

For example, in the third graph in FIG. 10, although the variation of the absolute value of the moving speed in the scan movement period is same as the variation of the absolute value of the moving speed in the step movement period, they may be different from each other. For example, the second member 42 may be controlled to move along the X axis direction so that the maximum value of the absolute value of the moving speed in the scan movement period (for example, a movement period from the edge position d1' to the edge position d2') may be smaller than the maximum value of the absolute value of the moving speed in the step movement period (for example, a movement period from the edge position d2' to the edge position d3'). Moreover, the second member 42 may be controlled to move along the X axis direction so that the second member 42 moves along the X axis direction at the constant speed in at least one portion of the scan movement period (for example, a movement period from the edge position d1' to the edge position d2').

Moreover, in the fourth graph in FIG. 10, although the second member 42 moves along the Y axis direction at the constant speed in the scan movement period, the second member 42 may be controlled to move along the Y axis direction so that the moving speed varies in at least one portion of the scan movement period (for example, a movement period from the edge position d1' to the edge position d2'). For example, the second member 42 may be controlled to move along the Y axis direction in the scan movement period (for example, a movement period from the edge position d1' to the edge position d2') so that the second member 42 starts to move after the scan movement operation is started. The second member 42 starts to move along the Y axis direction at a timing when the projection region PR passes an intermediate position of the shot region S (for example, an intermediate position between the edge positions d1 and d2).

(1-4) Modified Example of Liquid Immersion Member 4A

Next, with reference to FIG. 11 to FIG. 23, various modified examples of the liquid immersion member 4A will be described. Same reference number is assigned to a component which is same as the component of the liquid immersion member 4A, and its detailed description will be omitted.

(1-4-1) First Modified Example

With reference to FIG. 11, a liquid immersion member 4Aa in a first modified example will be described. FIG. 11 is a cross-sectional view illustrating a structure of a first member 41a of the liquid immersion member 4Aa in the first modified example.

As illustrated in FIG. 11, in the first modified example, the first member 41a includes a liquid supply port 431a and a fluid recovery port 443a.

The liquid supply port 431a supplies the liquid LQ to the liquid immersion space LS (especially, the space SP2). The fluid recovery port 443a recovers the liquid LQ from the liquid immersion space LS (especially, the space SP2). The liquid supply port 431a and the fluid recovery port 443a are formed at the inner side surface 4121. The liquid supply port 431a and the fluid recovery port 443a are formed to face the space SP2. Moreover, both of or one of the liquid supply port 431a and the fluid recovery port 443a may be formed to face the optical path space SPK. The liquid supply port 431a is formed at one side of the optical axis AX and the fluid recovery port 443a is formed at the other side of the optical axis AX. In FIG. 11, the liquid supply port 431a is formed at −X axis direction side of the optical axis AX and the fluid recovery port 443a is formed at +X axis direction side of the optical axis AX. A height of the fluid recovery port 443a from the substrate 51 is same as a height of the liquid supply port 431a from the substrate 51.

Moreover, the liquid supply port 431a may be formed at −Y axis direction side of the optical axis AX and the fluid recovery port 443a may formed at +Y axis direction side of the optical axis AX. Moreover, the height of the fluid recovery port 443a from the substrate 51 may be different from the height of the liquid supply port 431a from the substrate 51.

A plurality of liquid supply ports 431a may be formed at the inner side surface 4121. For example, the plurality of liquid supply ports 431a may be formed at equal spaces or randomly along the XY plane. A plurality of fluid recovery ports 443a may be formed at the inner side surface 4121. For example, the plurality of fluid recovery ports 443a may be formed at equal spaces or randomly along the XY plane The liquid supply port 431a supplies the liquid LQ and the fluid recovery port 443a recovers the liquid LQ under the control of the controller 91. The fluid recovery port 443a may recover the liquid LQ and may not recover the gas. However, the fluid recovery port 443a may recover both of the liquid LQ and the gas.

The exposure apparatus EX1 including the liquid immersion member 4Aa in the first modified example is capable of achieving various effects which can be achieved by the exposure apparatus EX1 including the above described liquid immersion member 4A. For example, it is possible to suppress the occurrence of the exposure failure.

Moreover, the height of the fluid recovery port 443a from the substrate 51 may be larger or smaller than the height of the liquid supply port 431a from the substrate 51. A porous member may be disposed at the fluid recovery port 443a. Moreover, the porous member which is disposed at the fluid recovery port 443a may be same as the porous member 4411 which is disposed at the fluid recovery port 441.

The liquid immersion member 4A may also include a fluid recovery port at the lower surface 4111 of the first member 41. The liquid immersion member 4Aa may also include a fluid recovery port at the lower surface 4111 of the first member 41a.

(1-4-2) Second Modified Example

With reference to FIG. 12, a liquid immersion member 4Ab in a second modified example will be described. FIG. 12 is a cross-sectional view illustrating a structure of a first member 41b of the liquid immersion member 4Ab in the second modified example.

As illustrated in FIG. 12, in the second modified example, the first member 41Ab includes a liquid supply port 431b at the lower surface 4111.

The exposure apparatus EX1 including the liquid immersion member 4Ab in the second modified example is capable of achieving various effects which can be achieved by the exposure apparatus EX1 including the above described liquid immersion member 4A. For example, it is possible to suppress the occurrence of the exposure failure.

Moreover, the liquid immersion member 4A may also include a fluid recovery port at the lower surface 4111 of the first member 41, as with the second modified example. The liquid immersion member 4Aa may also include a fluid recovery port at the lower surface 4111 of the first member 41a.

(1-4-3) Third Modified Example

With reference to FIG. 13, a liquid immersion member 4Ac in a third modified example will be described. FIG. 13 is a cross-sectional view illustrating a structure of the liquid immersion member 4Ac in the third modified example.

As illustrated in FIG. 13, in the third modified example, a liquid supply port 432c is formed at the lower surface 4221. Although the liquid supply port 432c is formed not to face the space SP3 (the upper surface 4112), the liquid supply port 432c may be formed to face the space SP3.

The exposure apparatus EX1 including the liquid immersion member 4Ac in the third modified example is capable of achieving various effects which can be achieved by the exposure apparatus EX1 including the above described liquid immersion member 4A. For example, it is possible to suppress the occurrence of the exposure failure.

Moreover, in the liquid immersion member 4Ac, the liquid supply port 432 may be formed at the lower surface 4211.

(1-4-4) Fourth Modified Example

With reference to FIG. 14, a liquid immersion member 4Ad in a fourth modified example will be described. FIG. 14 is a cross-sectional view illustrating a structure of the liquid immersion member 4Ad in the fourth modified example.

As illustrated in FIG. 14, in the fourth modified example, a liquid supply port 432d is formed at the inner side surface 4212.

The exposure apparatus EX1 including the liquid immersion member 4Ad in the fourth modified example is capable of achieving various effects which can be achieved by the exposure apparatus EX1 including the above described liquid immersion member 4A. For example, it is possible to suppress the occurrence of the exposure failure.

Moreover, the liquid supply port 432d may be formed at the upper side or the lower side than both of or one of the upper surface 4112 and the lower surface 4111. The liquid supply port 432d may be formed at a same height as the upper surface 4112 or the lower surface 4111.

The liquid supply port 432d may face or may not face the outer side surface 4113 along the direction which is parallel to the XY plane. The liquid supply port 432 may face or may not face the space SP3 along the direction which is parallel to the XY plane.

Moreover, in the liquid immersion member 4Ad, both of or one of the liquid supply port 432 which is disposed at the lower surface 4211 and the liquid supply port 432b which is disposed at the lower surface 4221 may be formed in addition to the liquid supply port 432d.

(1-4-5) Fifth Modified Example

With reference to FIG. 15, a liquid immersion member 4Ae in a fifth modified example will be described. FIG. 15 is a cross-sectional view illustrating a structure of the liquid immersion member 4Ae in the fifth modified example.

As illustrated in FIG. 15, in the fifth modified example, a second member 42e includes a fluid recovery port 444e in addition to the fluid recovery port 442.

The fluid recovery port 444e recovers both of or one of the liquid LQ and the gas from a space surrounded by the inner side surface 4222, the outer side surface 4122 and the upper surface 4112. The fluid recovery port 444e is formed at the inner side surface 4222 of the second member 42e. The fluid recovery port 444e recovers the liquid LQ under the control of the controller 91.

The fluid recovery port 444e is formed to continuously or discretely distribute around the terminal optical element 31 (in other words, around the optical path AT of the exposure light EL). For example, a plurality of fluid recovery ports 444e may be formed at equal spaces or randomly The exposure apparatus EX1 including the liquid immersion member 4Ae in the fifth modified example is capable of achieving various effects which can be achieved by the exposure apparatus EX1 including the above described liquid immersion member 4A. For example, it is possible to suppress the occurrence of the exposure failure.

In the fifth example, even if the liquid LQ flows into a space which is at the inner side than the space SP3, the liquid LQ can be recovered.

Moreover, the fluid recovery port 444e may be formed at any surface which faces the space surrounded by the inner side surface 4222 and the outer side surface 4122. For example, the fluid recovery port 444e may be formed at the upper surface 4112. For example, the fluid recovery port 444e may be formed at the outer side surface 4122. For example, the fluid recovery port 444e may be formed at a part of the lower surface 4221 which is at the inner side than the fluid recovery port 442. For example, the fluid recovery port 444e may be formed at the lower surface 4132.

A porous member may be disposed at the fluid recovery port 444e. The porous member which is disposed at the fluid recovery port 444e may be same as the porous member 4411 which is disposed at the fluid recovery port 441.

The above described various liquid immersion members (4A and 4Aa to 4Ad) may include the fluid recovery port 444e. The above described various liquid immersion members (4A and 4Aa to 4Ae) may not include the fluid recovery port 442, if including the fluid recovery port 444e.

The above described various liquid immersion members (4A and 4Aa to 4Ae) may include a fluid recovery port which recovers both of or one of the liquid LQ and the gas from a space (for example, a space which is at the outer side than the fluid recovery port 441) which is at the outer side than the space SP1 between the second member 42 and the substrate 51 (or the object). This fluid recovery port may be formed at the second member 42 or may be formed at a member which is different from the first member 41 and the second member 42.

The above described various liquid immersion members (4A and 4Aa to 4Ae) may include a fluid recovery port which recovers both of or one of the liquid LQ and the gas from a space (for example, a space which is at the outer side than the inner side surface 4121 or above the upper surface 4131) which is at the outer side than the space SP2. This fluid recovery port may be formed at the second member (for example, the upper surface 4131) or may be formed at a member which is different from the first member 41 and the second member 42.

(1-4-6) Sixth Modified Example

With reference to FIG. 16, a liquid immersion member 4Af in a sixth modified example will be described. FIG. 16 is a cross-sectional view illustrating a structure of the liquid immersion member 4Af in the sixth modified example.

As illustrated in FIG. 16, in the sixth modified example, an inner side surface 4212f of a second member 42f is inclined with respect to the optical axis AX. The inner side surface 4212f extends upwardly and inwardly from the inner edge of the lower surface 4211. The inner side surface 4212f extends downwardly and outwardly from the outer edge of the lower surface 4221.

The exposure apparatus EX1 including the liquid immersion member 4Af in the sixth modified example is capable of achieving various effects which can be achieved by the exposure apparatus EX1 including the above described liquid immersion member 4A. For example, it is possible to suppress the occurrence of the exposure failure.

In the sixth modified example, the variation of the pressure of the liquid LQ in the liquid immersion space LS which is caused by the movement of the inner side surface 4212f relatively decreases, compared to the case where the inner side surface 4212f is parallel to the optical axis AX. Therefore, the variation of the pressure of the liquid LQ in the liquid immersion space LS which affects the terminal optical element 31 can be appropriately suppressed. As a result, the shift of the terminal optical element 31 can be appropriately suppressed.

Moreover, the variation of the pressure of the liquid LQ in the liquid immersion space LS which is caused by the movement of the inner side surface 4212f becomes smaller as a projected area of the inner side surface 4212f (specifically, a projected area on a surface which is perpendicular to the moving direction of the second member 42f) becomes smaller. Therefore, the inner side surface 4212f may has a shape to decrease the projected area of the inner side surface 4212f as much as possible.

In the sixth modified example, the interface LG1 is movable smoothly under the second member 42, compared to case where the inner side surface 4212f is parallel to the optical axis AX. For example, in FIG. 16, when the interface LG1, which is formed between the inner side surface 4212f and the substrate 51, starts to move in −X axis direction due to the relative movement of the substrate 51 and the second member 42, the interface LG1 is movable from the inner side surface 4121f to the lower surface 4211 smoothly without its movement being restricted by the inner edge of the lower surface 4211. The same is true of the case where the interface LG1 moves from the lower surface 4211 to the inner side surface 4121f. Therefore, the liquid LQ in the space SP1 is suppressed from being divided and the divided liquid LQ is suppressed from moving to or remaining in a space which is outer side than the space SP1.

Whole of the inner side surface 4212f may not be inclined with respect to the optical axis AX. For example, one portion of the inner side surface 4212f may be parallel to the optical axis AX.

The inner side surface 4212f may include a plurality of inclined surface which are respectively inclined by different inclined degrees (for example, inclined degrees with respect to the XY plane or the optical axis AX). For example, the inner side surface 4212f may include a first inclined surface which is inclined by a first inclined degree and a second inclined surface which is inclined by a second inclined degree which is different from the first inclined degree.

Moreover, the above described various liquid immersion members (4A and 4Aa to 4Ae) may include the inclined inner side surface 4212f.

(1-4-7) Seventh Modified Example

With reference to FIG. 17, a liquid immersion member 4Ag in a seventh modified example will be described. FIG. 17 is a cross-sectional view illustrating a structure of the liquid immersion member 4Ag in the seventh modified example.

As illustrated in FIG. 17, in the seventh modified example, an inner side surface 4212g of a second member 42g is inclined with respect to the optical axis AX, as with the inner side surface 4212f in the sixth modified example. Moreover, in the seventh modified example, both of or one of a part at which the inner side surface 4212g is connected to the lower surface 4211 and a part at which the inner side surface 4212g is connected to the lower surface 4221 is a curved surface.

The exposure apparatus EX1 including the liquid immersion member 4Ag in the seventh modified example is capable of achieving various effects which can be achieved by the exposure apparatus EX1 including the above described liquid immersion member 4A. For example, it is possible to suppress the occurrence of the exposure failure.

In the seventh modified example, the variation of the pressure of the liquid LQ in the liquid immersion space LS which is caused by the movement of the inner side surface 4212g relatively decreases, compared to the case where the inner side surface 4212g is parallel to the optical axis AX.

Moreover, in the seventh modified example, the interface LG1 is movable more smoothly under the second member 42g. Namely, the interface LG1 is movable more smoothly, when the state of the interface LG1 is changed from one state of a state where the interface LG1 is formed between the lower surface 4211 and the substrate 51 and a state where the interface LG1 is formed between the inner side surface 4212g and the substrate 51 to the other state. Therefore, the liquid LQ in the space SP1 is suppressed from being divided and the divided liquid LQ is suppressed from moving to or remaining in a space which is outer side than the space SP1.

Moreover, the above described various liquid immersion members (4A and 4Aa to 4Ae) may include the inclined inner side surface 4212g, and both of or one of the parts at which the inner side surface 4212g is connected to the lower surfaces 4212 and 4221 respectively may be the curved surface.

Moreover, not only the inner side surface 4212g but also a part at which the edge(s) of the above described each surface or each surface is connected to each other may be the curved surface.

(1-4-8) Eighth Modified Example

With reference to FIG. 18, a liquid immersion member 4Ah in an eighth modified example will be described. FIG. 18 is a cross-sectional view illustrating a structure of the liquid immersion member 4Ah in the eighth modified example.

As illustrated in FIG. 18, in the eighth modified example, an inner side surface 4212h of a second member 42h is inclined with respect to the optical axis AX. Moreover in the eighth modified example, the inner side surface 4212h extends upwardly and outwardly from the inner edge of the lower surface 4211. The inner side surface 4212h extends downwardly and inwardly from the outer edge of the lower surface 4221.

The exposure apparatus EX1 including the liquid immersion member 4Ah in the eighth modified example is capable of achieving various effects which can be achieved by the exposure apparatus EX1 including the above described liquid immersion member 4A. For example, it is possible to suppress the occurrence of the exposure failure.

In the eighth modified example, the liquid LQ which is pushed by the movement of the inner side surface 4212h does not move toward the substrate 51 easily, compared to the case where the inner side surface 4212h is parallel to the optical axis AX. Therefore, a shift of the substrate 51 which results from the variation of the pressure of the liquid LQ in the liquid immersion space LS which is caused by the movement of the inner side surface 4212h can be appropriately suppressed. Moreover, the variation of the pressure of the liquid LQ in the liquid immersion space LS which is caused by the movement of the inner side surface 4212h is not transmitted to the terminal optical element 31 easily.

Moreover, whole of the inner side surface 4212h may not be inclined with respect to the optical axis AX. For example, one portion of the inner side surface 4212h may be parallel to the optical axis AX.

The inner side surface 4212h may include a plurality of inclined surface which are respectively inclined by different inclined degrees. For example, the inner side surface 4212h may include a first inclined surface which is inclined by a first inclined degree and a second inclined surface which is inclined by a second inclined degree which is different from the first inclined degree.

Moreover, the above described various liquid immersion members (4A and 4Aa to 4Ae) may include the inclined inner side surface 4212h.

(1-4-9) Ninth Modified Example

With reference to FIG. 19, a liquid immersion member 4Ai in a ninth modified example will be described. FIG. 19 is a cross-sectional view illustrating a structure of the liquid immersion member 4Ai in the ninth modified example.

As illustrated in FIG. 19, in the ninth modified example, an outer side surface 4113i of a first member 41i is inclined with respect to the optical axis AX. In the ninth modified example, the outer side surface 4113i extends upwardly and inwardly from the outer edge of the lower surface 4111. The outer side surface 4113i extends downwardly and outwardly from the outer edge of the upper surface 4112.

The exposure apparatus EX1 including the liquid immersion member 4Ai in the ninth modified example is capable of achieving various effects which can be achieved by the exposure apparatus EX1 including the above described liquid immersion member 4A. For example, it is possible to suppress the occurrence of the exposure failure.

In the ninth modified example, the liquid LQ moves toward the space SP3 easily, compared to the case where the outer side surface 4113i is parallel to the optical axis AX. Moreover, the pressure of the liquid LQ in the liquid immersion space LS which is caused by the movement of the inner side surface 4212 does not vary easily, compared to the case where the outer side surface 4113i is parallel to the optical axis AX. Therefore, the adverse effect (for example, the shift of the terminal optical element 31, the shift of the substrate 51 and the like) which is caused by the variation of the pressure of the liquid LQ can be suppressed.

Moreover, the outer side surface 4113i may extend upwardly and outwardly from the outer edge of the lower surface 4111. Namely, the outer side surface 4113i may extend downwardly and inwardly from the outer edge of the upper surface 4112.

Moreover, whole of the outer side surface 4113i may not be inclined with respect to the optical axis AX. For example, one portion of the outer side surface 4113i may be parallel to the optical axis AX.

The outer side surface 4113i may include a plurality of inclined surface which are respectively inclined by different inclined degrees. For example, the outer side surface 4113i may include a first inclined surface which is inclined by a first inclined degree and a second inclined surface which extends outwardly and downwardly to be inclined by a second inclined degree which is different from the first inclined degree. For example, the first inclined surface may extend upwardly and outwardly from the outer edge of the lower surface 4111 and the second inclined surface may extend downwardly and outwardly from the outer edge of the upper surface 4112. In this case, an outer edge of the first inclined surface may correspond to an outer edge of the second inclined surface.

Moreover, the above described various liquid immersion members (4A and 4Aa to 4Ai) may not include the outer side surface. For example, a surface which ranges from the outer edge of the lower surface 4111 to the lower edge of the outer side surface 4122 may be regarded as the upper surface 4112.

(1-4-10) Tenth Modified Example

With reference to FIG. 20, a liquid immersion member 4Aj in a tenth modified example will be described. FIG. 20 is a cross-sectional view illustrating a structure of the liquid immersion member 4Aj in the tenth modified example.

As illustrated in FIG. 20, in the tenth modified example, a height of the lower surface 4211 from the substrate 51 is same as a height of the lower surface 4221 from the substrate 51. In the tenth modified example, a second member 42j does not include the inner side surface 4212.

The exposure apparatus EX1 including the liquid immersion member 4Aj in the tenth modified example is capable of achieving various effects which can be achieved by the exposure apparatus EX1 including the above described liquid immersion member 4A. For example, it is possible to suppress the occurrence of the exposure failure.

In the tenth modified example, the variation of the pressure of the liquid LQ in the liquid immersion space LS which is caused by the movement of the second member 42j relatively decreases, compared to the case where the second member 42j includes the inner side surface 4212. Therefore, the variation of the pressure of the liquid LQ in the liquid immersion space LS which affects the terminal optical element 31 can be appropriately suppressed. As a result, the adverse effect (for example, the shift of the terminal optical element 31, the shift of the substrate 51 and the like) which is caused by the variation of the pressure of the liquid LQ can be suppressed.

(1-4-11) Eleventh Modified Example

With reference to FIG. 21, a liquid immersion member 4Ak in an eleventh modified example will be described. FIG. 21 is a cross-sectional view illustrating a structure of the liquid immersion member 4Ak in the eleventh modified example.

As illustrated in FIG. 21, in the eleventh modified example, the height of the lower surface 4211 from the substrate 51 is larger than the height of the lower surface 4221 from the substrate 51.

The exposure apparatus EX1 including the liquid immersion member 4Ak in the eleventh modified example is capable of achieving various effects which can be achieved by the exposure apparatus EX1 including the above described liquid immersion member 4A. For example, it is possible to suppress the occurrence of the exposure failure.

(1-4-12) Twelfth Modified Example

With reference to FIG. 22, a liquid immersion member 4Al in a twelfth modified example will be described. FIG. 22 is a cross-sectional view illustrating a structure of the liquid immersion member 4Al in the twelfth modified example.

As illustrated in FIG. 22, in the twelfth modified example, the height of the lower surface 4211 from the substrate 51 is larger than a height of the lower surface 4111 from the substrate 51.

The exposure apparatus EX1 including the liquid immersion member 4Al in the twelfth modified example is capable of achieving various effects which can be achieved by the exposure apparatus EX1 including the above described liquid immersion member 4A. For example, it is possible to suppress the occurrence of the exposure failure.

In the twelfth modified example, the variation of the pressure of the liquid LQ in the liquid immersion space LS which is caused by the movement of the second member 42 can be suppressed, compared to the case where the height of the lower surface 4211 from the substrate 51 is not larger than the height of the lower surface 4111 from the substrate 51. Therefore, the adverse effect (for example, the shift of the terminal optical element 31, the shift of the substrate 51 and the like) which is caused by the variation of the pressure of the liquid LQ can be suppressed.

(1-4-13) Thirteenth Modified Example

With reference to FIG. 23, a liquid immersion member 4Am in a thirteenth modified example will be described. FIG. 23 is a cross-sectional view illustrating a structure of the liquid immersion member 4Am in the thirteenth modified example.

As illustrated in FIG. 23, the height of the lower surface 4211 from the substrate 51 is larger than a height of the upper surface 4112 from the substrate 51.

The exposure apparatus EX1 including the liquid immersion member 4Am in the thirteenth modified example is capable of achieving various effects which can be achieved by the exposure apparatus EX1 including the above described liquid immersion member 4A. For example, it is possible to suppress the occurrence of the exposure failure.

In the thirteenth modified example, the variation of the pressure of the liquid LQ in the liquid immersion space LS which is caused by the movement of the second member 42 can be suppressed, compared to the case where the height of the lower surface 4211 from the substrate 51 is not larger than the height of the upper surface 4112 from the substrate 51. Therefore, the adverse effect (for example, the shift of the terminal optical element 31, the shift of the substrate 51 and the like) which is caused by the variation of the pressure of the liquid LQ can be suppressed.

Moreover, in the above described various liquid immersion members (4A and 4Aa to 4Ai), the height of the lower surface 4211 from the substrate 51 is smaller than the height of the lower surface 4221 from the substrate 51, which is different from the liquid immersion member 4Aj in the tenth modified example to the liquid immersion member 4Am in the thirteenth modified example. As a result, in the above described various liquid immersion members (4A and 4Aa to 4Ah), the stable interface LG1 is formed easily and outflow of the liquid LQ from the space SP1 can be suppressed. Therefore, in the first embodiment, the height of the lower surface 4211 from the substrate 51 may be set to an appropriate height with considering both of the effect of forming the stable interface LG1 and the effect of the variation of the pressure of the liquid LQ in the liquid immersion space LS.

Moreover, in the above described various liquid immersion members (4A and 4Aa to 4Am), a gas supply port which supplies the gas to an outer space of the fluid recovery port 441 may be formed. This gas supply port may be formed at the second member 42 or the like, or at the member which is different from the first member 41 and the second member 42 and the like. Moreover, the supplied gas may be same as or may not be same as a gas which is in a space around the liquid immersion space LS. For example, the supplied gas may be air, nitrogen gas or carbon-dioxide gas. The gas supply port may supply the gas for the purpose of suppressing the outflow of the liquid LQ from the space SP1 (maintaining the interface LG1), for another purpose, or for both of the purpose of suppressing the outflow and another purpose. For example, the outflow of the liquid LQ is suppressed and the bubbles are suppressed from being generated in the liquid LQ in the liquid immersion space LS by supplying the carbon-dioxide gas to the outer side of the fluid recovery port 441.

(2) Second Embodiment

Next, an exposure apparatus EX2 in the second embodiment will be described. The exposure apparatus EX2 in the second embodiment is different from the exposure apparatus EX1 in the first embodiment in that one portion of the components of a liquid immersion member 4B is different from one portion of the components of the liquid immersion member 4A in the first embodiment. The other components of the exposure apparatus EX2 in the second embodiment may be same as the other components of the exposure apparatus EX1 in the first embodiment. Therefore, hereinafter, with reference to FIG. 24, the components of the liquid immersion member 4B in the second embodiment which are different from those of the liquid immersion member 4A in the first embodiment will be described. FIG. 24 is a cross-sectional view (a cross-sectional view which is parallel with the XZ plane) of the liquid immersion member 4B of the exposure apparatus EX2 in the second embodiment. Moreover, same reference number is assigned to the component which is same as the component of the exposure apparatus EX1 in the first embodiment, and its detailed description will be omitted.

As illustrated in FIG. 24, the liquid immersion member 4B forms the liquid immersion space LS on the object which is movable below the terminal optical element 31, as with the liquid immersion member 4A. The liquid immersion member 4B includes a first member 41B and a second member 42B. Hereinafter, the first member 41B and the second member 42B will be described in order.

Firstly, the first member 41B will be described. Hereinafter, a part of the components of the first member 41B in the second embodiment which is different from that of the components of the first member 41 in the first embodiment will be described. Therefore, the components of the first member 41B in the second embodiment which is not described in the following description may be same as those of the first member 41 in the first embodiment.

In the second embodiment, the first member 41B may not be disposed below one portion of the second member 42B. Namely, the first member 41B is disposed above the second member 42B. Therefore, one portion of the second member 42B is disposed between the first member 41B and the substrate 51.

The first member 41B includes an inner side surface 4121B, an outer side surface 4122B and a lower surface 4111B.

The inner side surface 4121B is a plane which faces the inner side, and faces one portion of the outer surface 33 via the space SP2, as with the above described inner side surface 4121.

The outer side surface 4122B is a plane which faces the outer side, and does not face the outer surface 33, as with the above described outer side surface 4122. The outer side surface 4122B is different from the outer side surface 4122 in that the outer side surface 4122B is a surface which extends upwardly from an outer edge of the lower surface 4112B. Another characteristic of the outer side surface 4122B may be same as that of the above described outer side surface 4122.

The lower surface 4111B is a plane which faces the lower side, as with the above described lower surface 4111. The lower surface 4111B is different from the lower surface 4111 in that the lower surface 4111B may not face the substrate 51 via the space SP1. The lower surface 4111B is different from the lower surface 4111 in that the lower surface 4111B faces one portion of the second member 42B (for example, one portion of a below described upper surface 4231B) via the space SP3. Another characteristic of the lower surface 4111B may be same as that of the above described lower surface 4111.

Next, the second member 42B will be described. Hereinafter, a part of the components of the second member 42B in the second embodiment which is different from that of the components of the second member 42 in the first embodiment will be described. Therefore, the components of the second member 42B in the second embodiment which is not described in the following description may be same as those of the second member 42 in the first embodiment.

In the second embodiment, the second member 42B may not be disposed above one portion of the first member 41B. Namely, the second member 42B is disposed below the first member 41B.

The second member 42B includes the upper surface 4231B, a lower surface 4211B, an inner side surface 4222B and an inner side surface 4232B.

The upper surface 4231B is a plane which faces the upper side. The upper surface 4231B is disposed above the lower surface 4211B. The upper surface 4231B is disposed at the inner side than the inner side surface 4222B. The upper surface 4231B is disposed at the outer side than the inner side surface 4232B. The upper surface 4231B is disposed below the emitting surface 32. The upper surface 4231B is a plane which is parallel to the XY plane. The upper surface 4231B has liquid repellent property against the liquid LQ.

The upper surface 4231B is disposed below the first member 41B. One portion of the upper surface 4231B faces one portion of the lower surface 4111B via the space SP3. A height of the space SP3 between the upper surface 4231B and the lower surface 4111B is smaller than a height of the optical path space SPK.

The lower surface 4211B is a plane which faces the lower side, as with the above described lower surface 4211. The lower surface 4211B is different from the lower surface 4211 in that one portion of the lower surface 4211B is disposed below the lower surface 4111B. The lower surface 4211B is different from the lower surface 4211 in that at least one portion of the lower surface 4211B may not be disposed at the outer side than at least one portion of the first member 41B (for example, the lower surface 4111B). Another characteristic of the lower surface 4211B may be same as that of the above described lower surface 4211.

The inner side surface 4222B is a plane which faces the inner side and faces one portion of the outer side surface 4122B, as with the inner side surface 4222. The inner side surface 4222B is different from the inner side surface 4222 in that the inner side surface 4222B extends upwardly from an outer edge of the upper surface 4231B. Another characteristic of the inner side surface 4222B may be same as that of the above described inner side surface 4222.

The inner side surface 4232B is a plane which faces the inner side. The inner side surface 4232B connects an inner edge of the upper surface 4231B and an inner edge of the lower surface 4211B. Therefore, an upper edge of the inner side surface 4232B corresponds to the inner edge of the upper surface 4231B. A lower edge of the inner side surface 4232B corresponds to the inner edge of the lower surface 4211B. The inner side surface 4232B is parallel to the optical axis AX.

The second member 42B includes a circular opening 425B through which the exposure light EL from the emitting surface 32 is allowed to pass. The opening 425B is different from the opening 425 in that the first member 41B is not disposed in the opening 425B. Another characteristic of the opening 425B may be same as that of the above described opening 425.

The liquid immersion member 4B further includes the liquid supply port 431, the fluid recovery port 441 and the fluid recovery port 442, as with the liquid immersion member 4. Moreover, in the second embodiment, the fluid recovery port 442 is formed at the first member 41B, not at the second member 42B.

The liquid immersion member 4B in the second embodiment further includes a third member 49B which is disposed at the opening 425B of the second member 42B.

The third member 49B is disposed in (within) the opening 425B. In this case, the third member 49B may be disposed at the opening 425B to be integrated with the second member 42B. For example, the third member 49B may be disposed at the opening 425B so that the third member 49B is embedded or attached in the opening 425B and thus is integrated with the second member 42B. Moreover, a state where "the third member 49B is integrated with the second member 42B" may represent a state where the third member 49B moves together with the second member 42B due to the movement of the second member 42B.

The third member 49B is a member through which the exposure light EL is allowed to pass. The third member 49B is a member through which a certain amount of the exposure light EL, which is allowed to expose the substrate 51, is allowed to pass. For example, the third member 49B may be a member whose transmittance for the exposure light EL is a predetermined value (for example, 80%, 90%, 100%, or any value).

The third member 49B is an optical element which constitutes at least one portion of the projection optical system 3. For example, the third member 49B may be an optical element which constitutes at least one portion of the projection optical system 3 with the terminal optical element 31. For example, the third member 49B may be an optical element which constitutes at least one portion of the terminal optical element 31. However, the third member 49B may not be the optical element which constitutes at least one portion of the projection optical system 3.

If the third member 49B is the optical element which constitutes at least one portion of the projection optical system 3, tilt of the third member 49B (namely, tilt in a tilt direction, and a tilt along both of or one of the θX direction and the θY direction) possibly causes image shift of the image of the device pattern which is projected on the substrate 51. Therefore, in the second embodiment, the third member 49B may move so as to adjust the tilt in the tilt direction. For example, the third member 49B may move along both of or one of the θX direction and the θY direction.

If the third member 49B is integrated with the second member 42B, the third member 49B moves when the second member 42B moves. Therefore, the second member 42B may move so as to adjust the tilt of the third member 49B in the tilt direction. For example, the second member 42B may move along both of or one of the θX direction and the θY direction so as to adjust the tilt of the third member 49B in the tilt direction.

A shape of the third member 49B is a planar shape or a plate-like shape. The shape of the third member 49B on the XY plane is same as the shape of the opening 425B on the XY plane. An outer edge of the third member 49B on the XY plane corresponds to an outer edge of the opening 425B on the XY plane. A thickness of the third member 49B is same as a thickness of the second member 42B. For example, the thickness of the third member 49B is same as a length along the Z axis direction between the upper surface 4231B and the lower surface 4211B.

The third member 49B includes an upper surface 491B, a lower surface 492B and an outer side surface 493B.

The upper surface 491B is a plane which faces the upper side. The upper surface 491B is a plane which is parallel to the XY plane. The upper surface 491B is disposed above both of or one of the lower surface 492B and the outer side surface 493B. A height of the upper surface 491B from the substrate 51 is same as a height of the upper surface 4231B from the substrate 51. Namely, the upper surface 491B and the upper surface 4231B are disposed in a same plane. In this case, an outer edge of the upper surface 491B corresponds to both of or one of the inner edge of the upper surface 4231B and the upper edge of the inner side surface 4232B.

The lower surface 492B is a plane which faces the lower side. The lower surface 492B is a plane which is parallel to the XY plane. A height of the lower surface 492B from the substrate 51 is same as a height of the lower surface 4211B from the substrate 51. Namely, the lower surface 492B and the lower surface 4211B are disposed in a same plane. In this case, an outer edge of the lower surface 492B corresponds to both of or one of the inner edge of the lower surface 4211B and the lower edge of the inner side surface 4232B.

The outer side surface 493B is a plane which faces the outer side. The outer side surface 493B is a plane which is parallel to the optical axis AX. The outer side surface 493B is a surface which connects the outer edge of the upper surface 491B and the outer edge of the lower surface 492B. Therefore, an upper edge of the outer side surface 493B corresponds to the outer edge of the upper surface 491B. Therefore, a lower edge of the outer side surface 493B corresponds to the outer edge of the lower surface 492B. A length along the Z axis direction of the outer side surface 493B is same as a length along the Z axis direction of the inner side surface 4232B of the second member 42B. The outer side surface 493B may contact or stick fast to the inner side surface 4232B.

The second member 42B further includes one or more connecting hole(s) 476B which connect(s) the space SP1 and both of or one of the spaces SP2 and SP3. Each of one or more connecting hole(s) 476B is a hole which penetrates the second member 42B from the upper surface 4231B to the lower surface 4211B or from the lower surface 4211B to the upper surface 4231B. Each of one or more connecting hole(s) 476B is disposed at the inner side than both of or one of the fluid recovery ports 441 and 442.

The liquid LQ in both of or one of the spaces SP2 and SP3 may flow into the space SP1 via at least one connecting hole 476B. The liquid LQ in the space SP1 may flow into both of or one of the spaces SP2 and SP3 via at least one connecting hole 476B. Therefore, one or more connecting hole(s) 476B may constitute at least one portion of the liquid immersion space LS.

According to the above described liquid immersion member 4B in the second embodiment, the inner side surface 4232B hardly or never move to push the liquid LQ in the liquid immersion space LS when the second member 42B moves, because the third member 49B is disposed in the opening 425B. Thus, in the second embodiment, the pressure of the liquid LQ in the liquid immersion space LS does not vary easily due to the movement of the second member 42B, compared to the case where the third member 49B is not disposed in the opening 425B. Therefore, the variation of the pressure of the liquid LQ in the liquid immersion space LS which affects the terminal optical element 31 can be appropriately suppressed. As a result, the shift of the terminal optical element 31 can be appropriately suppressed.

Moreover, the structure of the liquid immersion member 4B illustrated in FIG. 24 is one example. For example, it is enough for the liquid immersion member to include at least a first member which is fixed and a movable second member which include an opening. If a third member is disposed in the opening, this liquid immersion member is capable of achieving the above described various effects.

The second member 42B may not include the opening 425B. In this case, one portion of the second member 42B may be a member through which the exposure light EL is allowed to pass (namely, a member such as the above described third member 49B). For example, a part of the second member 42B which corresponds to the opening 425B (namely, a part through which the exposure light EL should pass) may be the member through which the exposure light EL is allowed to pass. Whole of the second member 42B may be the member through which the exposure light EL is allowed to pass. The member through which the exposure light EL is allowed to pass may have same characteristic as the above described third member 49B. Even in this case, the shift of the terminal optical element 31 can be appropriately suppressed, compared to the case where the second member 42B includes the opening 425B in which the third member 49B is not disposed.

At least one portion of the components (for example, the driving apparatus 451, the support members 452 and 453) for moving the second member 42B may be connected to the second member 42B through a connecting hole which penetrates the first member 41B along the Z direction. For example, at least one portion of the support member 452 whose one edge is connected to the second member 42B may be connected to the second member 42B through the connecting hole which penetrates the first member 41B along the Z direction.

The second member 42B may not include the fluid recovery port 441. In this case, the fluid recovery port 442 may be disposed at the outer side than an outer edge of the second member 42B and may recover the liquid LQ from both of the spaces SP1 and SP3.

The first member 41B may include an air supply port which supplies gas to the space SP3, in addition to or instead of the fluid recovery port 442. The air supply port may supply the gas for forming air curtain which prevents the liquid LQ from flowing out to the outer side than the air supply port. The second member 42B may include this air supply port, instead of the first member 41B.

The second member 42B may include an air supply port which supplies gas to the space SP1 in addition to or instead of the fluid recovery port 441. The air supply port may supply the gas for forming air curtain which prevents the liquid LQ from flowing out to the outer side than the air supply port.

At least one portion of the upper surface 4231B may be inclined with respect to the XY plane. At least one portion of the upper surface 4231B may be a curved surface. At least one portion of the upper surface 4231B may have hydrophilic property with respect to the liquid LQ.

At least one portion of the inner side surface 4232B may be inclined with respect to the optical axis AX. At least one portion of the inner side surface 4232B may be a curved surface. At least one portion of the upper surface 4231B may have hydrophilic property with respect to the liquid LQ.

A radius of the opening 425B may be larger than the radius of the opening 415. In this case, both of or one of the upper edge and the lower edge of the inner side surface 4232B is disposed at the outer side than a lower edge of the inner side surface 4121B. The radius of the opening 425B may be smaller than the radius of the opening 415. In this case, both of or one of the upper edge and the lower edge of the inner side surface 4232B is disposed at the inner side than the lower edge of the inner side surface 4121B. The radius of the opening 425B may be same as the radius of the opening 415. In this case, both of or one of the upper edge and the lower edge of the inner side surface 4232B is disposed at same position along the direction parallel to the optical axis AX as the lower edge of the inner side surface 4121B.

At least one portion of the third member 49B may be disposed outside the opening 425B. The third member 49B may not be integrated with the second member 42B.

The shape of the third member 49B may be a shape which is different from the planar shape or the plate-like shape. The shape of the third member 49B on the XY plane may not be same as the shape of the opening 425B on the XY plane. At least one portion of the outer edge of the third member 49B on the XY plane may not correspond to at least one portion of the outer edge of the opening 425B on the XY plane. The thickness of at least one portion of the third member 49B may be smaller than the thickness of the second member 42B. The thickness of at least one portion of the third member 49B may be larger than the thickness of the second member 42B.

At least one portion of the upper surface 491B may be inclined with respect to the XY plane. At least one portion of the upper surface 491B may be a curved surface. The height of the upper surface 491B from the substrate 51 may be larger than the height of the upper surface 4231B from the substrate 51. The height of the upper surface 491B from the substrate 51 may be smaller than the height of the upper surface 4231B from the substrate 51.

At least one portion of the lower surface 492B may be inclined with respect to the XY plane. At least one portion of the lower surface 492B may be a curved surface. The height of the lower surface 492B from the substrate 51 may be larger than the height of the lower surface 4211B from the substrate 51. The height of the lower surface 492B from the substrate 51 may be smaller than the height of the lower surface 4211B from the substrate 51.

The length along the Z axis direction of the outer side surface 493B may be smaller than the length along the Z axis direction of the inner side surface 4232B. The length along the Z axis direction of the outer side surface 493B may be larger than the length along the Z axis direction of the inner side surface 4232B. At least one portion of the outer side surface 493B may not contact or stick fast to the inner side surface 4232B.

At least one portion of one or more connecting hole(s) 476B may be disposed at the outer side than both of or one of the fluid recovery ports 441 and 442. At least one portion of one or more connecting hole(s) 476B may be disposed at same position along the direction parallel to the optical axis AX as both of or one of the fluid recovery ports 441 and 442.

Moreover, in the above described first and second embodiments, the controller 91 may include a computer system including a CPU and the like. The controller 91 may include an interface for communication between the computer system and an external apparatus. An input apparatus which is configured to input input signal may be connected to the controller 91. The input apparatus may include an input equipment including at least one of a keyboard, a mouse, a touch panel and the like. The input apparatus may include a communication apparatus which is configured to input data from the exterior apparatus. A display apparatus such as a liquid crystal display or the like may be connected to the controller 91.

The memory 92 may include a recording medium including at least one of a RAM (Random Access Memory), a hard disk, CD-ROM and the like. An OS (Operating System) for controlling the computer system may be installed in the memory 92. A program for controlling the exposure apparatus EX1 (EX2, same in the following) may be stored in the memory 92. A program for controlling the exposure apparatus EX1 to expose the substrate 51 by using the exposure light EL which is projected via the liquid LQ filling the optical path AT.

The program stored in the memory 92 may be read and executed by the controller 91. As a result, various components of the exposure apparatus EX1 such as the liquid immersion member 4A (4B), the substrate stage 5, the measurement stage 6 and the like cooperates with one another and perform the exposure process and the like for exposing the substrate 51 in a state where the liquid immersion space LS is formed.

The above description illustrates, as one example, the projection optical system 3 in which the optical path AT at the emitting surface 32 side (the image plane side) of the terminal optical element 31 is filled with the liquid LQ. However, a projection optical system in which the optical path AT at the incident side (the object plane side) of the terminal optical element 31 is filled with the liquid LQ may be used. One example of the projection optical system in which the optical path AT at the incident side of the terminal optical element 31 is filled with the liquid LQ is disclosed in PCT international Publication No. WO2004/019128.

The above description illustrates an example in which the liquid LQ is water (for example, pure water). However, the liquid LQ may be liquid other than the water. The liquid LQ may be transparent to the exposure light EL. The liquid LQ may have high refractive index with respect to the exposing light EL. The liquid LQ may have a property which is stable to the projection optical system 3, the photosensitive material (namely, the photoresist) which forms the surface of the substrate 51, and the like. One example of this liquid LQ is fluorinated liquid (for example, hydrofluoroether (HFE), perfluorinated polyether (PFPE), Fomblin oil and the like), for example. The liquid LQ may be various fluids (for example, supercritical liquid).

The above description illustrates an example in which the substrate 51 includes the semiconductor wafer for manufacturing a semiconductor device. However, the substrate 51 may include a glass substrate for a display device. The substrate 51 may include a ceramic wafer for a thin film magnetic head. The substrate 51 may include an original plate (for example, synthetic quarts, silicon wafer) of a mask or a reticle which is used in an exposure apparatus.

The above description illustrates an example in which the exposure apparatus EX1 is a scanning type exposure apparatus (what we call a scanning stepper) of a step-and-scan system in which the mask 11 and the substrate 51 move and the device pattern of the mask 11 is scanned and exposed. However, the exposure apparatus EX1 may be a projection exposure apparatus (what we call a stepper) of a step-and-repeat system in which the device pattern of the mask 11 is collectively exposed in a state where the mask 11 and the substrate 51 stop and the substrate 51 is step-moved every time the collective exposure is completed. The projection exposure apparatus of the step-and-repeat system may be an exposure apparatus (what we call an exposure apparatus of a stitch system) in which a reduced image of a first device pattern of a first mask 11 is exposed on the substrate 51 in the state where the first mask 11 and the substrate 51 stop, and then a reduced image of a second device pattern of a second mask 11 is partially overlapped with the reduced image of the first device pattern and is exposed on the substrate 51 in the state where the second mask 11 and the substrate 51 stop. The exposure apparatus of the stitch system may be an exposure apparatus of a step-and-stitch system in which two or more device patters are partially overlapped and exposed on the substrate 51 and then the substrate 51 sequentially moves.

The exposure apparatus EX1 may be an exposure apparatus in which device patterns of two masks 11 are combined on the substrate 51 via the projection optical system 3 and the shot region S on the substrate 51 is approximately simultaneously double-exposed by single scanning exposure. One example of this exposure apparatus is disclosed in U.S. Pat. No. 6,611,316, for example. The exposure apparatus EX1 may be an exposure apparatus of a proximity system. The exposure apparatus EX1 may be a mirror projection aligner or the like.

The exposure apparatus EX1 may be an exposure apparatus of a twin stage type or multi stage type which includes a plurality of substrate stages 5. One example of the exposure apparatus of the twin stage type is disclosed in U.S. Pat. No. 6,341,007, U.S. Pat. No. 6,208,407 and U.S. Pat. No. 6,262,796, for example. For example, as illustrated in FIG. 25, if the exposure apparatus EX1 includes two substrate stages 5A and 5B, the object which is disposed to face the emitting surface 32 of the terminal optical element 31 may be at least one of one substrate stage 5A, a substrate 51A which is hold by one substrate stage 5A, the other substrate stage 5B, a substrate 51B which is hold by the other substrate stage 5B.

The exposure apparatus EX1 may be an exposure apparatus of a twin stage type or a multi stage type which includes a plurality of substrate stages 5 and the measurement stage 6.

The exposure apparatus EX1 may be an exposure apparatus for manufacturing a semiconductor element which exposes a semiconductor element pattern on the substrate 51. The exposure apparatus may be an exposure apparatus for manufacturing a liquid crystal display element or a display. The exposure apparatus EX1 may be an exposure apparatus for manufacturing at least one of the thin film magnetic head, an imaging element (for example, a CCD), a micro machine, a MEMS, a DNA chip and the mask 11 (alternatively, the reticle).

The above description illustrate an example in which the mask 11 is the transmission type mask in which a predetermined light-shielding pattern (alternatively, a moving pattern or a dimming pattern) is formed on the transparent plate having light transparency. However, the mask 11 may be a variable molding mask (what we call an electrical mask, an active mask or an image generator) which forms a transparent pattern, a reflective pattern or a light emitting pattern on the basis of electrical data of the device pattern which should be exposed. One example of the variable molding mask is disclosed in U.S. Pat. No. 6,778,257. The mask 11 may be a pattern forming apparatus which includes a self-light-emission type image display element, instead of the variable molding mask including a non-light emission type image display element.

The above description illustrates, as one example, the exposure apparatus EX1 including the projection optical system 3. However, the above described various embodiments may be applied to an exposure apparatus and an exposure method which does not include the projection optical system 3. For example, the above described various embodiments may be applied to an exposure apparatus and an exposure method which forms liquid immersion space between an optical member such as a lens and the like and a substrate and exposes the substrate by the exposure light which is projected via the optical member.

The exposure apparatus EX1 may be an exposure apparatus (what we call a lithography system) which forms interference fringes on the substrate 51 and exposes the substrate 51 by a line-and-space pattern. One example of this exposure apparatus is disclosed in PCT international Publication No. 2001/035168, for example.

The above described exposure apparatus EX1 may be manufactured by assembling various sub-systems including each component described above so as to maintain predetermined mechanical accuracy, electrical accuracy and optical accuracy. An adjustment for achieving the mechanical accuracy may be performed to various mechanical systems before and after the assembly, in order to maintain the mechanical accuracy. An adjustment for achieving the electrical accuracy may be performed to various electrical systems before and after the assembly, in order to maintain the electrical accuracy. An adjustment for achieving the optical accuracy may be performed to various optical systems before and after the assembly, in order to maintain the optical accuracy. The process of assembling various sub-systems may include a process of mechanically connecting various sub-systems. The process of assembling various sub-systems may include a process of connecting a wiring of an electrical circuit of various sub-systems. The process of assembling various sub-systems may include a process of connecting a pipe of an air-pressure circuit of various sub-systems. Moreover, a process of assembling each of various sub-systems is performed before the process of assembling various sub-systems. After the process of assembling various sub-systems is completed, a general adjustment is performed and thus various accuracies in the whole of the exposure apparatus EX1 are secured. Moreover, the exposure apparatus EX1 may be manufactured in a clean room in which the temperature, the degree of cleanness and the like is controlled.

A micro device such as the semiconductor device or the like may be manufactured through each step illustrated in FIG. 26. Steps for manufacturing the semiconductor device may include a step S201 at which function and performance of the semiconductor device is designed, a step S202 at which the mask (reticle) 11 based on the designed function and performance is manufactured, a step S203 at which the substrate 51 which is the base material of the device is manufactured, a step S204 at which the substrate 51 is exposed by the exposure light EL from the device pattern of the mask 11 in accordance with the abode described embodiments and the exposed substrate 51 is developed, a step S205 including a device assembling process (a manufacturing process including a dicing process, a bonding process, a packaging process and the like) and an inspection step S206.

The aspects of each embodiment described above may be appropriately combined. One portion of the aspect of each embodiment described above may not be used. Moreover, as long as legally permitted, the disclosures of all publications and United States patents with respect to the exposure apparatuses and the like which are cited in each embodiment described above are incorporated in the disclosures of the present application.

The present invention can be changed, if desired, without departing from the essence or spirit of the invention which can be read from the claims and the entire specification. A liquid immersion member, an exposure apparatus, an exposure method and a method of manufacturing device, which involves such changes, is also intended to be within the technical scope of the present invention.

DESCRIPTION OF REFERENCE CODES 1 mask stage
2 illumination system
3 projection optical system
31 terminal optical element
32 emitting surface
33 outer surface
4A, 4B liquid immersion member
41, 41B first member
42, 42B second member
49B third member
431, 432 liquid supply port
441, 442 fluid recovery port
5 substrate stage
51 substrate
6 measurement stage
7 measurement system
8 chamber apparatus
9 control apparatus
91 controller
memory
AT, ATO, ATL optical path
AX optical axis
EL exposure light
EX1 exposure apparatus
LQ liquid
LS liquid immersion space

The invention claimed is:

1. A liquid immersion member that forms, in an exposure apparatus, a liquid immersion space through which exposure light emitted from an optical member passes,
the liquid immersion member comprising:
a first member that is disposed at at least one portion of a space around the optical member and that includes a first lower surface, the first lower surface facing an object which is movable below the optical member; and
a second member that is movable and that includes a second lower surface and a third lower surface, the second lower surface being disposed at an outer side than the first lower surface viewed from an optical axis of the optical member, the second lower surface facing the object, the third lower surface being disposed at an inner side than the second lower surface viewed from the optical axis, and at least one portion of the third lower surface being disposed above and overlapping at least one portion of the first lower surface in a direction of the optical axis of the optical member.

2. The liquid immersion member according to claim 1, further comprising:
a liquid supply port that is formed at at least one portion of the second lower surface.

3. The liquid immersion member according to claim 1, further comprising:
a liquid recovery port that is formed at at least one portion of the second lower surface.

4. The liquid immersion member according to claim 1, further comprising:
a liquid supply port that is formed at at least one portion of the second lower surface; and
a liquid recovery port that is formed at at least one portion of the second lower surface and that is formed at an outer side than the liquid supply port viewed from the optical axis.

5. The liquid immersion member according to claim 1, further comprising:
a liquid supply port that is formed at at least one portion of the third lower surface.

6. The liquid immersion member according to claim 1, further comprising:

a liquid recovery port that is formed at at least one portion of the third lower surface.

7. The liquid immersion member according to claim 1, further comprising:
a liquid supply port that is formed at at least one portion of the third lower surface; and
a liquid recovery port that is formed at at least one portion of the third lower surface and that is formed at an inner side than the liquid supply port viewed from the optical axis.

8. The liquid immersion member according to claim 6, wherein
at least one portion of the first member faces at least one portion of the third lower surface via a gap,
the liquid recovery port faces at least one portion of the gap between at least one portion of the first member and at least one portion of the third lower surface.

9. The liquid immersion member according to claim 8, wherein
the second member moves so that the liquid recovery port keeps facing at least one portion of the gap between at least one portion of the first member and at least one portion of the third lower surface.

10. The liquid immersion member according to claim 1, wherein
the second member includes a first inner side surface that connects at least one portion of an inner edge of the second lower surface and at least one portion of an outer edge of the third lower surface.

11. The liquid immersion member according to claim 10, wherein
the first inner side surface includes a surface that is inclined upwardly and outwardly viewed from the optical axis.

12. The liquid immersion member according to claim 10, wherein
the first inner side surface includes a surface that is inclined downwardly and outwardly viewed from the optical axis.

13. The liquid immersion member according to claim 10, wherein
at least one portion of the first member faces at least one portion of the third lower surface via a gap,
at least one portion of the first inner side surface faces at least one portion of the gap between at least one portion of the first member and the third lower surface along a moving direction of the second member.

14. The liquid immersion member according to claim 13, wherein
a length of the gap between at least one portion of the first member and the third lower surface along a direction parallel to the optical axis is larger than or same as a length of the first inner side surface along the direction parallel to the optical axis.

15. The liquid immersion member according to claim 10, further comprising:
a liquid supply port that is formed at at least one portion of the first inner side surface.

16. The liquid immersion member according to claim 1, wherein
the first member includes a first outer side surface that is connected to at least one portion of an outer edge of the first lower surface.

17. The liquid immersion member according to claim 16, wherein
the first outer side surface includes a surface that is inclined downwardly and outwardly viewed from the optical axis.

18. The liquid immersion member according to claim 1, wherein
the second lower surface is disposed at a same height as the third lower surface.

19. The liquid immersion member according to claim 1, wherein
the second lower surface is disposed below the third lower surface.

20. The liquid immersion member according to claim 1, wherein
the second lower surface is disposed above the third lower surface.

21. The liquid immersion member according to claim 1, wherein
the second lower surface is disposed at a same height as the first lower surface or above the first lower surface.

22. The liquid immersion member according to claim 1, wherein
the first member includes a first upper surface, at least one portion of the first upper surface faces at least one portion of the third lower surface via a gap.

23. The liquid immersion member according to claim 22, wherein
the second lower surface is disposed at a same height as the first upper surface or above the first upper surface.

24. The liquid immersion member according to claim 22, wherein
the first member includes a second outer side surface that is connected to at least one portion of an inner edge of the first upper surface.

25. The liquid immersion member according to claim 24, wherein
at least one portion of the second member is disposed in a space which is surrounded by the second outer side surface and the first upper surface.

26. The liquid immersion member according to claim 1, wherein
the first member includes a second inner side surface, at least one portion of the second inner side surface faces at least one portion of the optical member.

27. The liquid immersion member according to claim 26, further comprising:
a liquid supply port that is formed at at least one portion of the second inner side surface.

28. The liquid immersion member according to claim 26, further comprising:
a liquid recovery port that is formed at at least one portion of the second inner side surface.

29. The liquid immersion member according to claim 1, wherein
the second member includes a third inner side surface that is connected to at least one portion of an inner edge of the third lower surface.

30. The liquid immersion member according to claim 1, wherein
the first member includes a first opening through which the exposure light passes.

31. The liquid immersion member according to claim 1, wherein
the first lower surface is disposed below an edge surface of the optical member which faces an upper surface of the object.

32. An exposure apparatus that exposes a substrate by using exposure light which is projected via a liquid immersion space,
the exposure apparatus forming the liquid immersion space by using the liquid immersion member according to claim 1.

33. The exposure apparatus according to claim 32, wherein
the exposure apparatus moves the second member so that both of or one of a relative speed and a relative acceleration rate between the second member and the object decreases.

34. The exposure apparatus according to claim 32, wherein
the exposure apparatus moves the second member so that a relative speed between the second member and the object is smaller than a relative speed between the first member and the object.

35. The exposure apparatus according to claim 32, wherein
the exposure apparatus moves the second member so that a relative acceleration rate between the second member and the object is smaller than a relative acceleration rate between the first member and the object.

36. The exposure apparatus according to claim 32, wherein
the exposure apparatus moves the second member along each of a first direction and a second direction,
the first direction is parallel to a first axis in a plane which is perpendicular to an optical axis of the optical member,
the second direction is parallel to a second axis in the plane which is perpendicular to the optical axis of the optical member, the second axis intersects with the first axis.

37. The exposure apparatus according to claim 36, wherein
the object includes the substrate,
the substrate moves along the first track and then moves along a second track,
the movement of the substrate along the first track includes the movement along the first direction,
the movement of the substrate along the second track includes the movement along the second direction,
the second member moves along at least the first direction in at least one portion of a period during which the substrate moves along the first track,
the second member moves along at least the second direction in at least one portion of a period during which the substrate moves along the second track.

38. The exposure apparatus according to claim 32, wherein
the object includes the substrate,
the substrate moves along a scan direction and then moves along a step direction,
the second member moves along at least the scan direction in at least one portion of a period during which the substrate moves along the scan direction,
the second member moves along at least the step direction in at least one portion of a period during which the substrate moves along the step direction.

39. A method of manufacturing device comprising:
exposing a substrate by using the exposure apparatus according to claim 32; and
developing the exposed substrate.

40. An exposure method of exposing a substrate by using exposure light which is projected via liquid in a liquid immersion space,
the exposure method forming the liquid immersion space by using the liquid immersion member according to claim 1.

41. A method of manufacturing device comprising:
exposing a substrate by using the exposure method according to claim 40; and
developing the exposed substrate.

42. A liquid immersion member that forms, in an exposure apparatus, a liquid immersion space through which exposure light emitted from an optical member passes,
the liquid immersion member comprising:
a first member that is disposed at at least one portion of a space around the optical member;
a second member that is movable and that includes a first opening through which the exposure light is allowed to pass, at least one portion of the second member being disposed below the first member; and
a third member that is disposed in the first opening and through which the exposure light passing.

43. The liquid immersion member according to claim 42, wherein
the second member includes a connecting hole that connects a space between the first and second members and a space between the second member and an object which is movable below the second member,
liquid is allowed to flow from the space between the first and second members into the space between the second member and the object which is movable below the second member.

44. The liquid immersion member according to claim 42, further comprising:
a liquid recovery port that is formed at at least one portion of the first member,
the connecting hole being disposed at an inner side than the liquid recovery port viewed from an optical axis of the optical member.

45. The liquid immersion member according to claim 42, further comprising:
a liquid recovery port that is formed at at least one portion of the second member,
the connecting hole being disposed at an inner side than the liquid recovery port viewed from an optical axis of the optical member.

46. A liquid immersion member that forms, in an exposure apparatus, a liquid immersion space through which exposure light emitted from an optical member passes,
the liquid immersion member comprising:
a first member that is disposed at at least one portion of a space around the optical member; and
a second member that is movable, at least one portion of the second member being disposed below the first member,
at least one portion of the second member which is disposed on an optical path of the exposure light emitted from the optical member being a third member through which the exposure light is allowed to pass.

* * * * *